(12) United States Patent
Kim et al.

(10) Patent No.: US 11,990,475 B2
(45) Date of Patent: May 21, 2024

(54) SEMICONDUCTOR DEVICE

(71) Applicant: Samsung Electronics Co., Ltd., Suwon-si (KR)

(72) Inventors: Ahreum Kim, Hwaseong-si (KR); Sunghoon Kim, Seongnam-si (KR); Daeseok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 171 days.

(21) Appl. No.: 17/536,413

(22) Filed: Nov. 29, 2021

(65) Prior Publication Data
US 2022/0173100 A1 Jun. 2, 2022

(30) Foreign Application Priority Data
Nov. 30, 2020 (KR) .................. 10-2020-0164392
Apr. 16, 2021 (KR) .................. 10-2021-0049678

(51) Int. Cl.
H01L 27/092 (2006.01)
H01L 21/8238 (2006.01)
H01L 27/02 (2006.01)
H01L 25/065 (2023.01)

(52) U.S. Cl.
CPC .. *H01L 27/0922* (2013.01); *H01L 21/823814* (2013.01); *H01L 21/823892* (2013.01); *H01L 27/0207* (2013.01); *H01L 27/092* (2013.01); *H01L 27/0925* (2013.01); *H01L 25/0657* (2013.01); *H01L 2225/06524* (2013.01)

(58) Field of Classification Search
CPC . H01L 27/092–0928; H01L 21/823814; H01L 21/823857; H01L 21/823892; H01L 2924/13034; H01L 2924/13035
See application file for complete search history.

(56) References Cited

U.S. PATENT DOCUMENTS

| 6,081,002 | A | * | 6/2000 | Amerasekera | ...... H01L 27/0266 257/175 |
| 6,215,135 | B1 | * | 4/2001 | Schroder | ............. H01L 27/0266 257/355 |
| 6,498,357 | B2 | * | 12/2002 | Ker | ........................ H01L 29/87 257/357 |
| 6,657,264 | B2 | | 12/2003 | Cho et al. | |
| 7,098,520 | B2 | | 8/2006 | Park et al. | |
| 7,385,253 | B2 | * | 6/2008 | Kim | .................... H01L 27/0262 257/357 |
| 7,542,253 | B2 | * | 6/2009 | Ker | ..................... H01L 29/7436 361/56 |

(Continued)

FOREIGN PATENT DOCUMENTS

KR 1020120088134 A 8/2012
WO WO-2016113468 A1 * 7/2016 ......... H01L 27/0207

*Primary Examiner* — Bryan R Junge
(74) *Attorney, Agent, or Firm* — Muir Patent Law, PLLC

(57) ABSTRACT

A semiconductor device includes a substrate, an N-well area formed in the substrate, a first P-channel metal oxide semiconductor (PMOS) transistor having active regions formed in the N-well area, and a first N-channel metal oxide semiconductor (NMOS) transistor having active regions formed in the substrate. The first NMOS transistor includes a first N-type active region overlapping each of the substrate and the N-well area, when viewed from above a plane parallel to a top surface of the substrate.

19 Claims, 71 Drawing Sheets

(56) References Cited

U.S. PATENT DOCUMENTS

| | | |
|---|---|---|
| 9,093,494 B2 | 7/2015 | Horng et al. |
| 10,083,954 B2 | 9/2018 | Kim |
| 10,424,579 B2 | 9/2019 | Scholz et al. |
| 2010/0203691 A1 | 8/2010 | Wu et al. |
| 2014/0247001 A1 | 9/2014 | Moriya et al. |
| 2016/0190127 A1* | 6/2016 | Jin ........................ H01L 27/095 257/392 |
| 2018/0026639 A1* | 1/2018 | Aurola .................... H01L 29/78 326/81 |

* cited by examiner

US 11,990,475 B2

SEMICONDUCTOR DEVICE

CROSS-REFERENCE TO RELATED APPLICATIONS

This application claims priority under 35 U.S.C. § 119 to Korean Patent Application Nos. 10-2020-0164302 filed on Nov. 30, 2020 and 10-2021-0049678 filed on Apr. 16, 2021, in the Korean Intellectual Property Office, the disclosures of which are incorporated by reference herein in their entireties.

BACKGROUND

Embodiments of the present disclosure described herein relate to a semiconductor device.

A semiconductor device may provide various functions by utilizing an electrical characteristic of a semiconductor element. The semiconductor device may be implemented by forming various semiconductor patterns on a silicon substrate such that various functions are provided. Nowadays, as the degree of integration of the semiconductor device increases, the area capable of forming semiconductor elements decreases.

In particular, a semiconductor device that is used as a high-voltage switch includes a PMOS transistor and an NMOS transistor connected in series. In this case, a source terminal of the NMOS transistor is connected with a body bias terminal of the PMOS transistor. A conventional high-voltage switch requires a separate doping area and a separate body bias terminal for a body bias of the PMOS transistor. However, according to this structure, because the PMOS transistor and the NMOS transistor are physically spaced from each other, the conventional switch uses more area than may be desirable.

SUMMARY

Embodiments of the present disclosure provide a semiconductor device with the reduced area and reduced costs.

According to an embodiment, a semiconductor device includes a substrate, an N-well area formed in the substrate, a first P-channel metal oxide semiconductor (PMOS) transistor having active regions formed in the N-well area, and a first N-channel metal oxide semiconductor (NMOS) transistor having active regions formed in the substrate, and the first NMOS transistor includes a first N-type active region overlapping each of the substrate and the N-well area, when viewed from above a plane parallel to a top surface of the substrate.

According to an embodiment, a semiconductor device includes a substrate, an N-well area formed in the substrate, a first P-type active region formed in the N-well area, a second P-type active region formed in the N-well area, a first gate formed on the N-well area between the first P-type active region and the second P-type active region, a body bias node formed in the N-well area, a first N-type active region formed in the substrate, a second N-type active region formed in the substrate, and a second gate formed on the substrate between the first N-type active region and the second N-type active region, and the body bias node and the first N-type active region are formed of a single continuous active region.

According to an embodiment, a semiconductor device includes a substrate, an N-well area formed in the substrate, a PMOS transistor including active regions formed in the N-well area, and an NMOS transistor including active regions formed in the substrate and including a first N-type active region, and the first N-type active region is continuously formed in the N-well area and in a portion of the substrate horizontally adjacent to the N-well area, is used as a source area or a drain area of the NMOS transistor, and is configured to provide a body bias of the PMOS transistor to the N-well area.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that one skilled in the art easily may carry out the present disclosure.

Below, for brevity of drawing and convenience of description, the terms "length", "width", "depth", "height", etc. are used. Unless otherwise defined in the specification, a first direction and a second direction represent directions defining a plane that is parallel to a surface of a semiconductor substrate, and a third direction represents a direction defining a direction perpendicular to the surface of the semiconductor substrate. In this case, the length may correspond to the first direction, the width may correspond to the second direction, and the depth or the height may correspond to the third direction. However, the terms are used to describe embodiments of the present disclosure easily, and it may be understood that the scope and spirit of the invention are not limited by the terms.

Below, some reference signs may be duplicated and used. The duplicated reference signs may refer to the same components in each embodiment. Alternatively, the duplicated reference signs may refer to different components in different embodiments. Accordingly, a component to which each reference sign refers should be understood in the context of respective embodiments or combined embodiments.

Figure 1:
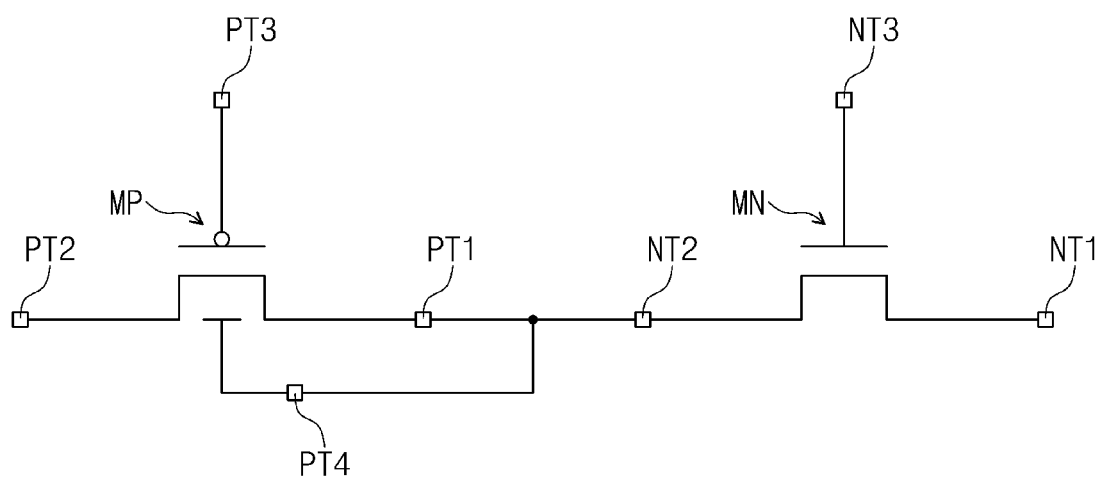
FIG. 1 is a circuit diagram illustrating a semiconductor device.

FIG. 1 is a circuit diagram illustrating a semiconductor device. Referring to FIG. 1, a semiconductor device 10 may include a P-channel metal oxide semiconductor (PMOS) transistor MP and an N-channel metal oxide semiconductor (NMOS) transistor MN. The term, "semiconductor device" as used herein may refer to particular active devices formed on a semiconductor die or wafer, or may refer to a semiconductor chip or die including these semiconductor devices. A semiconductor device may also be a semiconductor package including a package substrate, one or more semiconductor chips each formed of an integrated circuit on a die, and an encapsulating layer covering the one or more semiconductor chips and/or the package substrate.

The PMOS transistor MP may include first, second, and third terminals PT1, PT2, and PT3. The NMOS transistor MN may include first, second, and third terminals NT1, NT2, and NT3. Below, to describe embodiments of the present disclosure easily, the first to third terminals PT1 to PT3 of the PMOS transistor MP may be respectively referred to as "first to third PMOS terminals", and the first to third terminals NT1 to NT3 of the NMOS transistor MN may be respectively referred to as "first to third NMOS terminals".

The first PMOS terminal PT1 may be a source terminal or a drain terminal of the PMOS transistor MP, the second PMOS terminal PT2 may be the drain terminal or the source terminal of the PMOS transistor MP, and the third PMOS terminal PT3 may be a gate terminal of the PMOS transistor MP. The first NMOS terminal NT1 may be a source terminal or a drain terminal of the NMOS transistor MN, the second NMOS terminal NT2 may be the drain terminal or the source terminal of the NMOS transistor MN, and the third NMOS terminal NT3 may be a gate terminal of the NMOS transistor MN.

The second NMOS terminal NT2 and the first PMOS terminal PT1 may be electrically connected. The NMOS transistor MN may operate in response to an electrical signal provided through the third NMOS terminal NT3, and the PMOS transistor MP may operate in response to an electrical signal provided through the third PMOS terminal PT3. A signal may be transferred or blocked between the first NMOS terminal NT1 and the second PMOS terminal PT2 by the operations of the NMOS transistor MN and the PMOS transistor MP.

In an embodiment, the PMOS transistor MP may further include a fourth PMOS terminal PT4. The fourth PMOS terminal PT4 may be a terminal for providing a body bias of the PMOS transistor MP. A threshold voltage of the PMOS transistor MP may be adjusted or controlled by the body bias of the PMOS transistor MP.

In an embodiment, the fourth PMOS terminal PT4 of the PMOS transistor MP may be electrically connected to the first PMOS terminal PT1 and the second NMOS terminal NT2. Accordingly, the body bias of the PMOS transistor MP may be controlled to the same level as the source/drain terminal of the NMOS transistor MN. In this case, the PMOS transistor MP and the NMOS transistor MN may operate as a high-voltage switch.

Figure 2A:
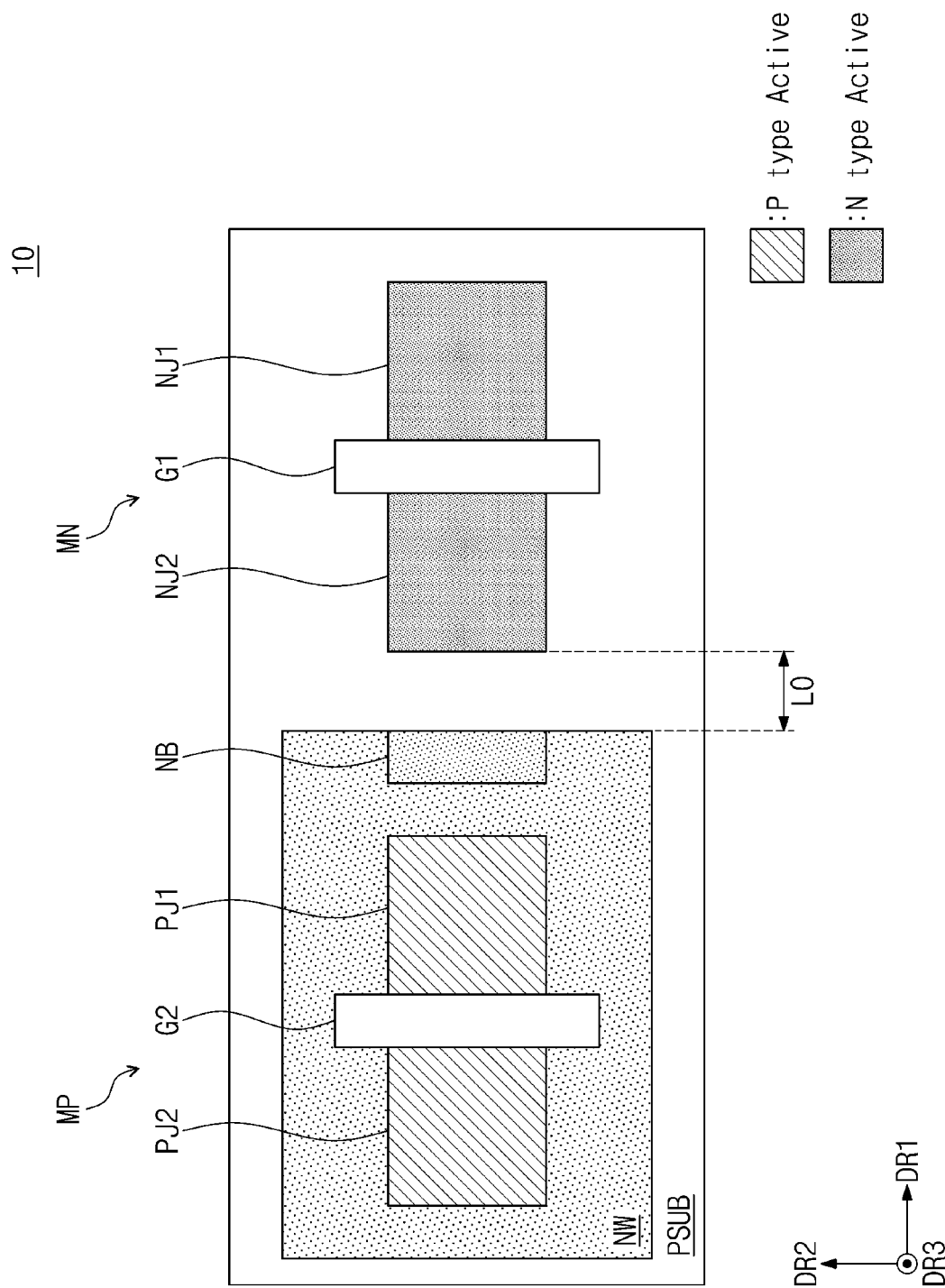
FIGS. 2A and 2B are a plan view and a vertical cross-sectional view of a semiconductor device of FIG. 1.
Figure 2B:
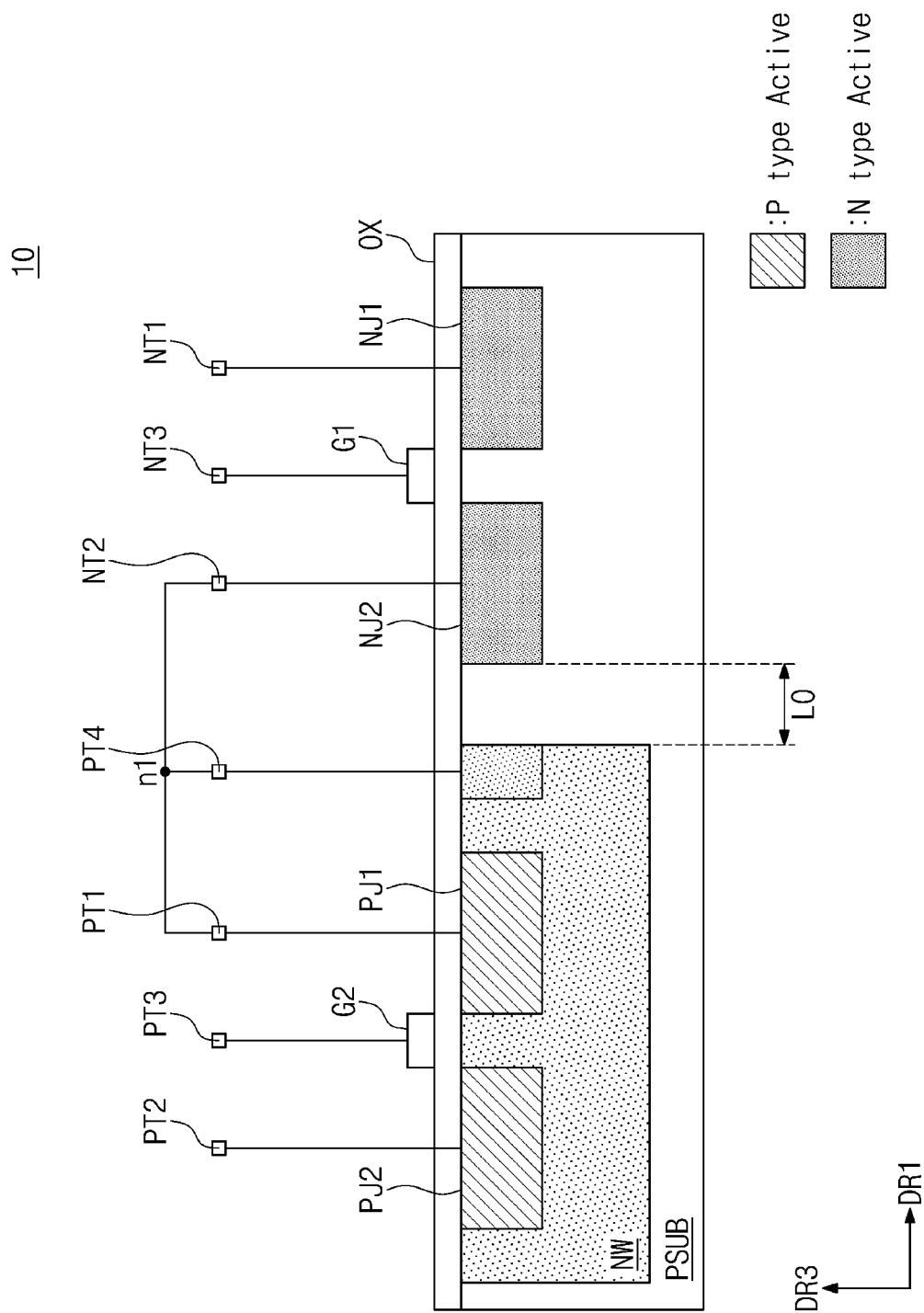

FIGS. 2A and 2B are a plan view and a vertical cross-sectional view of a semiconductor device of FIG. 1. Referring to FIGS. 2A and 2B, the semiconductor device 10 may include the PMOS transistor MP and the NMOS transistor MN. The PMOS transistor MP and the NMOS transistor MN may be formed in a P-type substrate PSUB. The P-type substrate PSUB may be formed on a plane defined by a first direction DR1 and a second direction DR2.

The NMOS transistor MN may include a first N-type active region NJ1, a second N-type active region NJ2, and a first gate G1. The first and second N-type active regions NJ1 and NJ2 may each be an area that is doped with an N-type material (i.e., an n+ doping area). The first and second N-type active regions NJ1 and NJ2 may be formed on the P-type substrate PSUB. An oxide layer OX may be formed on the first and second N-type active regions NJ1 and NJ2. The first gate G1 may be formed on the oxide layer OX. The oxide layers described herein may be gate dielectric layers. The first N-type active region NJ1 may be electrically connected to the first NMOS terminal NT1, the second N-type active region NJ2 may be electrically connected to the second NMOS terminal NT2, and the first gate G1 may be electrically connected to the third NMOS terminal NT3. In an embodiment, each of the electrical connection between the first N-type active region NJ1 and the first NMOS terminal NT1, the electrical connection between the second N-type active region NJ2 and the second NMOS terminal NT2, and the electrical connection between the first gate G1 and the third NMOS terminal NT3 may be implemented through a contact plug formed of a conductive material along the third direction DR3. These electrical connections may be described as direct electrical connections, as they are formed using conductive material between two end points, without any insulative break therebetween.

The PMOS transistor MP may include a first P-type active region PJ1, a second P-type active region PJ2, a second gate G2, and an N-type body node NB. The first P-type active region PJ1 and the second P-type active region PJ2 may each be an area that is doped with a P-type material (i.e., a P+ doping area). The first and second P-type active regions PJ1 and PJ2 may be formed on an N-well area NW of the P-type substrate PSUB. The N-well area NW may be an area that is doped with an N-type material (i.e., an n− doping area). The N-type body node NB may be an area that is doped with an N-type material (i.e., an n+ doping area).

In an embodiment, a doping concentration of the N-type body node NB may be different from a doping concentration of the N-well area NW. In an embodiment, the doping concentration of the N-type body node NB may be higher than the doping concentration of the N-well area NW. In an embodiment, the N-type body node NB may operate as a guard active region or a well guard-ring active region (also described simply as a guard ring) for the N-well area NW where the PMOS transistor MP is formed.

The oxide layer OX may be formed on the first P-type active region PJ1, the second P-type active region PJ2, and the N-type body node NB, and the second gate G2 may be formed on the oxide layer OX. The first P-type active region PJ1 may be electrically connected to the first PMOS terminal PT1. The second P-type active region PJ2 may be electrically connected to the second PMOS terminal PT2. The second gate G2 may be electrically connected to the third PMOS terminal PT3. The N-type body node NB may be electrically connected with the fourth PMOS terminal PT4.

In an embodiment, each of the electrical connection between the first P-type active region PJ1 and the first PMOS terminal PT1, the electrical connection between the second P-type active region PJ2 and the second PMOS terminal PT2, and the electrical connection between the second gate G2 and the third PMOS terminal PT3, and the electrical connection between the N-type body node NB and the fourth PMOS terminal PT4 may be implemented through a contact plug formed of a conductive material along the third direction DR3.

In an embodiment, as described with reference to FIG. 1, the second NMOS terminal NT2 of the NMOS transistor MN and the first and fourth PMOS terminals PT1 and PT4 of the PMOS transistor MP may be electrically connected. For example, the body bias of the PMOS transistor MP may be the same as a level (or voltage level) of the second N-type active region NJ2 of the NMOS transistor MN.

As illustrated in FIGS. 2A and 2B, when the body bias (e.g., bias voltage) of the PMOS transistor MP and the level (e.g., voltage level) of a first end (e.g., NJ2) of the NMOS transistor MN are the same, the body bias of the PMOS transistor MP and the first end of the NMOS transistor MN may be electrically connected through separate contact plugs and separate metal lines. In this case, the separate contact plugs and the separate metal lines cause an increase in circuit complexity. In addition, because the PMOS transistor MP and the NMOS transistor MN are spaced from each other as much as a 0-th distance L0, the area of the semiconductor device 10 increases.

Figure 3:
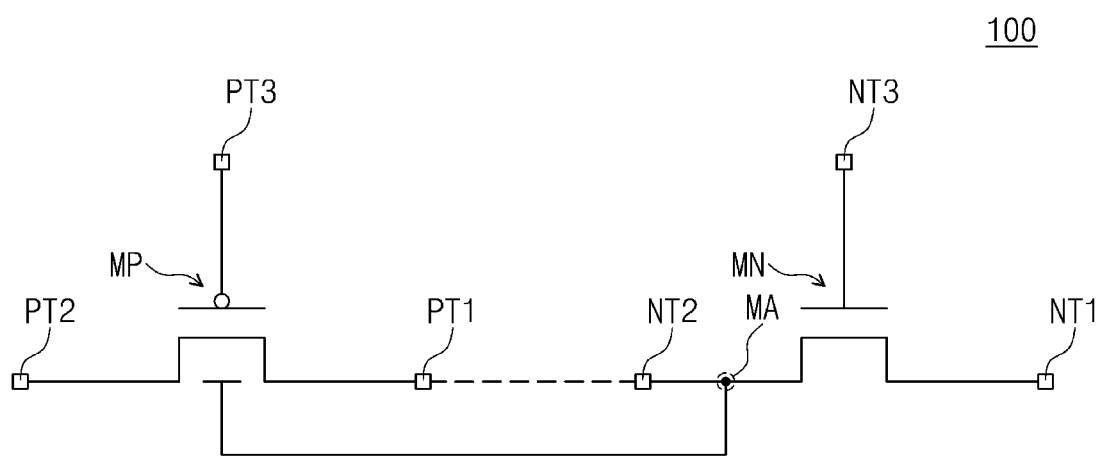
FIG. 3 is a circuit diagram illustrating a semiconductor device according to an embodiment of the present disclosure.

FIG. 3 is a circuit diagram illustrating a semiconductor device according to an embodiment of the present disclosure. Below, for convenience of description, additional description associated with the components described above will be omitted to avoid redundancy. Referring to FIG. 3, the semiconductor device 10 may include the PMOS transistor MP and the NMOS transistor MN. The PMOS transistor MP may include the first to third PMOS terminals PT1 to PT3. The NMOS transistor MN may include the first to third NMOS terminals NT1 to NT3.

In an embodiment, as in the semiconductor device 10 of FIG. 1, a semiconductor device 100 of FIG. 3 may operate as a high-voltage switch. For example, the second NMOS terminal NT2 of the NMOS transistor MN may be electrically connected with the first PMOS terminal PT1 of the PMOS transistor MP. A body of the PMOS transistor MP may have the same level (or voltage level) of a merged area MA connected with the second NMOS terminal NT2 of the NMOS transistor MN. In an embodiment, the merged area MA may be included in an N-type active region of the NMOS transistor MN, which will be described in more detail with reference to the following drawings.

That is, according to the embodiment of FIG. 3, the body bias of the PMOS transistor MP may be the same as a level (or voltage level) of the second NMOS terminal NT2 or the N-type active region of the NMOS transistor MN. In this case, the semiconductor device 100 may have the same structure as the semiconductor device 10 described with reference to FIG. 1 and may operate as a high-voltage switch like the semiconductor device 10 of FIG. 1.

In an embodiment, unlike the semiconductor device 10 of FIG. 1, the semiconductor device 100 of FIG. 3 may not include the fourth PMOS terminal PT4 for the body bias of the PMOS transistor MP. Also, because the body bias or the body bias node of the PMOS transistor MP is merged or shared with the N-type active region of the NMOS transistor MN, the total area of the semiconductor device 100 may be reduced. Various configurations or structures of the semiconductor device 100 according to an embodiment of the present disclosure will be described in more detail with reference to the following drawings.

Below, embodiments of the present disclosure where the body bias of the PMOS transistor MP are coupled, shared, or merged with the N-type active region of the NMOS transistor MN will be described with reference to FIGS. 4 to 22. To describe various embodiments clearly and briefly, the same reference numeral may be attached to some components, and the detailed description for duplicated components will be omitted. However, the scope and spirit of the invention is not limited thereto. For example, even though the same reference numeral is used in different embodiments, components to which the same reference numeral refers may provide similar functions but may provide partial different characteristics depending on respective embodiments. The above partial different characteristics may be understood in consideration of various respective embodiments.

In various drawings below, reference numerals to which a subscript such as "_Xy" is attached are used. Each of the reference numerals to which the subscript is attached is for distinguishing and describing various embodiments for convenience of description, and does not mean that embodiments of the present disclosure are independently implemented. That is, even though different subscripts are used in various drawings, one skilled in the art may implement a semiconductor device according to the present disclosure through one of the embodiments or a combination of two or more thereof.

Figure 4:
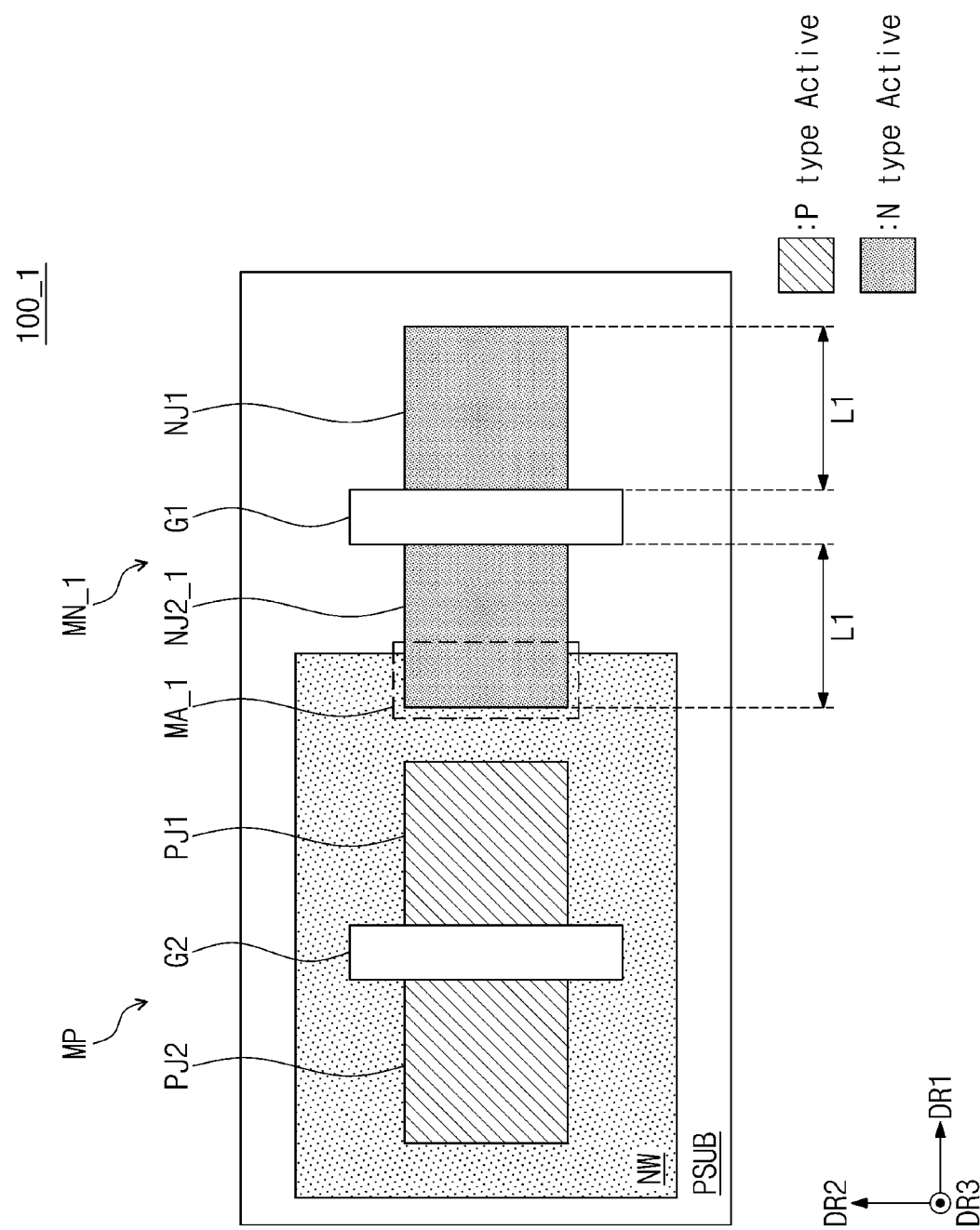
FIG. 4 is a plan view of a semiconductor device of FIG. 3, according to some embodiments.

FIG. 4 is a plan view of a semiconductor device of FIG. 3. FIGS. 5A to 5D are vertical cross-sectional views of a semiconductor device of FIG. 4, according to various embodiments. Referring to FIGS. 4 to 5D, a semiconductor device 100_1 may include the PMOS transistor MP and an NMOS transistor MN_1.

The NMOS transistor MN_1 may include the first N-type active region NJ1, a second N-type active region NJ2_1, and the first gate G1. Each of the first and second N-type active regions NJ1 and NJ2_1 may be an area that is doped with an N-type material (e.g., an n$^+$ doping area). The first and second N-type active regions NJ1 and NJ2_1 may be formed in the P-type substrate PSUB. The oxide layer OX may be formed on the first and second N-type active regions NJ1 and NJ2_1. The first gate G1 may be formed on the oxide layer OX. The first N-type active region NJ1 may be electrically connected to the first NMOS terminal NT1, the second N-type active region NJ2_1 may be electrically connected to the second NMOS terminal NT2, and the first gate G1 may be electrically connected to the third NMOS terminal NT3. In an embodiment, each of the electrical connection between the first N-type active region NJ1 and the first NMOS terminal NT1, the electrical connection between the second N-type active region NJ2_1 and the second NMOS terminal NT2, and the electrical connection between the first gate G1 and the third NMOS terminal NT3 may be implemented through a contact plug formed of a conductive material along the third direction DR3.

The PMOS transistor MP may include the first and second P-type active regions PJ1 and PJ2 and the second gate G2. Each of the first and second P-type active regions PJ1 and PJ2 may be an area that is doped with a P-type material (e.g., a p$^+$ doping area). The first and second P-type active regions PJ1 and PJ2 may be formed in the N-well area NW of the P-type substrate PSUB. The N-well area NW may be an area that is doped with an N-type material (i.e., an n$^-$ doping area). The oxide layer OX may be formed on the first P-type active region PJ1 and the second P-type active region PJ2, and the second gate G2 may be formed on the oxide layer OX. The first P-type active region PJ1 may be electrically connected to the first PMOS terminal PT1. The second P-type active region PJ2 may be electrically connected to the second PMOS terminal PT2. The second gate G2 may be electrically connected to the third PMOS terminal PT3.

In some embodiments, the PMOS transistor MP of FIGS. 4 to 5D does not include a separate N-type body node NB. In an embodiment, the body bias of the PMOS transistor MP may be directly provided through the second N-type active region NJ2_1 of the NMOS transistor MN_1. Alternatively, a body bias node of the PMOS transistor MP may be shared, coupled, or merged with the second N-type active region NJ2_1 of the NMOS transistor MN_1. Alternatively, the body bias node of the PMOS transistor MP may be a portion of the second N-type active region NJ2_1 of the NMOS transistor MN_1. For example, the body bias of the PMOS transistor MP may be provided from a source area or a drain area of the NMOS transistor MN_1 through an active region layer or a silicon layer.

For example, as illustrated in FIG. 4, the second N-type active region NJ2_1 of the NMOS transistor MN_1 may be formed on the P-type substrate PSUB and the N-well area NW (e.g., directly on the P-type substrate PSUB and directly on the N-well area NW). For example, the second N-type active region NJ2 of the NMOS transistor MN of FIGS. 1 to 2B may be formed in the P-type substrate PSUB, but the second N-type active region NJ2_1 of the NMOS transistor MN_1 of FIG. 4 may be formed in the P-type substrate PSUB and the N-well area NW. Alternatively, a boundary surface (or an interface) between the N-well area NW and the P-type substrate PSUB may be present in an area where the second N-type active region NJ2_1 is formed.

A portion of the second N-type active region NJ2_1 of the NMOS transistor MN_1 (e.g., a merged area MA_1) and the N-well area NW may overlap each other, when viewed from above a plane defined by the first and second directions DR1 and DR2. In this case, because the merged area MA_1 is included in the second N-type active region NJ2_1, the merged area MA_1 may have the same level, or height, as the second N-type active region NJ2_1. Also, because the merged area MA_1 is formed in the N-well area NW, the merged area MA_1 may provide the body bias of the PMOS transistor MP. Because the body bias of the PMOS transistor MP is directly provided through the second N-type active region NJ2_1 of the NMOS transistor MN_1 or because a node (i.e., an N-type body node) for the body bias of the PMOS transistor MP is shared, merged, or coupled with the second N-type active region NJ2_1 of the NMOS transistor MN_1 (e.g., to form a continuous region including the N-type body node and the second N-type active region NJ2_1), a physical distance between the PMOS transistor MP and the NMOS transistor MN_1 may be decreased, and a contact plug for the body bias node of the PMOS transistor MP may be omitted. Accordingly, the semiconductor device 100 of FIG. 4 may occupy the area smaller than the semiconductor device 10 of FIG. 1, and may provide the same function (e.g., a high-voltage switch function) as the semiconductor device 10 of FIG. 1.

In an embodiment, an N-type active region that is used as a source area or a drain area of the NMOS transistor MN_1 may be implemented with the same active region as the body bias node configured to provide the body bias of the PMOS transistor MP (i.e., may be implemented with a single, continuous active region); in this case, the body bias node may be replaced with a merged area of the above N-type active region. As the body bias node of the PMOS transistor MP and the N-type active region of the NMOS transistor MN_1 are implemented with a single active region (or a physical junction is formed between the body bias node and the N-type active region), a physical distance between the NMOS transistor MN_1 and the PMOS transistor MP may be decreased.

In an embodiment, a doping concentration of the second N-type active region NJ2_1 that is used as the body bias of the PMOS transistor MP and the source area or the drain area of the NMOS transistor MN_1 may be different from a doping concentration of the N-well area NW. In an embodiment, to provide the body bias of the PMOS transistor MP, the doping concentration of the second N-type active region NJ2_1 is higher than the doping concentration of the N-well area NW. The second N-type active region NJ2_1 may be doped with n-type impurities of a high concentration ($n^+$), and the N-well area NW may be doped with n-type impurities of a low concentration (n).

In an embodiment, the first N-type active region NJ1 and the second N-type active region NJ2_1 including the merged area MA_1 may have the same length in the first direction DR1, that is, may have lengths of L1. In addition, when viewed from above a plane defined by the first and second directions DR1 and DR2 (e.g., a top-down view, or plan view), the second N-type active region NJ2_1 including the merged area MA_1 and the first N-type active region NJ1 may have the same size and the same shape.

In an embodiment, when viewed from a vertical cross-section defined by the first and third directions DR1 and DR3, the first and second N-type active regions NJ1 and NJ2_1 may have the same shape or may have different shapes. Shapes of the first and second N-type active regions NJ1 and NJ2_1, which are viewed from a plane or cross-section defined by the first and third directions DR1 and DR3, will be described with reference to FIGS. 5A to 5D. For convenience of description, additional description associated with the reference numerals and components described above will be omitted to avoid redundancy.

Figure 5A:
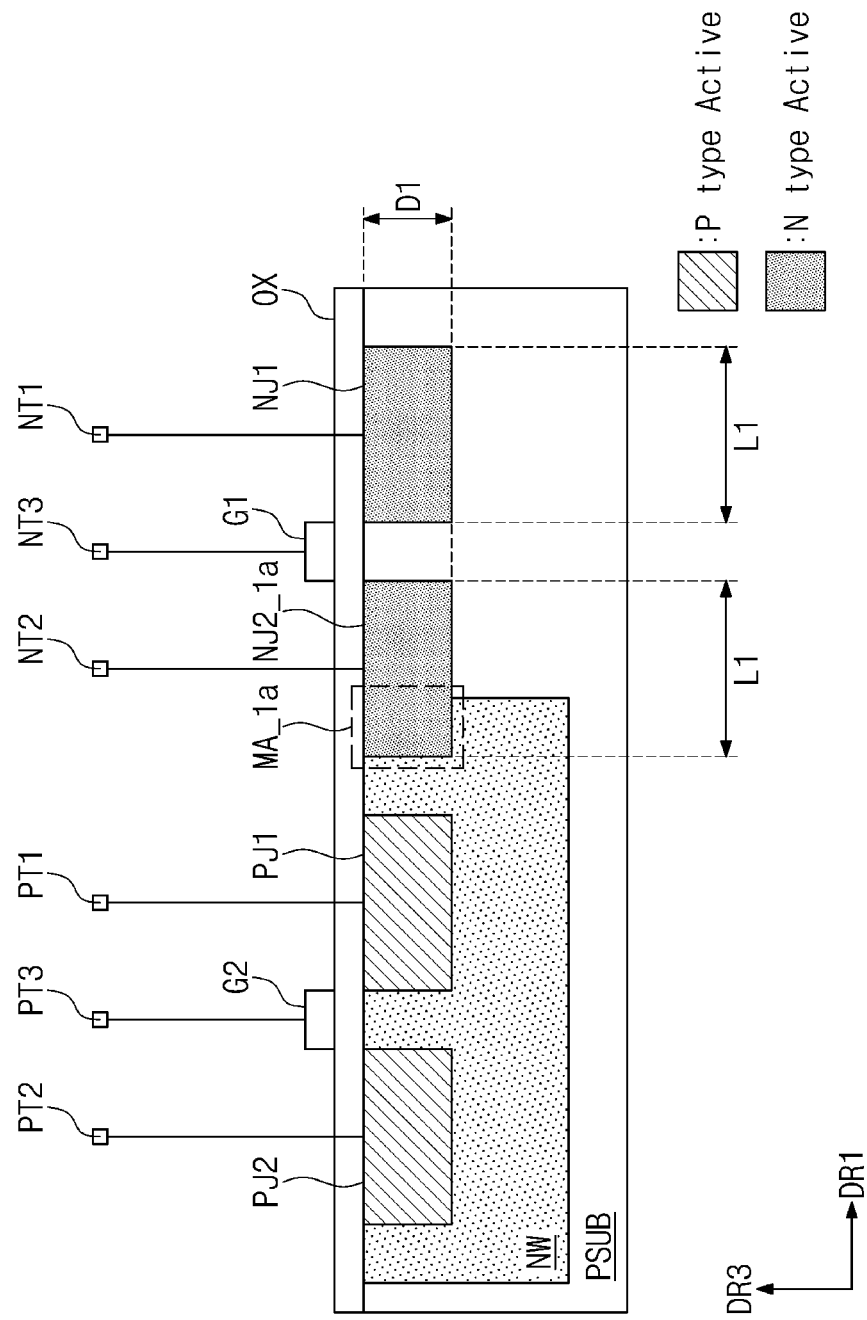
FIGS. 5A to 5D are vertical cross-sectional views of a semiconductor device of FIG. 4, according to various embodiments.

In an embodiment, as illustrated in FIG. 5A, when viewed from a vertical cross-section defined by the first and third directions DR1 and DR3, the first N-type active region NJ1 and a second N-type active region NJ2_1a may have substantially the same shape or similar shapes, and also may have substantially the same sizes (e.g., areas). For example, each of the first and second N-type active regions NJ1 and NJ2_1a may have a length of L1 in the first direction DR1 and may have a depth of D1 in the third direction DR3. In the embodiment of FIG. 5A, a merged area MA_1a may be a portion of the second N-type active region NJ2_1a, which is included in the N-well area NW or overlaps the N-well area NW.

Figure 5B:
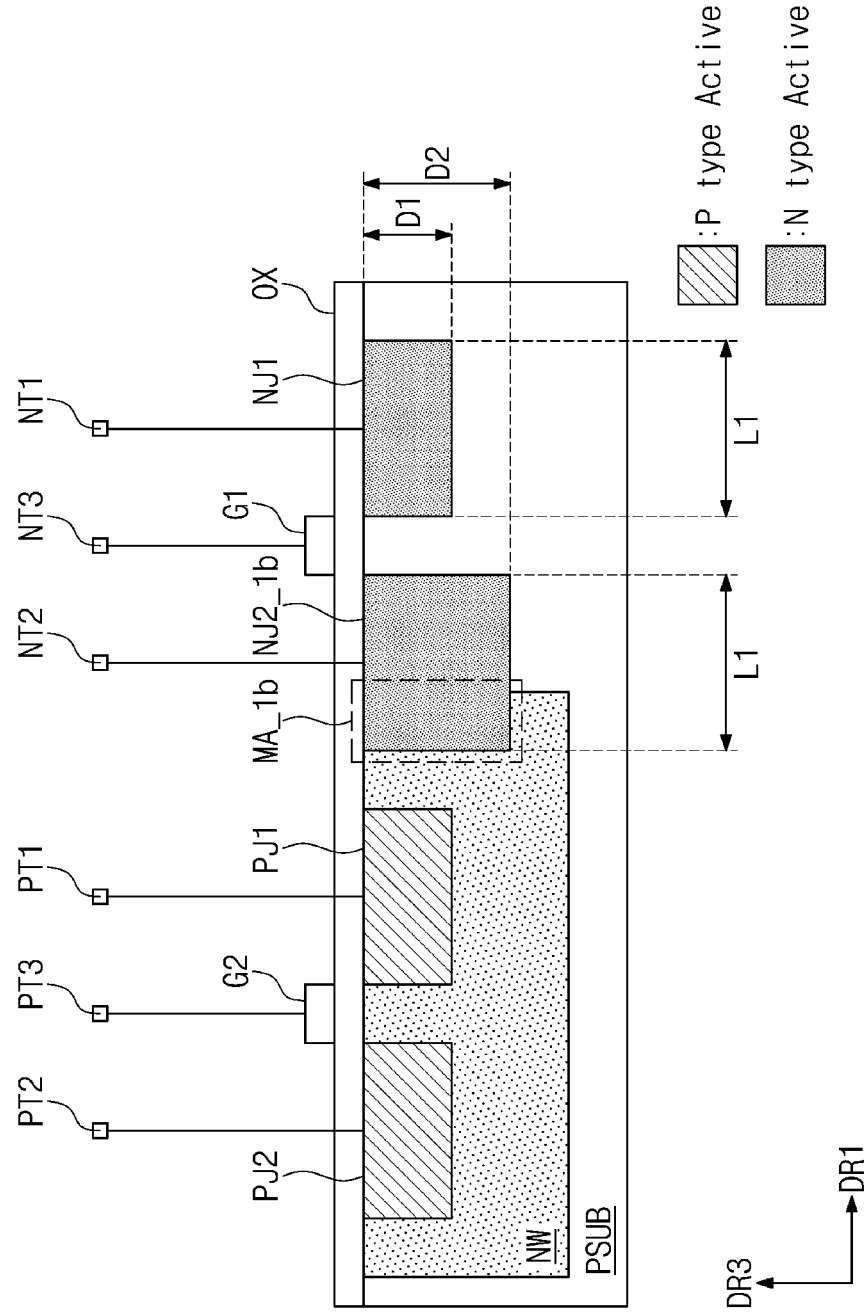

In an embodiment, as illustrated in FIG. 5B, when viewed from a vertical cross-section defined by the first and third directions DR1 and DR3, the first N-type active region NJ1 and a second N-type active region NJ2_1b may have different shapes, and/or may have different sizes (e.g., areas). For example, each of the first and second N-type active regions NJ1 and NJ2_1b may have a length of L1 in the first direction DR1. A depth of the first N-type active region NJ1 in the third direction DR3 may be D1, and a depth of the second N-type active region NJ2_1b in the third direction DR3 may be D2. For example, depths of the first and second N-type active regions NJ1 and NJ2_1b may differ from each other in the third direction DR3. In an embodiment, the depth D2 of the second N-type active region NJ2_1b is deeper than the depth D1 of the first N-type active region NJ1 as illustrated in FIG. 5B, but the present disclosure is not limited thereto. For example, a depth of the first N-type active region NJ1 in the third direction DR3 may be deeper than a depth of the second N-type active region NJ2_1b in the third direction DR3.

Figure 5C:
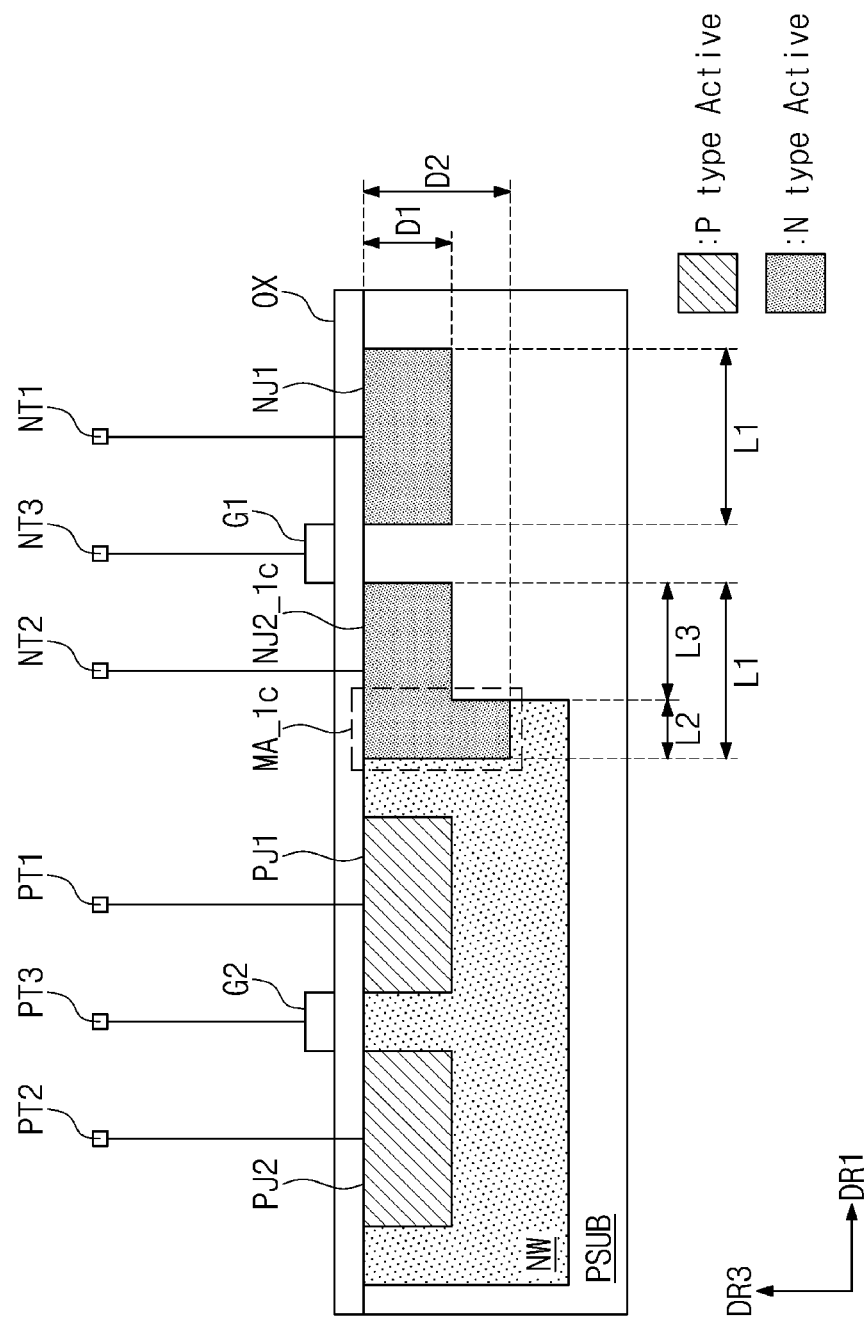
Figure 5D:
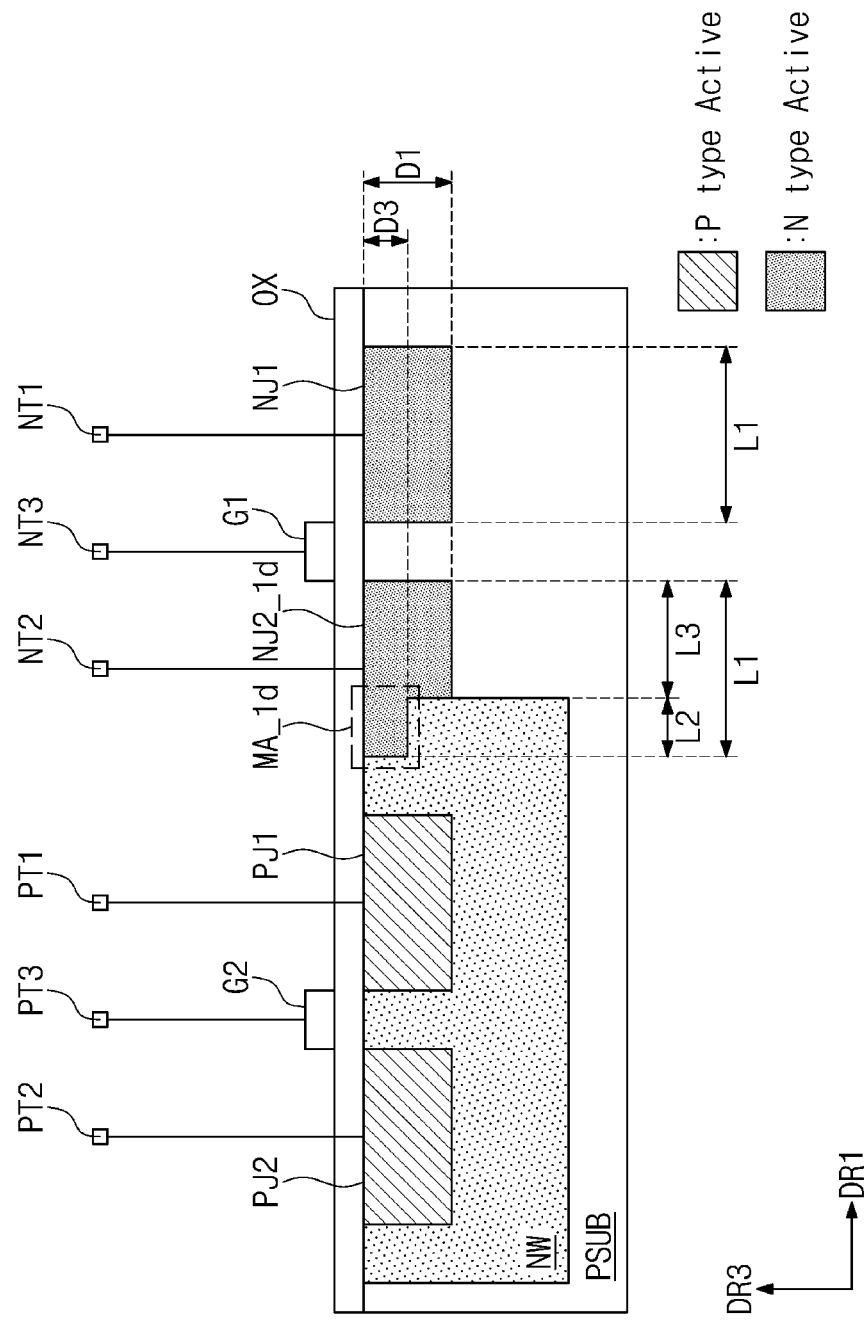

In an embodiment, as illustrated in FIG. 5C, when viewed from a plane (or vertical cross-section) defined by the first and third directions DR1 and DR3, the first N-type active region NJ1 and a second N-type active region NJ2_1c may have different shapes. For example, the first N-type active region NJ1 may have a length of L1 in the first direction DR1 and may have a depth of D1 in the third direction DR3.

The second N-type active region NJ2_1c may have different depths depending on locations. For example, the second N-type active region NJ2_1c that includes a merged area MA_1c providing the body bias of the PMOS transistor MP may be formed at different depths depending on formed areas. As a detailed example, a length of the second N-type active region NJ2_1c in the first direction DR1 may be L1. A portion of the second N-type active region NJ2_1c, which is formed in the P-type substrate PSUB, may have a length of L3 in the first direction DR1 and may have a depth of D1 in the third direction DR3. A portion of the second N-type active region NJ2_1c, which is formed in the N-well area NW, (i.e., the merged area MA_1c) may have a length of L2 in the first direction DR1 and may have a depth of D2 different from D1 in the third direction DR3. In an embodiment, D2 may be greater than D1. The portion of the second N-type active region NJ2_1c, which is formed in the N-well area NW, (i.e., the merged area MA_1c), may be formed to be deeper along the third direction DR3 than the remaining portion thereof. As depicted in FIG. 5C, the second N-type active region NJ2_1c may have an L-shape, or a bent shape.

In an embodiment, as illustrated in FIG. 5D, when viewed from a plane (or vertical cross-section) defined by the first and third directions DR1 and DR3, the first N-type active region NJ1 and a second N-type active region NJ2_1d may have different shapes. For example, because the shape of the first N-type active region NJ1 is similar to that described above, additional description will be omitted to avoid redundancy.

Unlike FIG. 5C, in FIG. 5D, a merged area MA_1d of the second N-type active region NJ2_1d may have a smaller depth than the remaining portion thereof. For example, a portion of the second N-type active region NJ2_1d, which is formed in the P-type substrate PSUB, may have a length of L3 in the first direction DR1 and may have a depth of D1 in the third direction DR3. A portion of the second N-type active region NJ2_1d, which is formed in the N-well area NW, (i.e., the merged area MA_1d) may have a length of L2 in the first direction DR1 and may have a depth of D3 different from D1 in the third direction DR3. In this case, D1 may be greater than D3.

As described with reference to FIG. 3, the first end of the NMOS transistor MN may be electrically connected with the body bias of the PMOS transistor MP. In this case, as described with reference to FIG. 4, the portion of the second N-type active region NJ2_1 of the NMOS transistor MN (i.e., the merged area MA_1) is formed in the N-well area NW where the PMOS transistor MP is formed. As can be seen in FIG. 4, as well as FIGS. 5A-5D and other figures described below, the first N-type active region NJ2_1 is continuously formed in the N-well area NW and in a portion of the substrate PSUB horizontally adjacent to the N-well area NW, is used as a source area or a drain area of the NMOS transistor MN, and is configured to directly provide a body bias of the PMOS transistor MP to the N-well area. For example, the first N-type active region NJ2_1 extends in a first direction DR1 parallel to a plane parallel to the substrate PSUB (e.g., a plane parallel to a top surface of the substrate), such that a first portion of the first N-type active region NJ2_1 (e.g., a portion corresponding to the merged area MA_1) overlaps the N-well area NW when viewed from above the plane parallel to the top surface of the substrate PSUB, and a second portion of the first N-type active region NJ2_1 adjacent to the first portion in the first direction (e.g., a portion outside of the merged area MA_1) overlaps the substrate PSUB without overlapping the N-well area NW when viewed from above the plane parallel to the substrate PSUB.

As such, separate contact plugs and metal lines for connecting the body bias of the PMOS transistor and the first end of the NMOS transistor MN may be omitted. Accordingly, the area where the semiconductor device 100_1 is formed, and an area of an integrated circuit formed, for example, on a semiconductor chip and that includes the PMOS transistor and NMOS transistor (or a plurality of such pairs of transistors) may decrease.

In an embodiment, the second NMOS terminal NT2 of the NMOS transistor MN may be electrically connected to the first PMOS terminal PT1 of the PMOS transistor MP through a separate metal line. In this case, the semiconductor device 100_1 described with reference to FIGS. 4 to 5D may provide the same function (e.g., a high-voltage switch function) as the semiconductor device 10 of FIG. 1.

In an embodiment, as described with reference to FIG. 4, when viewed from above a plane formed by the first and second directions DR1 and DR2 or a plane of the P-type substrate PSUB, the first and second N-type active regions NJ1 and NJ2_1 of the NMOS transistor MN_1 may have the same or similar shapes. In an embodiment, as described with reference to FIGS. 5A to 5D, when viewed from a vertical cross-section defined by the first and third directions DR1 and DR3, the first and second N-type active regions NJ1 and NJ2_1 of the NMOS transistor MN_1 may have the same shape or may have different shapes.

Figure 6:
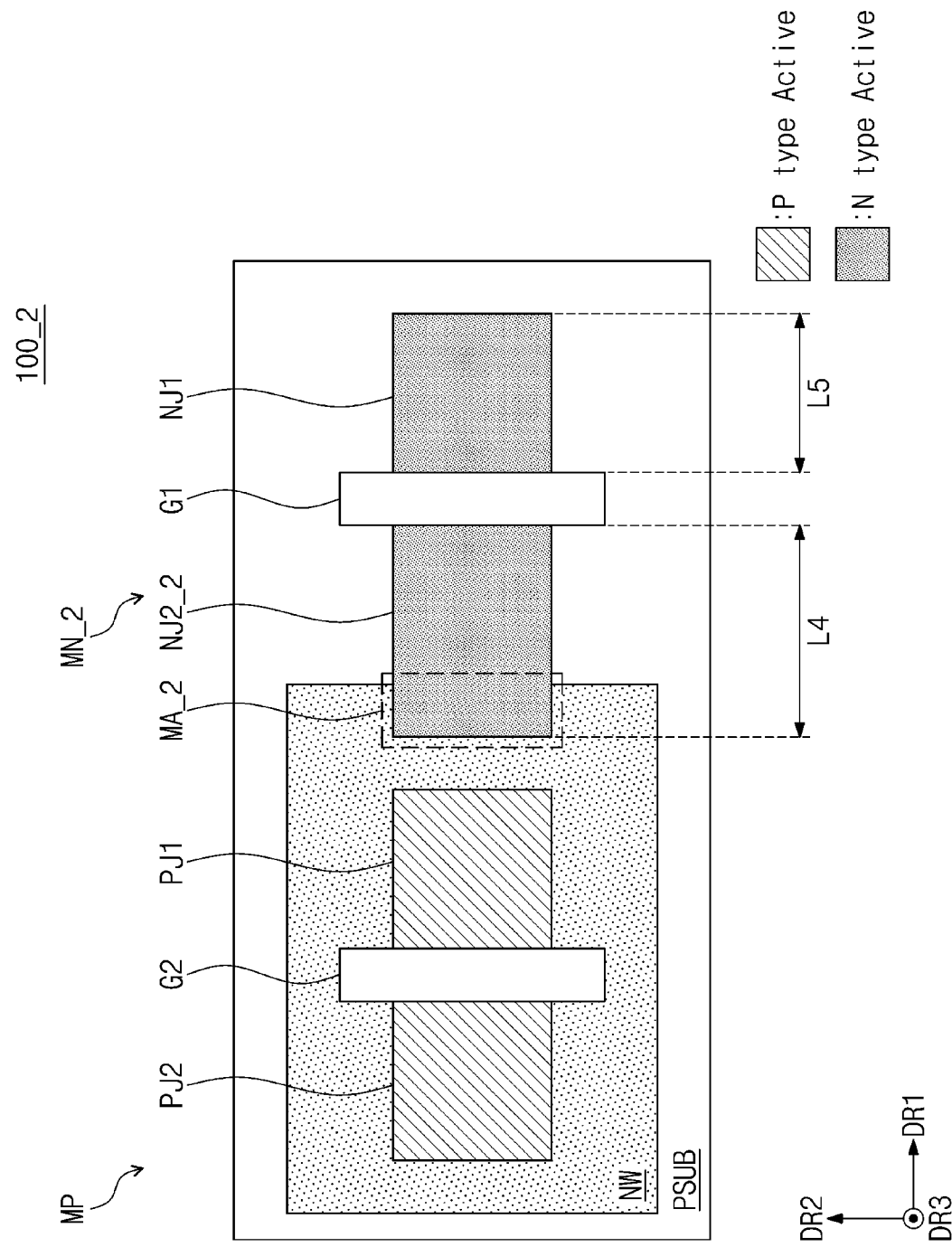
FIG. 6 is a plan view of a semiconductor device of FIG. 3, according to some embodiments.
Figure 7:
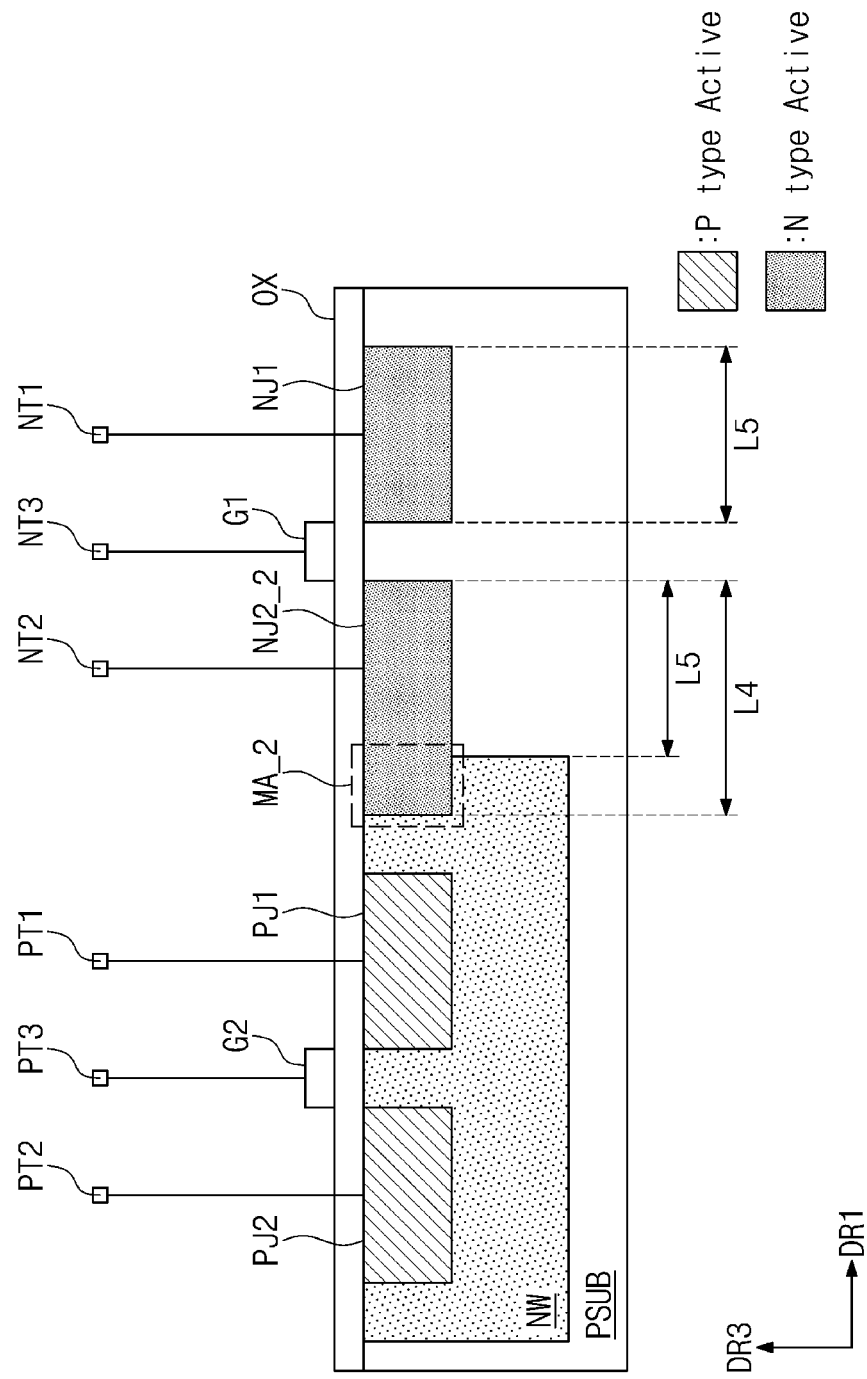
FIG. 7 is a vertical cross-sectional view of a semiconductor device of FIG. 6, according to some embodiments.

FIG. 6 is a plan view of a semiconductor device of FIG. 3. FIG. 7 is a vertical cross-sectional view of a semiconductor device of FIG. 6. Referring to FIGS. 6 and 7, a semiconductor device 100_2 may include the PMOS transistor MP and an NMOS transistor MN_2. Components of the PMOS transistor MP and the NMOS transistor MN_2 are described above, and thus, additional description will be omitted to avoid redundancy.

In an embodiment, a shape of a second N-type active region NJ2_2 may be different from a shape of the first N-type active region NJ1. For example, a length of the second N-type active region NJ2_2 in the first direction DR1 may be L4, and a length of the first N-type active region NJ1 in the first direction DR1 may be L5. L4 may be greater than L5.

In an embodiment, the second N-type active region NJ2_2 may include a merged area MA_2. The merged area MA_2 may be formed in the N-well area NW. The remaining portion of the second N-type active region NJ2_2 other than the merged area MA_2 (i.e., a portion of the second N-type active region NJ2_2, which is formed in the P-type substrate PSUB) may have a length of L5 in the first direction DR1. For example, an area of the second N-type active region NJ2_2, which is really used as a source or a drain of the NMOS transistor MN_2, or the remaining area of the second N-type active region NJ2_2 other than the merged area MA_2 may be the same as or similar to the first N-type active region NJ1 in shape.

An embodiment where the length L4 of the second N-type active region NJ2_2 in the first direction DR1 is longer than the length L5 of the first N-type active region NJ1 in the first direction DR1 is illustrated in FIGS. 6 and 7, but the present disclosure is not limited thereto. For example, a length of the second N-type active region NJ2_2 in the first direction DR1 may be shorter than a length of the first N-type active region NJ1 in the first direction DR1. Alternatively, a width of the second N-type active region NJ2_2 in the second direction DR2 may be different from a width of the first N-type active region NJ1 in the second direction DR2. Alternatively, a depth of the second N-type active region NJ2_2 in the third direction DR3 may be different from a depth of the first N-type active region NJ1 in the third direction DR3. Alternatively, when viewed from a vertical cross-section defined by the first and third directions DR1 and DR3, the second N-type active region NJ2_2 or the first N-type active region NJ1 may be one of the shapes described with reference to FIGS. 5A to 5D or a modified shape thereof.

Figure 8:
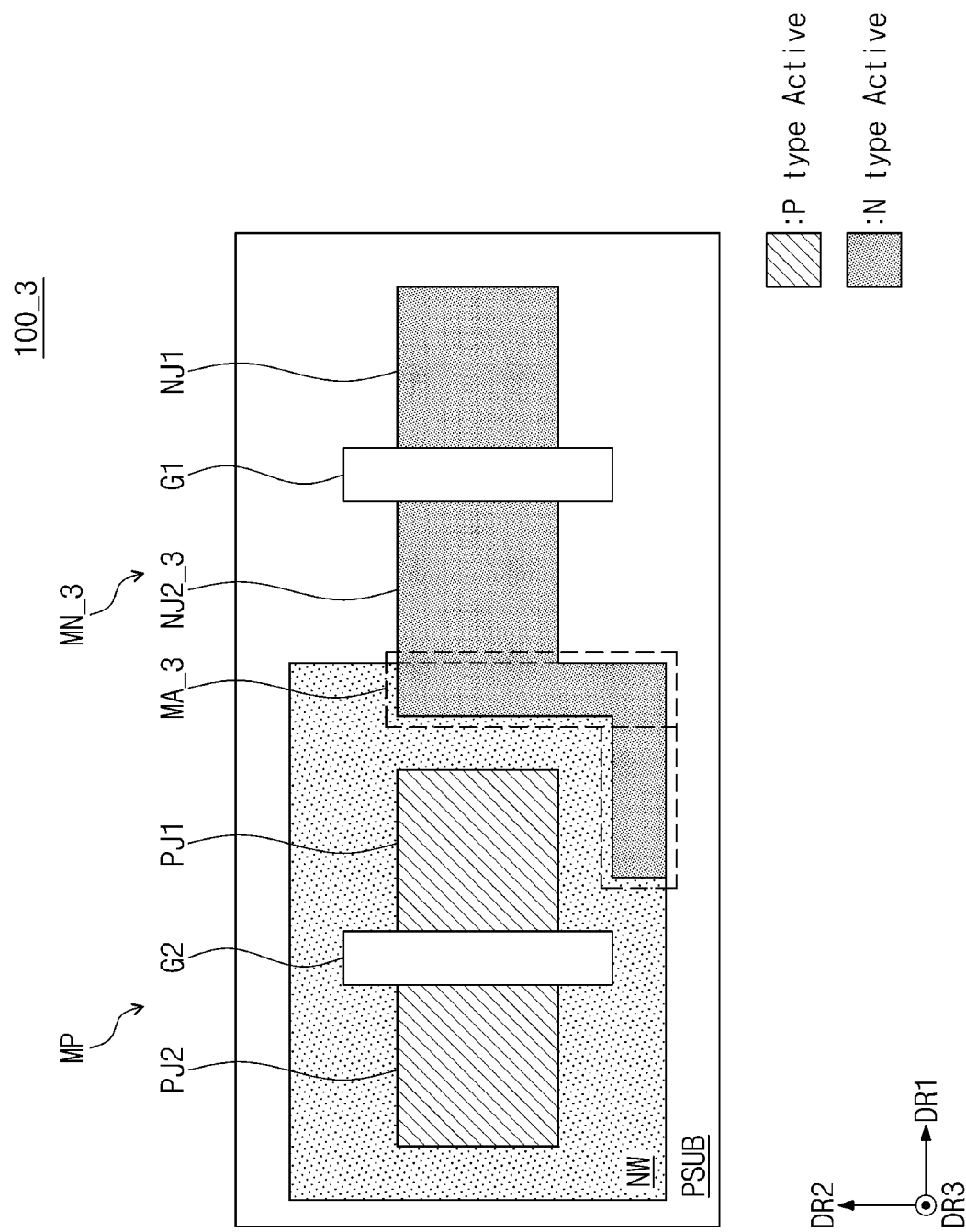
FIG. 8 is a plan view of a semiconductor device of FIG. 3, according to some embodiments.

FIG. 8 is a plan view of a semiconductor device of FIG. 3. Referring to FIG. 8, a semiconductor device 100_3 may include the PMOS transistor MP and an NMOS transistor MN_3. Components of the PMOS transistor MP and the NMOS transistor MN_3 are described above, and thus, additional description will be omitted to avoid redundancy.

A second N-type active region NJ2_3 of the NMOS transistor MN_3 may include a merged area MA_3. The merged area MA_3 may be formed in the N-well area NW where the PMOS transistor MP is formed, and may be configured to provide the body bias of the PMOS transistor MP.

In an embodiment, as illustrated in FIG. 8, a shape or form of the second N-type active region NJ2_3 of the NMOS transistor MN_3 may be different from a shape or form of the first N-type active region NJ1. For example, when viewed from above a plane defined by the first and second directions DR1 and DR2 (i.e., when viewed from above a plane parallel to the P-type substrate PSUB), the first N-type active region NJ1 may have a quadrangular shape, and the second N-type active region NJ2_3 may have a polygonal shape having, for example, more than 4 sides. In an embodiment, the merged area MA_3 of the second N-type active region NJ2_3 of the NMOS transistor MN_3 may operate as a guard active region or a well guard-ring active region for the PMOS transistor MP. Similarly, the merged areas MA_1a through MA_1d and MA_2 described previously may operate as a guard active region or a well guard-ring active region (or simply, a guard ring).

A shape or form of the second N-type active region NJ2_3 illustrated in FIG. 8 is an example of a portion thereof, and the present disclosure is not limited thereto. The shape or form of the second N-type active region NJ2_3 may be variously implemented. For example, the merged area MA_3 may be placed at an edge portion of the N-well area NW or may be formed to surround the edge portion (e.g., in the shape of a square or rectangle).

Figure 9:
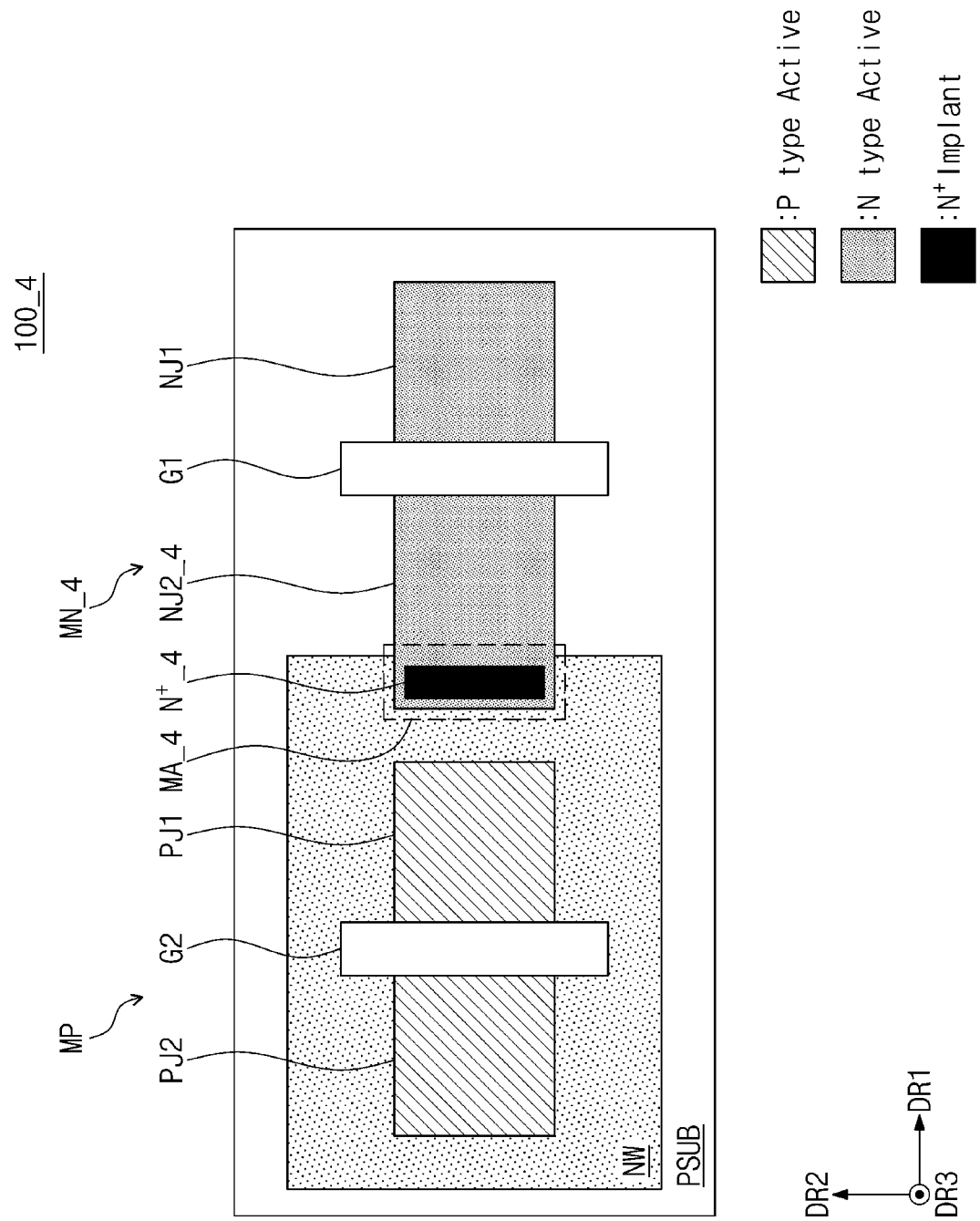
FIG. 9 is a plan view of a semiconductor device of FIG. 3, according to some embodiments.
Figure 10A:
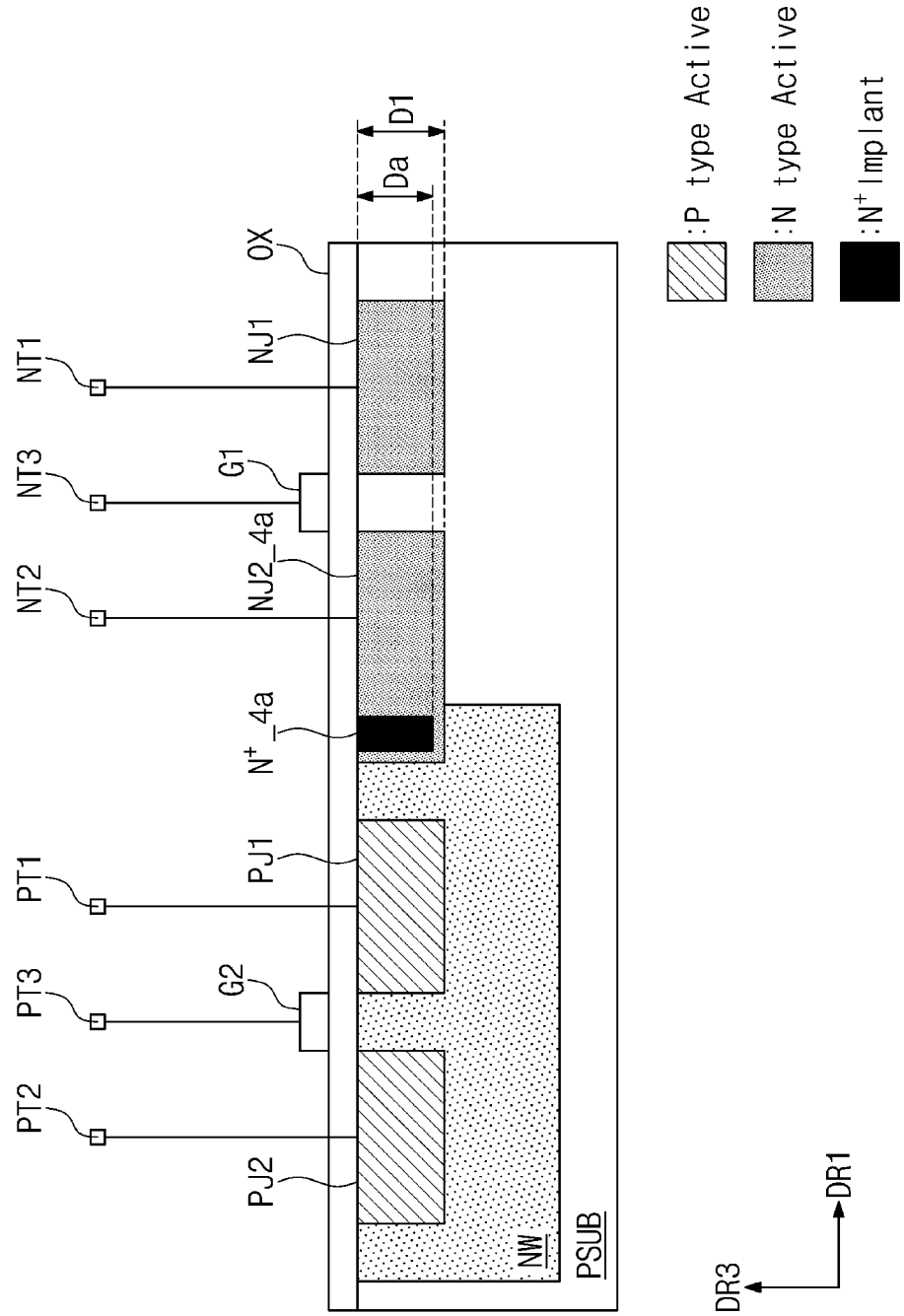
FIGS. 10A to 10C are vertical cross-sectional views of a semiconductor device of FIG. 9, according to some embodiments.
Figure 10B:
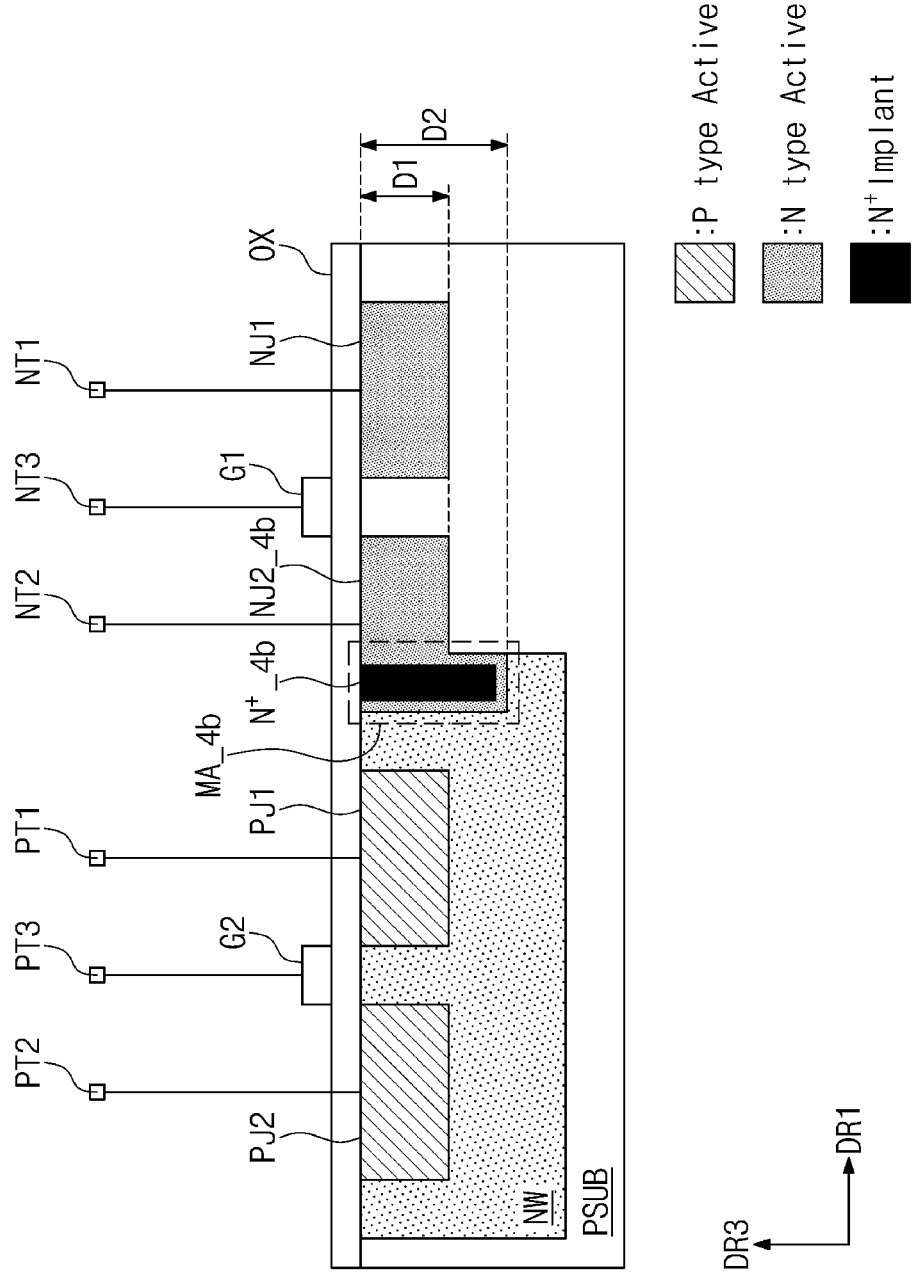
Figure 10C:
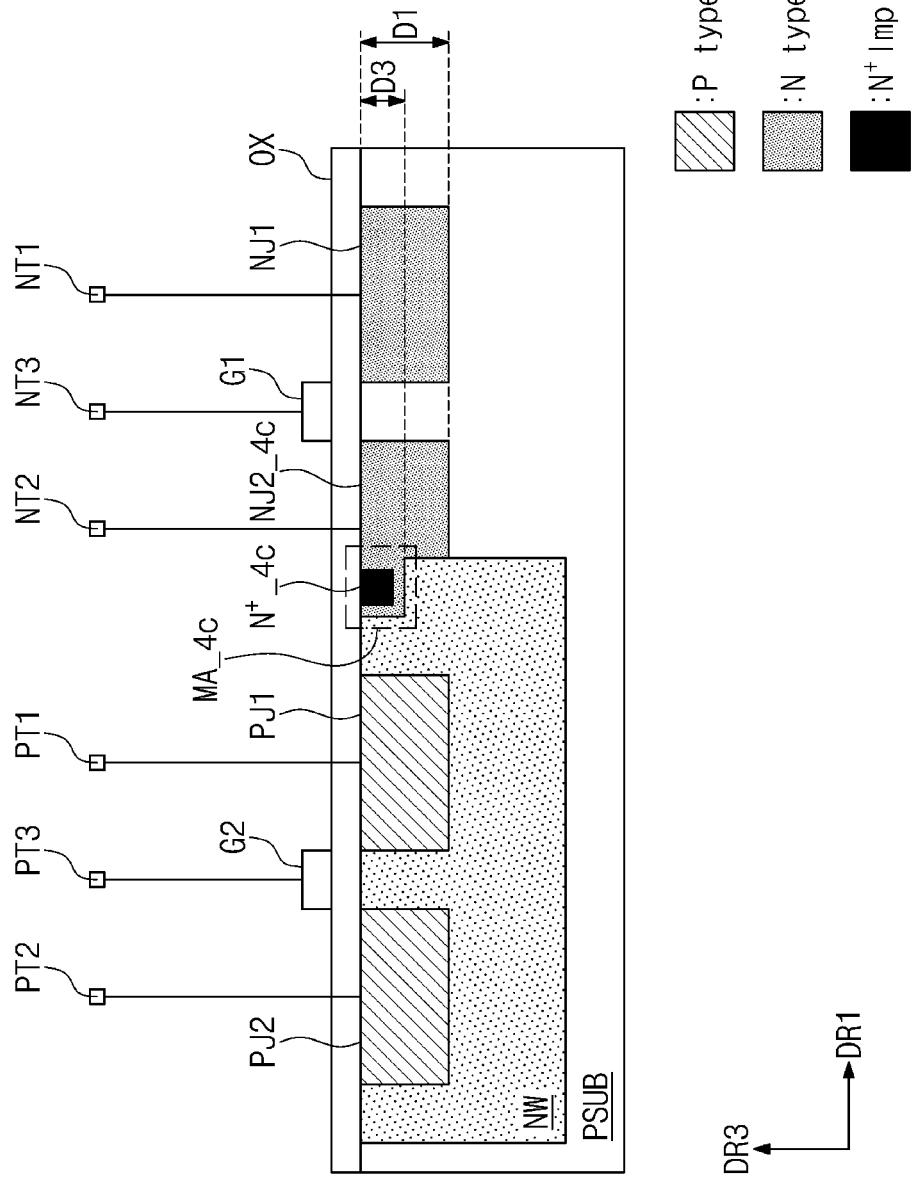

FIG. 9 is a plan view of a semiconductor device of FIG. 3. FIGS. 10A to 10C are vertical cross-sectional views of example embodiments of a semiconductor device of FIG. 9. Referring to FIGS. 9 to 10C, a semiconductor device 100_4 may include the PMOS transistor MP and an NMOS transistor MN_4. Components of the PMOS transistor MP and the NMOS transistor MN_4 and reference signs associated with the components are described above, and thus, additional description will be omitted to avoid redundancy.

In an embodiment, the NMOS transistor MN_4 may provide the body bias of the PMOS transistor MP. For example, as in the above description, a second N-type active region NJ2_4 of the NMOS transistor MN_4 may be formed in the P-type substrate PSUB and the N-well area NW. A portion of the second N-type active region NJ2_4, which is formed in the N-well area NW, may be a merged area MA_4.

In an embodiment, the merged area MA_4 may include an $N^+$ implant area $N^+\_4$. The $N^+$ implant area $N^+\_4$ may be formed in the second N-type active region NJ2_4 or the merged area MA_4. A doping concentration of the $N^+$ implant area $N^+\_4$ may be higher than a doping concentration of the second N-type active region NJ2_4 or the N-well area NW. For example, a doping concentration the $N^+$ implant area $N^+\_4$ may be higher than a doping concentration of the remainder of the second N-type active region NJ2_4, which may have a doping concentration higher than that of the N-well area NW.

In different embodiments, a depth of the $N^+$ implant area $N^+\_4$ in the third direction DR3 may be different. For example, as shown in FIG. 10A, each of the first and second N-type active regions NJ1 and NJ2_4a may have a depth of D1 in the third direction DR3. In this case, the $N^+$ implant area $N^+\_4$ may be placed in the N-well area NW and may be included in the merged area MA_4 and may have a depth of Da along the third direction DR3. In an embodiment, D1 may be greater than Da.

Alternatively, as shown in FIG. 10B, the first N-type active region NJ1 may have a depth of D1 and the second N-type active region NJ2_4b may have a depth of D1 and D2 in the third direction DR3. Shapes of the first and second N-type active regions NJ1 and NJ2_4b, which are viewed from a vertical cross-section defined by the first and third directions DR1 and DR3 are similar to those described with reference to FIG. 5C, and thus, additional description will be omitted to avoid redundancy. In this case, the $N^+$ implant area $N^+\_4$ may be placed in the N-well area NW and may correspond to a merged area MA_4b. In an embodiment, a depth of the $N^+$ implant area $N^+\_4$ in the third direction DR3 may be deeper than D1 and/or may be shallower than D2.

Alternatively, as shown in FIG. 10C, the first N-type active region NJ1 may have a depth of D1 and the second N-type active region NJ2_4c may have a depth of D1 and D3 in the third direction DR3. Shapes of the first and second N-type active regions NJ1 and NJ2_4c, which are viewed from a vertical cross-section defined by the first and third directions DR1 and DR3 are similar to those described with reference to FIG. 5D, and thus, additional description will be omitted to avoid redundancy. In this case, the $N^+$ implant area $N^+\_4$ may be placed in the N-well area NW and may correspond to a merged area MA_4c. In an embodiment, a depth of the $N^+$ implant area $N^+\_4$ in the third direction DR3 may be shallower than each of D1 and D3.

In different embodiments, a length of the $N^+$ implant area $N^+\_4$ in the first direction DR1 or a width of the $N^+$ implant area $N^+\_4$ in the second direction DR2 may be different.

As described above, the second N-type active region NJ2_4 of the NMOS transistor MN_4 may include the merged area MA_4 formed in the N-well area NW. The body bias of the PMOS transistor MP may be provided through the merged area MA_4. For example, the body bias of the PMOS transistor MP may be provided directly through a portion (i.e., a merged area) of the second N-type active region NJ2_4, which is used as a source area or a drain area of the NMOS transistor MN_4. In an embodiment, the $N^+$ implant area $N^+\_4$ may be included in a portion (i.e., a merged area) of the second N-type active region NJ2_4. A doping concentration of the $N^+$ implant area $N^+\_4$ may be different from a doping concentration of the N-well area NW or a doping concentration of the second N-type active region NJ2_4. The $N^+$ implant area $N^+\_4$ may be formed in various shapes/forms within the merged area MA_4.

Figure 11:
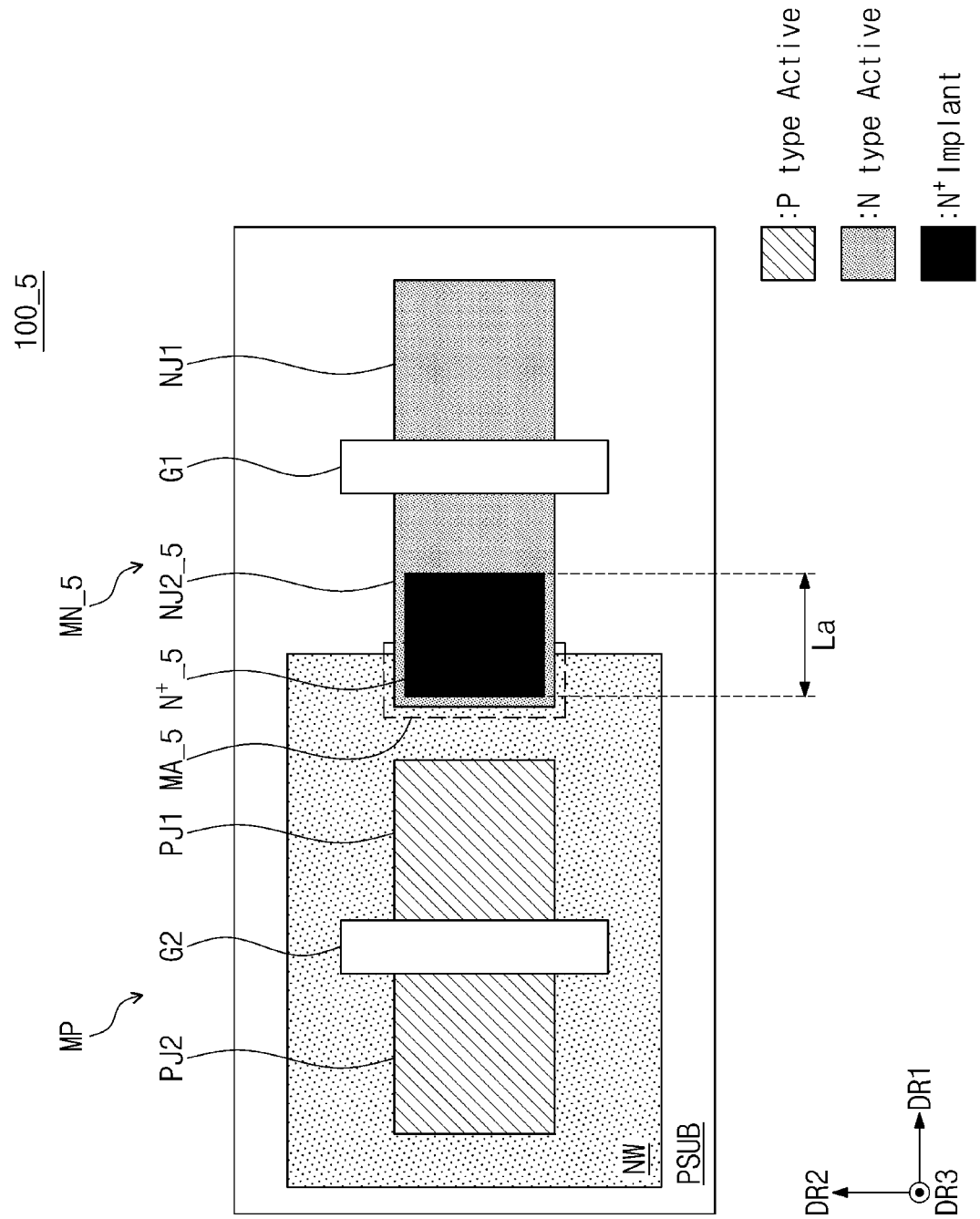
FIG. 11 is a plan view of a semiconductor device of FIG. 3, according to some embodiments.

FIG. 11 is a plan view of a semiconductor device of FIG. 3. FIGS. 12A to 12E are vertical cross-sectional views of a semiconductor device of FIG. 11, according to various embodiments. Referring to FIGS. 11 to 12E, a semiconductor device 100_5 may include the PMOS transistor MP and an NMOS transistor MN_5. Components of the PMOS transistor MP and the NMOS transistor MN_5 are described above, and thus, additional description will be omitted to avoid redundancy.

In an embodiment, a second N-type active region NJ2_5 may include an $N^+$ implant area $N^+\_5$. When viewed from above a plane defined by the first and second directions DR1 and DR2 (i.e., the P-type substrate PSUB), the $N^+$ implant area $N^+\_5$ may be formed in the P-type substrate PSUB and the N-well area NW. A length of the $N^+$ implant area $N^+\_5$ in the first direction DR1 may be La; La may be longer than a length that a portion (i.e., a merged area MA_5) of the second N-type active region NJ2_5 formed in the N-well area NW has in the first direction DR1. In addition, when viewed from above a plane parallel to the P-type substrate PSUB, the area of the $N^+$ implant area $N^+\_5$ included in the second N-type active region NJ2_5 illustrated in FIG. 11 may be larger than the area of the $N^+$ implant area $N^+\_4$ included in the second N-type active region NJ2_4 illustrated in FIG. 9.

In an embodiment, the $N^+$ implant area $N^+\_5$ included in the second N-type active region NJ2_5 may be formed in various shapes or forms.

Figure 12A:
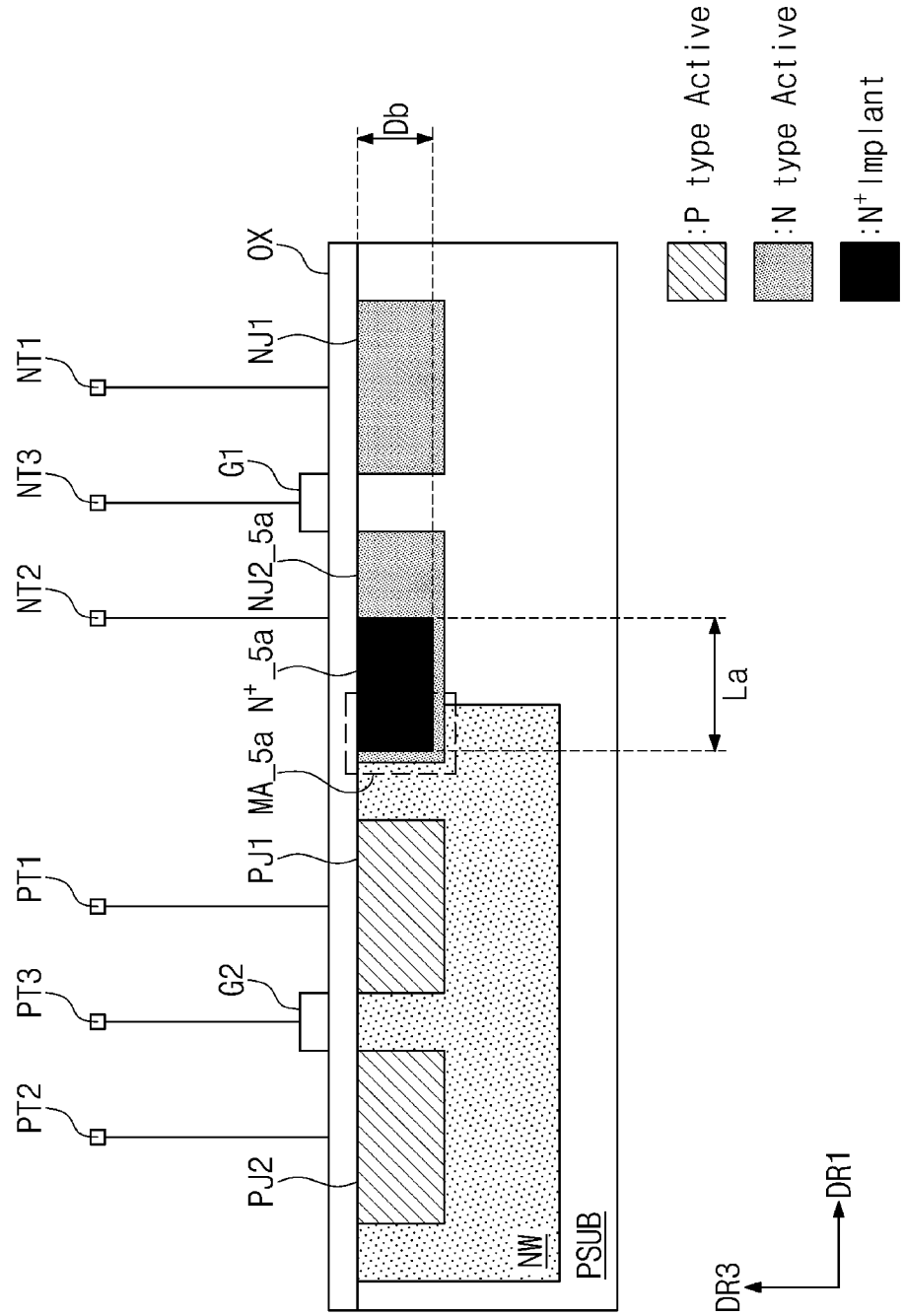
FIGS. 12A to 12E are vertical cross-sectional views of a semiconductor device of FIG. 11, according to various embodiments.

For example, as illustrated in FIG. 12A, an $N^+$ implant area $N^+\_5a$ included in a second N-type active region NJ2_5a may have a length of La in the first direction DR1 and may have a depth of Db in the third direction DR3.

Figure 12B:
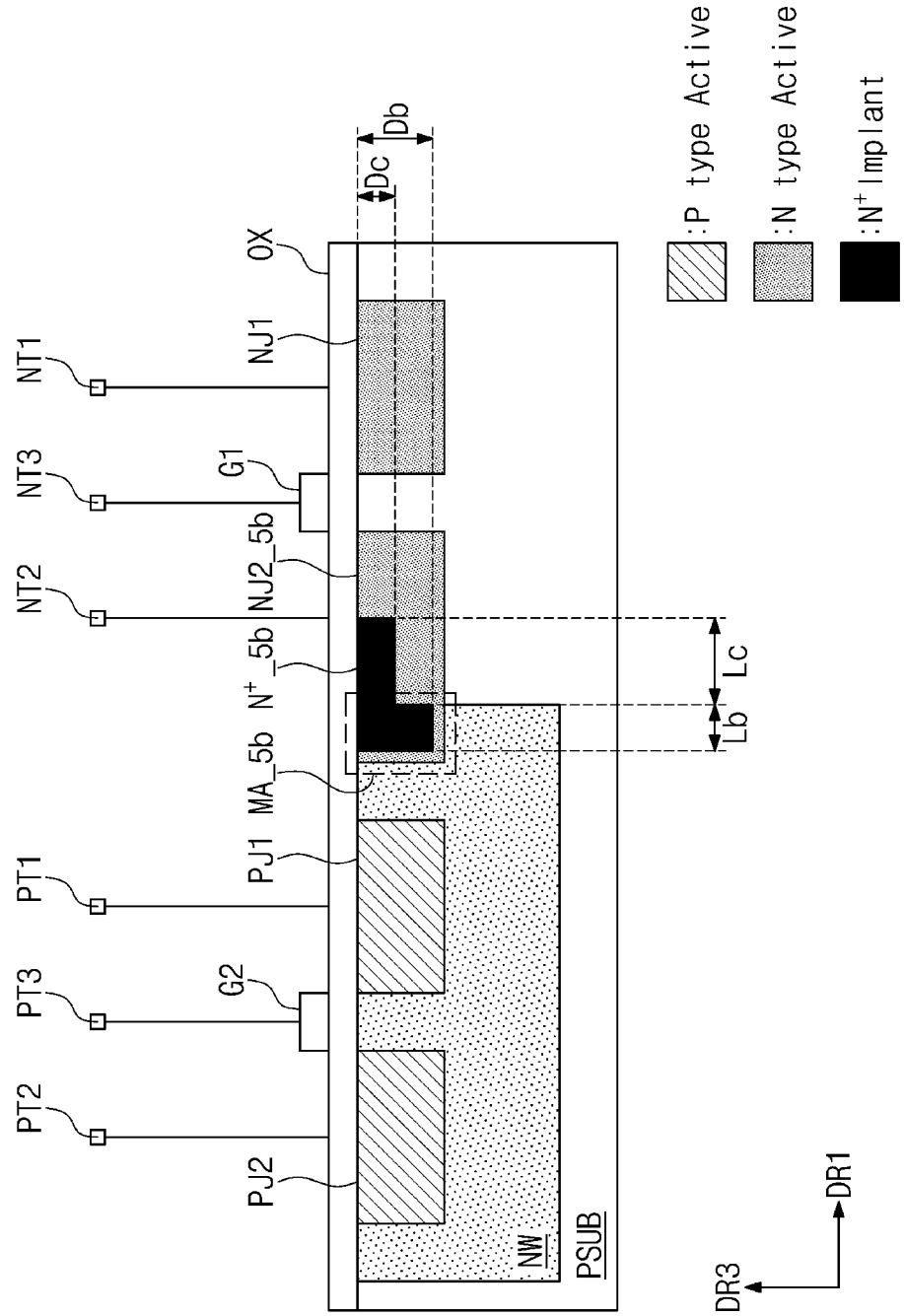

Alternatively, as illustrated in FIG. 12B, in a portion (i.e., a merged area MA_5b) of a second N-type active region NJ2_5b, which is formed in the N-well area NW, an $N^+$ implant area $N^+\_5b$ included in the second N-type active region NJ2_5b may have a length of Lb in the first direction DR1 and may have a depth of Db in the third direction DR3. In a portion of the second N-type active region NJ2_5b, which is formed in the P-type substrate PSUB, (i.e., in the remaining portion of the second N-type active region NJ2_5b other than the merged area MA_5b), the $N^+$ implant area $N^+\_5b$ may have a length of Lc in the first direction DR1 and may have a depth of Dc in the third direction DR3. Accordingly, the $N^+$ implant area $N^+\_5b$ included in the second N-type active region NJ2_5b may have a deeper depth in the merged area MA_5b.

Figure 12C:
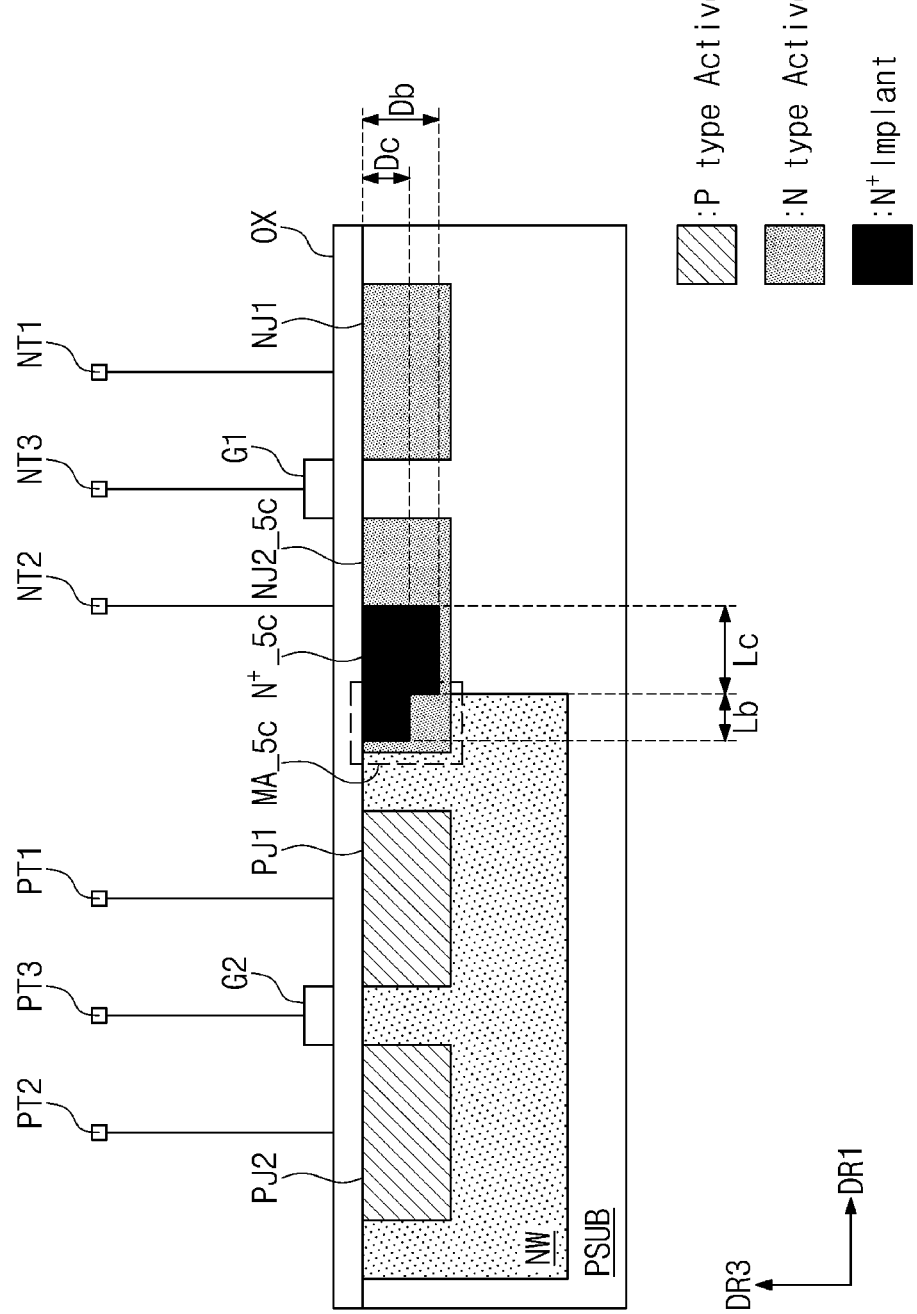

Alternatively, as illustrated in FIG. 12C, in a portion (i.e., a merged area MA_5c) of a second N-type active region NJ2_5c, which is formed in the N-well area NW, an $N^+$ implant area $N^+\_5c$ included in the second N-type active region NJ2_5c may have a length of Lb in the first direction DR1 and may have a depth of Dc in the third direction DR3. In a portion of the second N-type active region NJ2_5c, which is formed in the P-type substrate PSUB, (i.e., in the remaining portion of the second N-type active region NJ2_5c other than the merged area MA_5c), the $N^+$ implant area $N^+\_5c$ may have a length of Lc in the first direction DR1 and may have a depth of Db in the third direction DR3. As such, the $N^+$ implant area $N^+\_5c$ included in the second N-type active region NJ2_5c may have a shallower depth in the merged area MA_5c.

Figure 12D:
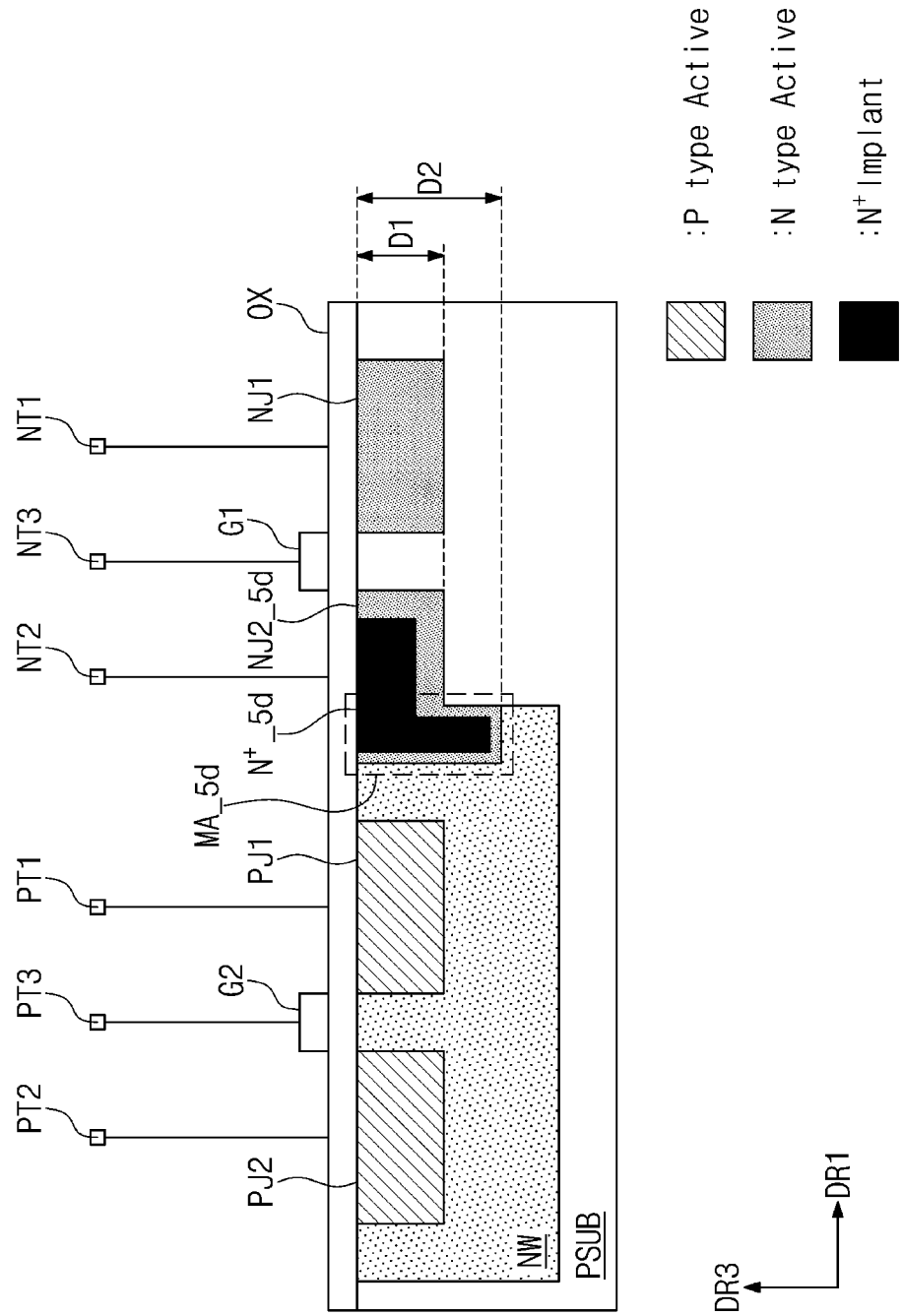
Figure 12E:
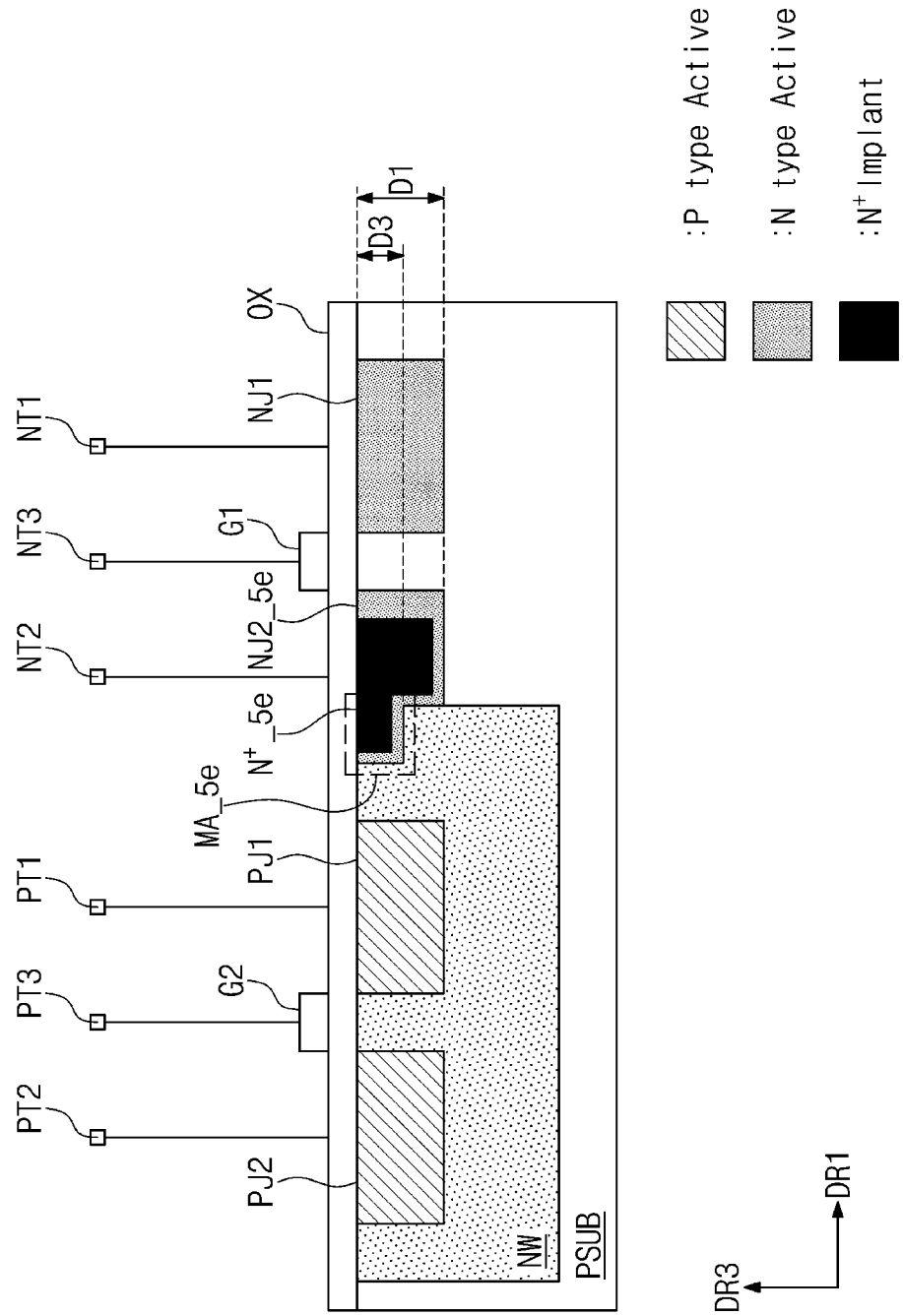

Alternatively, as illustrated in FIG. 12D, a second N-type active region NJ2_5d may have a depth of D2 in the N-well area NW and may have a depth of D1 in the P-type substrate PSUB. A shape or form of the second N-type active region NJ2_5d is similar to that described with reference to FIG. 5C, and thus, additional description will be omitted to avoid redundancy. In an embodiment, as illustrated in FIG. 12D, the second N-type active region NJ2_5d may include an $N^+$ implant area $N^+\_5d$. The $N^+$ implant area $N^+\_5d$ may have a first depth in the third direction DR3 in the N-well area NW and may have a second depth in the third direction DR3 in the P-type substrate PSUB, and the first depth may be deeper than the second depth.

Alternatively, as illustrated in FIG. 12E, a second N-type active region NJ2_5e may have a depth of D3 in the N-well area NW and may have a depth of D1 in the P-type substrate PSUB. A shape or form of the second N-type active region NJ2_5e is similar to that described with reference to FIG. 5D, and thus, additional description will be omitted to avoid redundancy. In an embodiment, as illustrated in FIG. 12E, the second N-type active region NJ2_5e may include an $N^+$ implant area $N^+\_5e$. The $N^+$ implant area $N^+\_5e$ may have a third depth in the third direction DR3 in the N-well area NW and may have a fourth depth in the third direction DR3 in the P-type substrate PSUB, and the third depth may be shallower than the fourth depth.

As described above, the second N-type active region NJ2_5 may be formed in the P-type substrate PSUB and the N-well area NW, and thus, the body bias of the PMOS transistor MP may be provided directly through the second N-type active region NJ2_5 used as a source/drain of the NMOS transistor MN_5. In an embodiment, the second N-type active region NJ2_5 may include the $N^+$ implant area $N^+\_5$, and the $N^+$ implant area $N^+\_5$ may be formed in various shapes or forms. It should be recognized that in the embodiments of FIGS. 12A-12E, the second N-type active region NJ2_5 and $N^+$ implant area $N^+\_5$ are formed in a region of the P-type substrate PSUB such that part of the second N-type active region NJ2_5 and $N^+$ implant area $N^+\_5$ is surrounded by both the N-well area NW and the P-type substrate PSUB (e.g., for the PMOS transistor where the P-type substrate PSUB surrounds the outside of the N-well area NW, and both the P-type substrate PSUB and the N-well area NW are under the second N-type active region NJ2_5 and $N^+$ implant area $N^+\_5$), and another part of the second N-type active region NJ2_5 and $N^+$ implant area $N^+\_5$ is surrounded by the P-type substrate PSUB without being surrounded by the N-well area NW (e.g., for the NMOS transistor where the P-type substrate PSUB surrounds and is under part of the outside of the N-type active region NJ2_5 and N+ implant area $N^+\_5$, without the N-well area NW therebetween).

Figure 13:
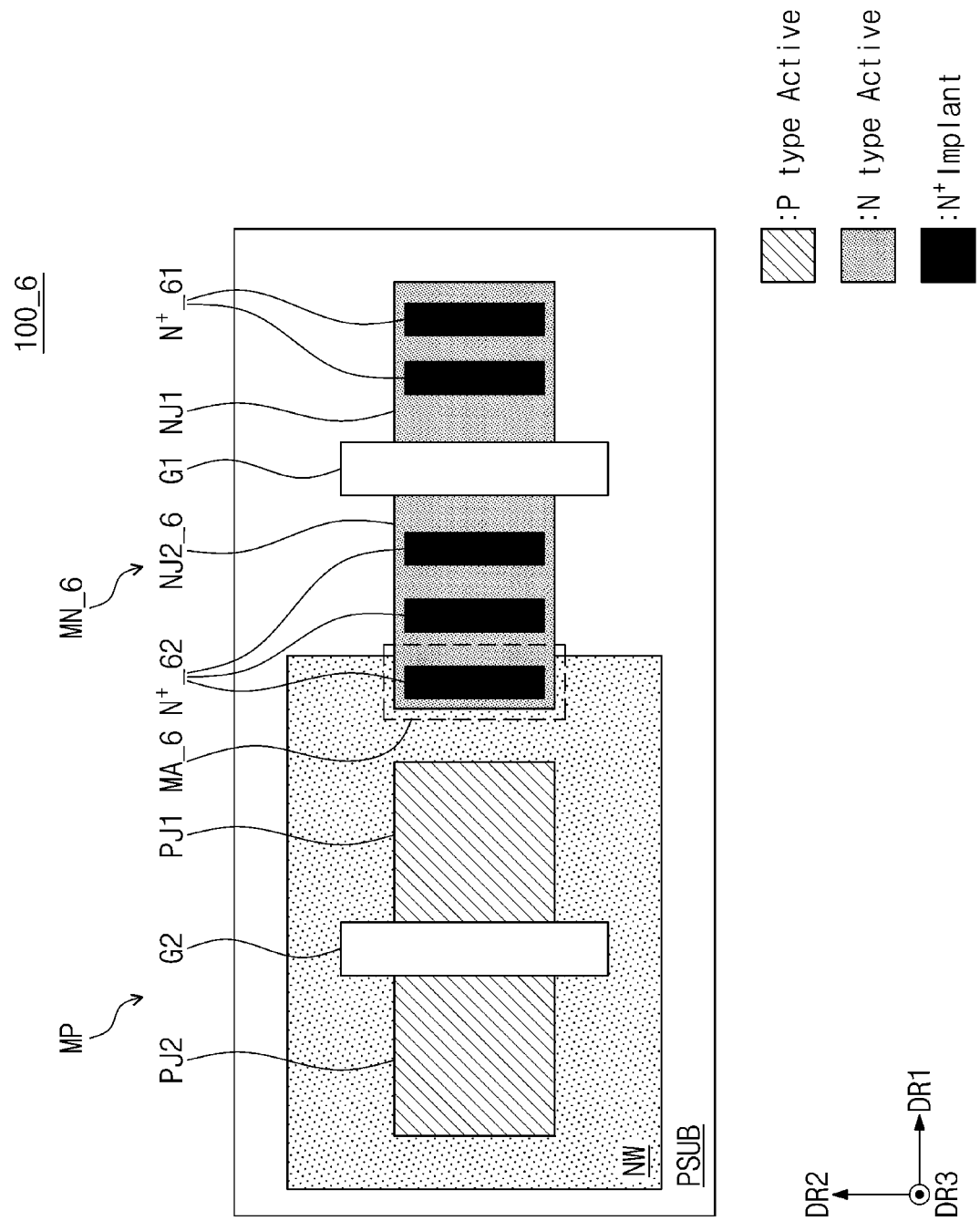
FIG. 13 is a plan view of a semiconductor device of FIG. 3, according to some embodiments.

FIG. 13 is a plan view of an example semiconductor device of FIG. 3. Referring to FIG. 13, a semiconductor device 100_6 may include the PMOS transistor MP and an NMOS transistor MN_6. Components of the PMOS transistor MP and the NMOS transistor MN_6 are described above, and thus, additional description will be omitted to avoid redundancy.

In an embodiment, the first N-type active region NJ1 may include a plurality of $N^+$ implant areas $N^+\_61$, and a second N-type active region NJ2_6 may include a plurality of $N^+$ implant areas $N^+\_62$. In an embodiment, the plurality of $N^+$ implant areas $N^+\_61$ and $N^+\_62$ may have the same shape or form. Alternatively, at least one of the plurality of $N^+$ implant areas $N^+\_61$ and at least one of the plurality of $N^+$ implant areas $N^+\_62$ may differ from each other in shape or form.

In an embodiment, the number of the plurality of $N^+$ implant areas $N^+\_61$ included in the first N-type active region NJ1 may be the same as the number of the plurality of $N^+$ implant areas $N^+\_62$ included in the second N-type active region NJ2_6. Alternatively, the number of the plurality of $N^+$ implant areas $N^+\_61$ included in the first N-type active region NJ1 may be different from the number of the plurality of $N^+$ implant areas $N^+\_62$ included in the second N-type active region NJ2_6. For example, the number of the plurality of $N^+$ implant areas $N^+\_61$ included in the first N-type active region NJ1 may be more than the number of the plurality of $N^+$ implant areas $N^+\_62$ included in the second N-type active region NJ2_6. Alternatively, the number of the plurality of $N^+$ implant areas $N^+\_61$ included in the first N-type active region NJ1 may be less than the number of the plurality of $N^+$ implant areas $N^+\_62$ included in the second N-type active region NJ2_6.

In an embodiment, when viewed from above a plane defined by the first and second directions DR1 and DR2 (i.e., a plane being parallel to a top surface of the P-type substrate PSUB), at least one of the $N^+$ implant areas $N^+\_62$ included in the second N-type active region NJ2_6 may overlap the N-well area NW. For example, at least one of the $N^+$ implant areas $N^+\_62$ included in the second N-type active region NJ2_6 may be included in a merged area MA_6.

In an embodiment, at least one of the $N^+$ implant areas $N^+\_62$ included in the second N-type active region NJ2_6 may have at least one of various shapes of the $N^+$ implant areas described with reference to FIGS. 9 to 12E.

Figure 14:
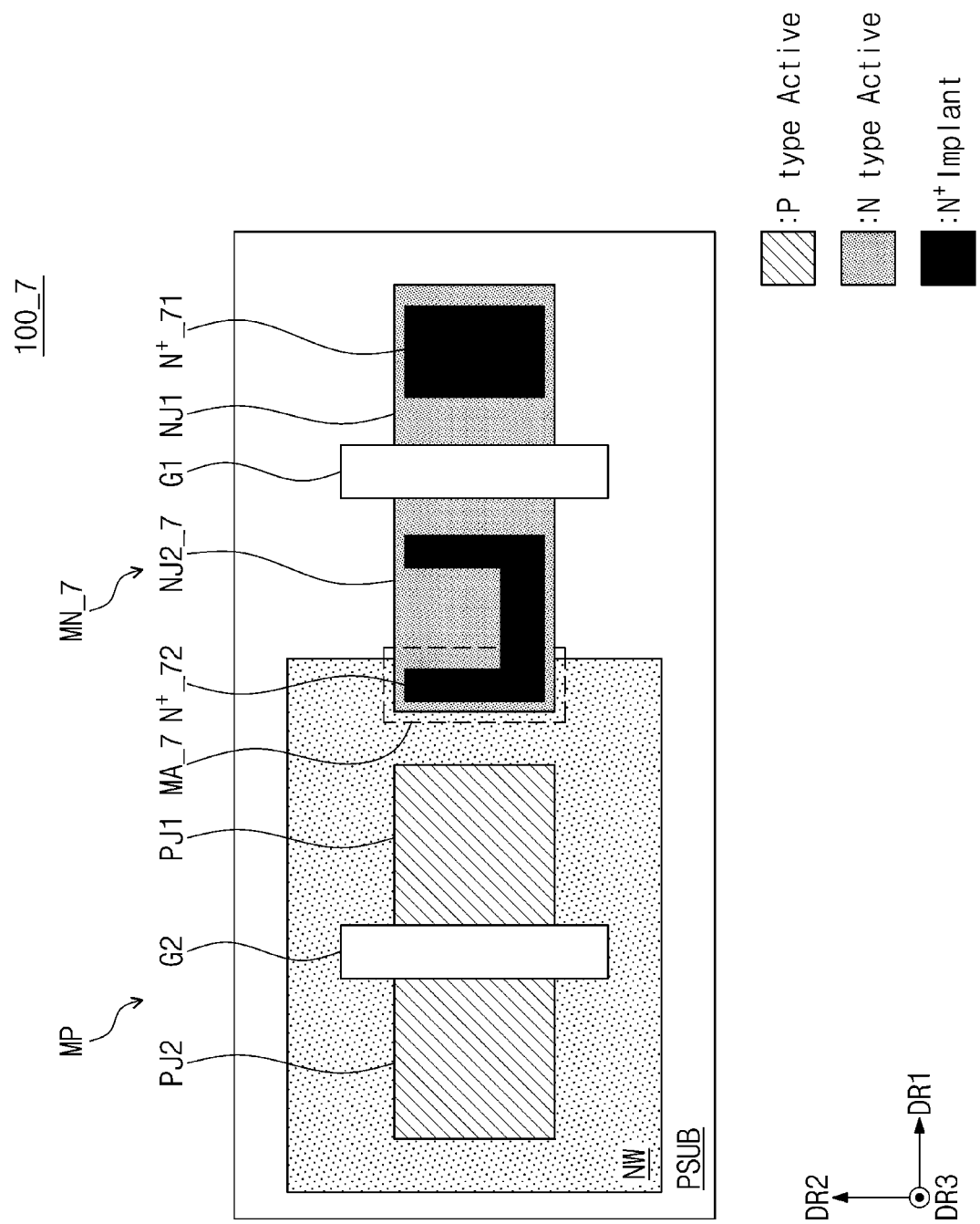
FIG. 14 is a plan view of a semiconductor device of FIG. 3, according to some embodiments.

FIG. 14 is a plan view of an example semiconductor device of FIG. 3. Referring to FIG. 14, a semiconductor device 100_7 may include the PMOS transistor MP and an NMOS transistor MN_7. Components of the PMOS transistor MP and the NMOS transistor MN_7 are described above, and thus, additional description will be omitted to avoid redundancy.

In an embodiment, a second N-type active region NJ2_7 may include an $N^+$ implant area $N^+\_72$. When viewed from above a plane parallel to the P-type substrate PSUB, a portion of the $N^+$ implant area $N^+\_72$ of the second N-type active region NJ2_7 may overlap the N-well area NW, and the remaining portion thereof may overlap the P-type substrate PSUB.

In an embodiment, the first N-type active region NJ1 of the NMOS transistor MN_7 may include an $N^+$ implant area $N^+\_71$. As illustrated in FIG. 14, the $N^+$ implant area $N^+\_71$ of the first N-type active region NJ1 and the $N^+$ implant area $N^+\_72$ of the second N-type active region NJ2_7 may be different in shape or form. For example, the $N^+$ implant area $N^+\_71$ of the first N-type active region NJ1 may be quadrangular, and the $N^+$ implant area $N^+\_72$ of the second N-type active region NJ2_7 may be polygonal having more than four sides. However, the present disclosure is not limited thereto. For example, shapes or forms of the $N^+$ implant area $N^+\_71$ of the first N-type active region NJ1 and the $N^+$ implant area $N^+\_72$ of the second N-type active region NJ2_7 may be variously changed.

Figure 15:
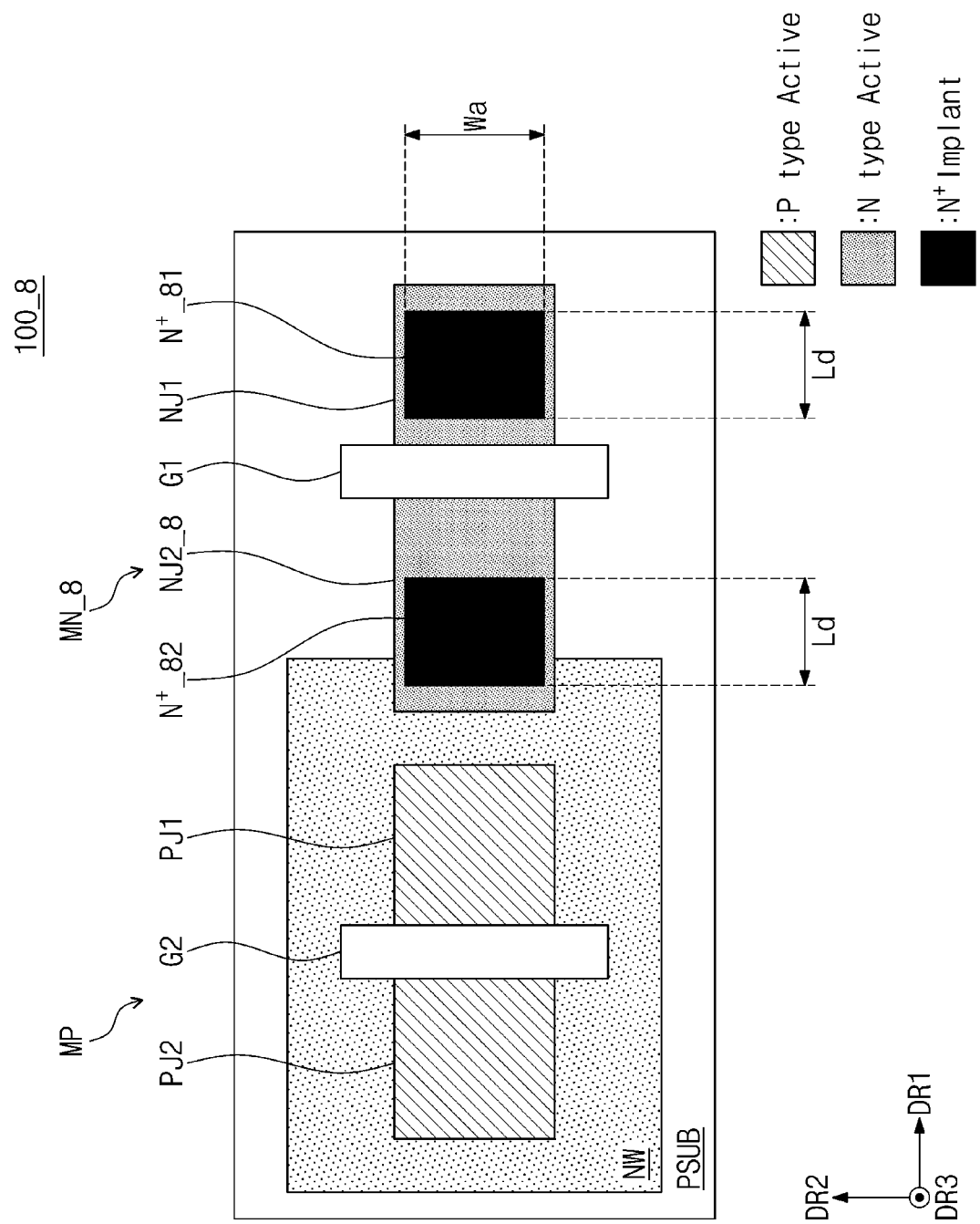
FIG. 15 is a plan view of a semiconductor device of FIG. 3, according to some embodiments.

FIG. 15 is a plan view of an example semiconductor device of FIG. 3. Referring to FIG. 15, a semiconductor device 100_8 may include the PMOS transistor MP and an NMOS transistor MN_8. Components of the PMOS transistor MP and the NMOS transistor MN_8 are described above, and thus, additional description will be omitted to avoid redundancy.

In an embodiment, a second N-type active region NJ2_8 may include an N+ implant area N+_82. When viewed from above a plane parallel to the P-type substrate PSUB, a portion of the N+ implant area N+_82 of the second N-type active region NJ2_8 may overlap the N-well area NW, and the remaining portion thereof may overlap the P-type substrate PSUB.

In an embodiment, the first N-type active region NJ1 of the NMOS transistor MN_8 may include an N+ implant area N+_81. As illustrated in FIG. 15, the N+ implant area N+_81 of the first N-type active region NJ1 and the N+ implant area N+_82 of the second N-type active region NJ2_8 may be the same in shape or form. For example, when viewed from above a plane parallel to the P-type substrate PSUB, each of the N+ implant area N+_81 of the first N-type active region NJ1 and the N+ implant area N+_82 of the second N-type active region NJ2_8 may have a length of Ld in the first direction DR1 and may have a width of Wa in the second direction DR2.

Figure 16:
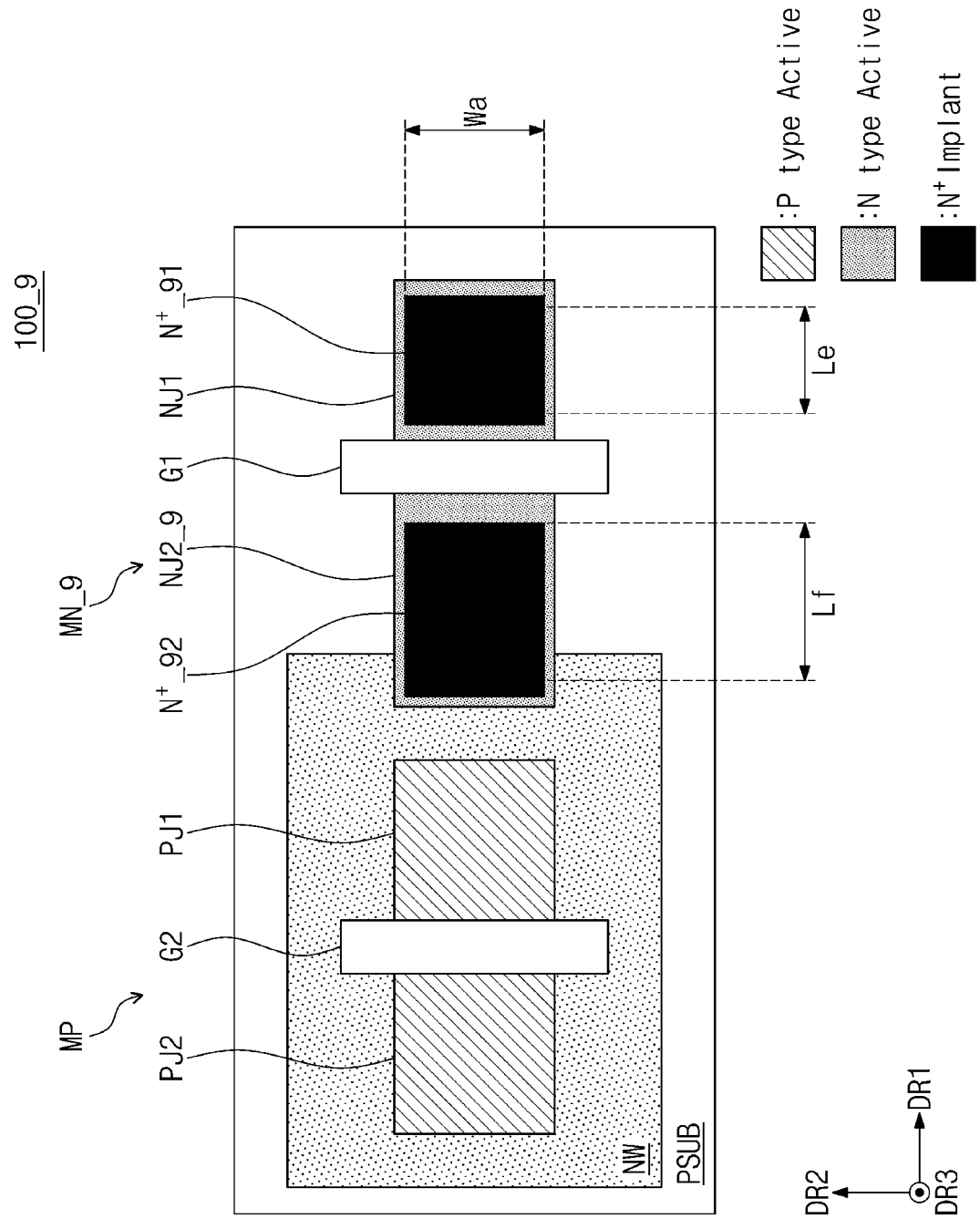
FIG. 16 is a plan view of a semiconductor device of FIG. 3, according to some embodiments.

FIG. 16 is a plan view of an example semiconductor device of FIG. 3. Referring to FIG. 16, a semiconductor device 100_9 may include the PMOS transistor MP and an NMOS transistor MN_9. Components of the PMOS transistor MP and the NMOS transistor MN_9 are described above, and thus, additional description will be omitted to avoid redundancy.

In an embodiment, a second N-type active region NJ2_9 may include an N+ implant area N+_92. When viewed from above a plane parallel to the P-type substrate PSUB, a portion of the N+ implant area N+_92 of the second N-type active region NJ2_9 may overlap the N-well area NW, and the remaining portion thereof may overlap the P-type substrate PSUB.

In an embodiment, the first N-type active region NJ1 of the NMOS transistor MN_9 may include an N+ implant area N+_91. As illustrated in FIG. 16, the N+ implant area N+_91 of the first N-type active region NJ1 and the N+ implant area N+_82 of the second N-type active region NJ2_9 may be different in shape or form. For example, when viewed from above a plane parallel to the P-type substrate PSUB, the N+ implant area N+_91 of the first N-type active region NJ1 may have a length of Le in the first direction DR1 and may have a width of Wa in the second direction DR2. When viewed from above a plane parallel to the P-type substrate PSUB, the N+ implant area N+_82 of the second N-type active region NJ2_9 may have a length of Lf in the first direction DR1 and may have a width of Wa in the second direction DR2. That is, the N+ implant area N+_91 of the first N-type active region NJ1 and the N+ implant area N+_82 of the second N-type active region NJ2_9 may have similar quadrangular shapes, but the N+ implant area N+_91 of the first N-type active region NJ1 and the N+ implant area N+_82 of the second N-type active region NJ2_9 may have different lengths in the first direction DR1 or different widths in the second direction DR2 to have different areas.

As described above, each of N-type active regions (hereinafter referred to as "first and second N-type active regions") of an NMOS transistor may include an N+ implant area that is doped with impurities of a high concentration. In this case, the number of N+ implant areas of the first N-type active region may be different from or the same as the number of N+ implant areas of the second N-type active region. Alternatively, when viewed from above a plane parallel to a P-type substrate, shapes of the N+ implant areas of the first N-type active region may be different from or the same as shapes of the N+ implant areas of the second N-type active region. Alternatively, when viewed from above a plane parallel to a P-type substrate, the area of each of the N+ implant areas of the first N-type active region may be different from or the same as the area of each of the N+ implant areas of the second N-type active region.

In an embodiment, even though not illustrated explicitly in drawings, when viewed from a vertical cross-section defined by the first and third directions DR1 and DR3, the N+ implant areas of each of the first and second N-type active regions may be the same or different in shape, form, or area.

Figure 17A:
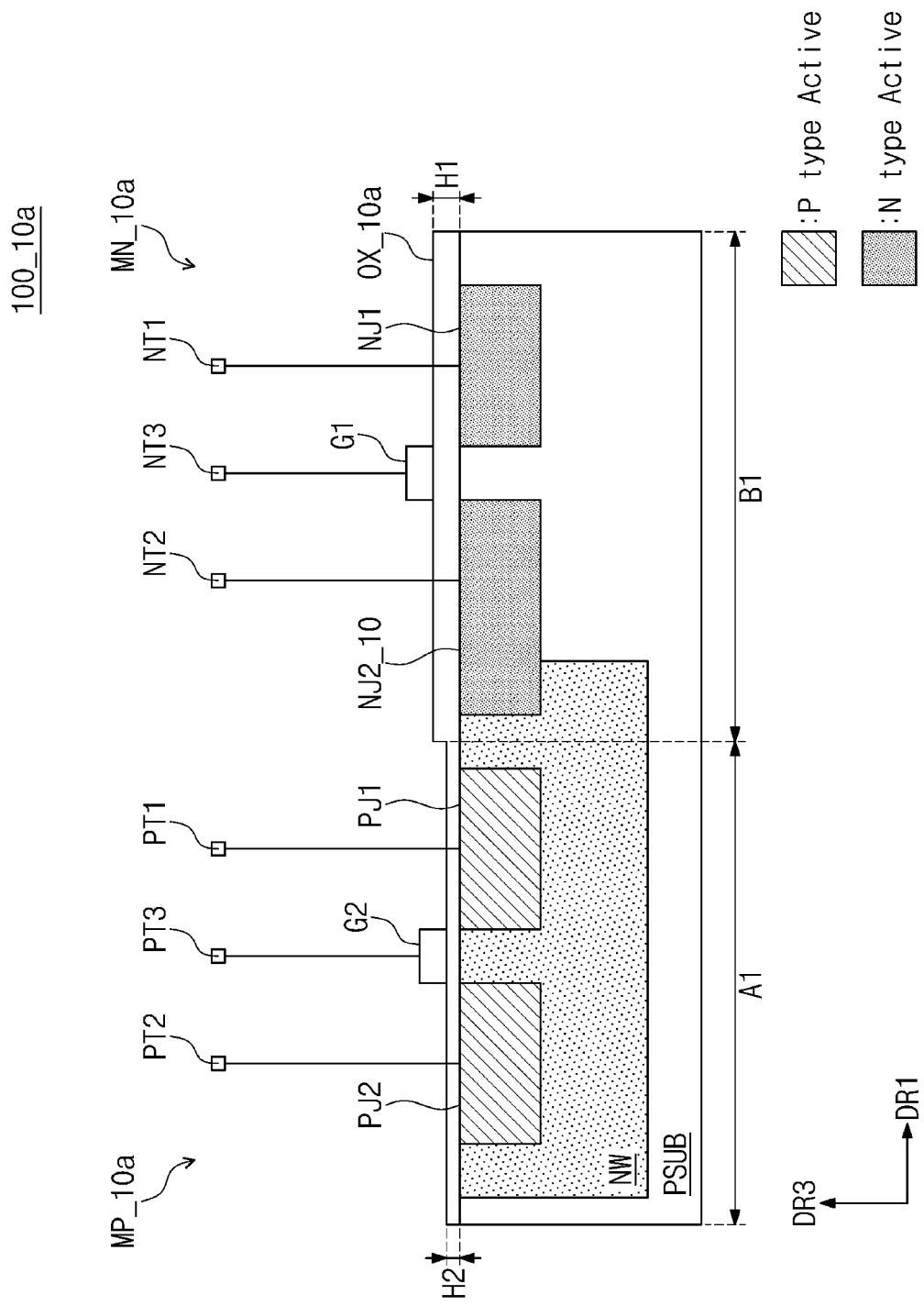
FIGS. 17A and 17B are vertical cross-sectional views of a semiconductor device of FIG. 3, according to some embodiments.
Figure 17B:
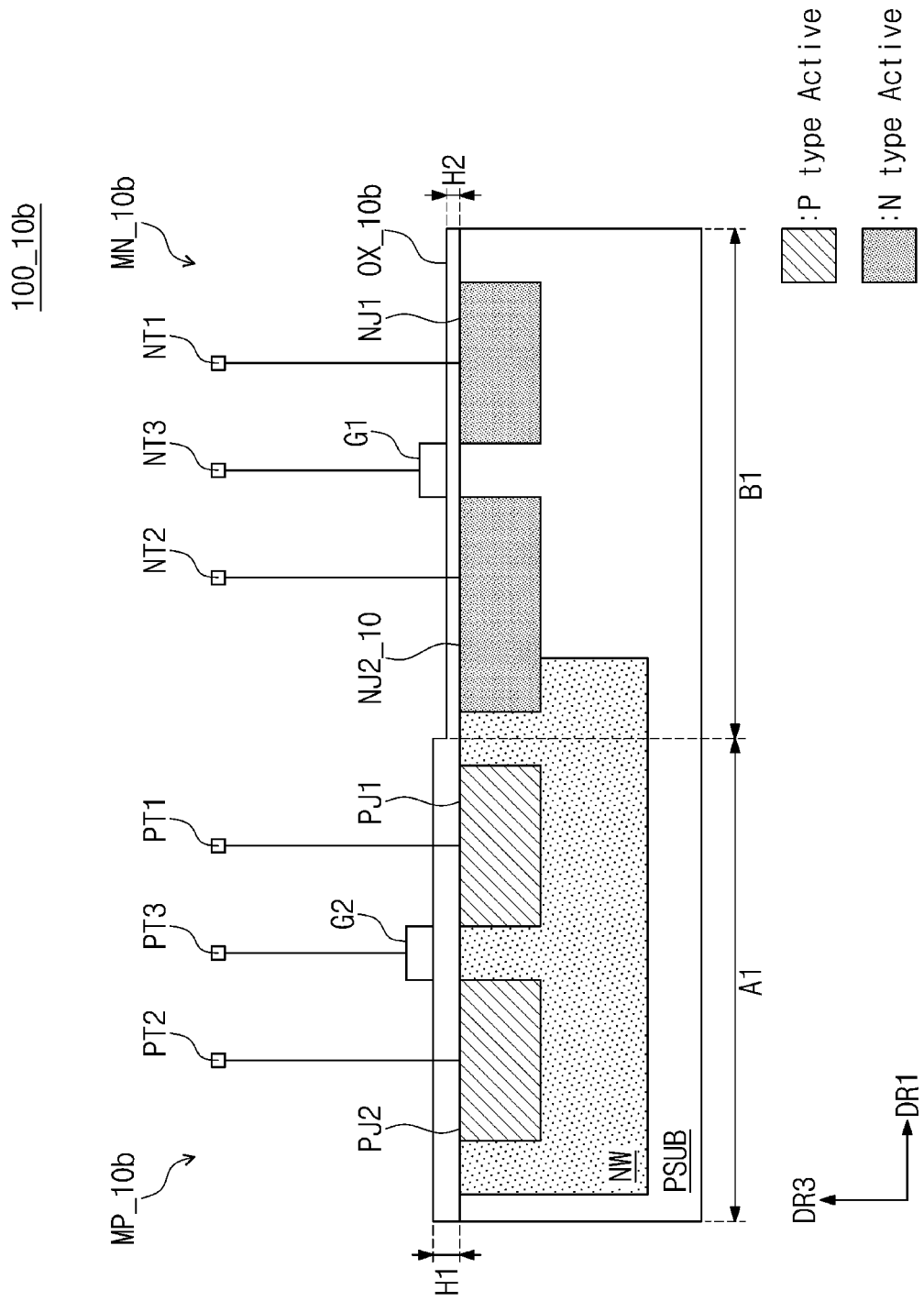

FIGS. 17A and 17B are vertical cross-sectional views of an example semiconductor device of FIG. 3. Referring to FIGS. 17A and 17B, a semiconductor device 100_10a or 100_10b may include a PMOS transistor MP_10a or MP_10b and an NMOS transistor MN_10a or MN_10b. Components of the PMOS transistor MP_10a or MP_10b and the NMOS transistor MN_10a or MN_10b are described above, and thus, additional description will be omitted to avoid redundancy.

A thickness or height of an oxide layer OX_10a or OX_10b corresponding to the PMOS transistor MP_10a or MP_10b and the NMOS transistor MN_10a or MN_10b may not be uniform. For example, as illustrated in FIG. 17A, the oxide layer OX_10a may have a height of H1 in area B1 and may have a height of H2 smaller than H1 in area A1. Alternatively, as illustrated in FIG. 17B, the oxide layer OX_10b may have a height of H1 in area A1 and may have a height of H2 smaller than H1 in area B1.

In an embodiment, area A1 may be an area including the first and second P-type active regions PJ1 and PJ2 of the PMOS transistor MP_10a or MP_10b. Area B1 may be an area including first and second N-type active regions NJ1 and NJ2_10 of the NMOS transistor MN_10a or MN_10b.

Figure 18A:
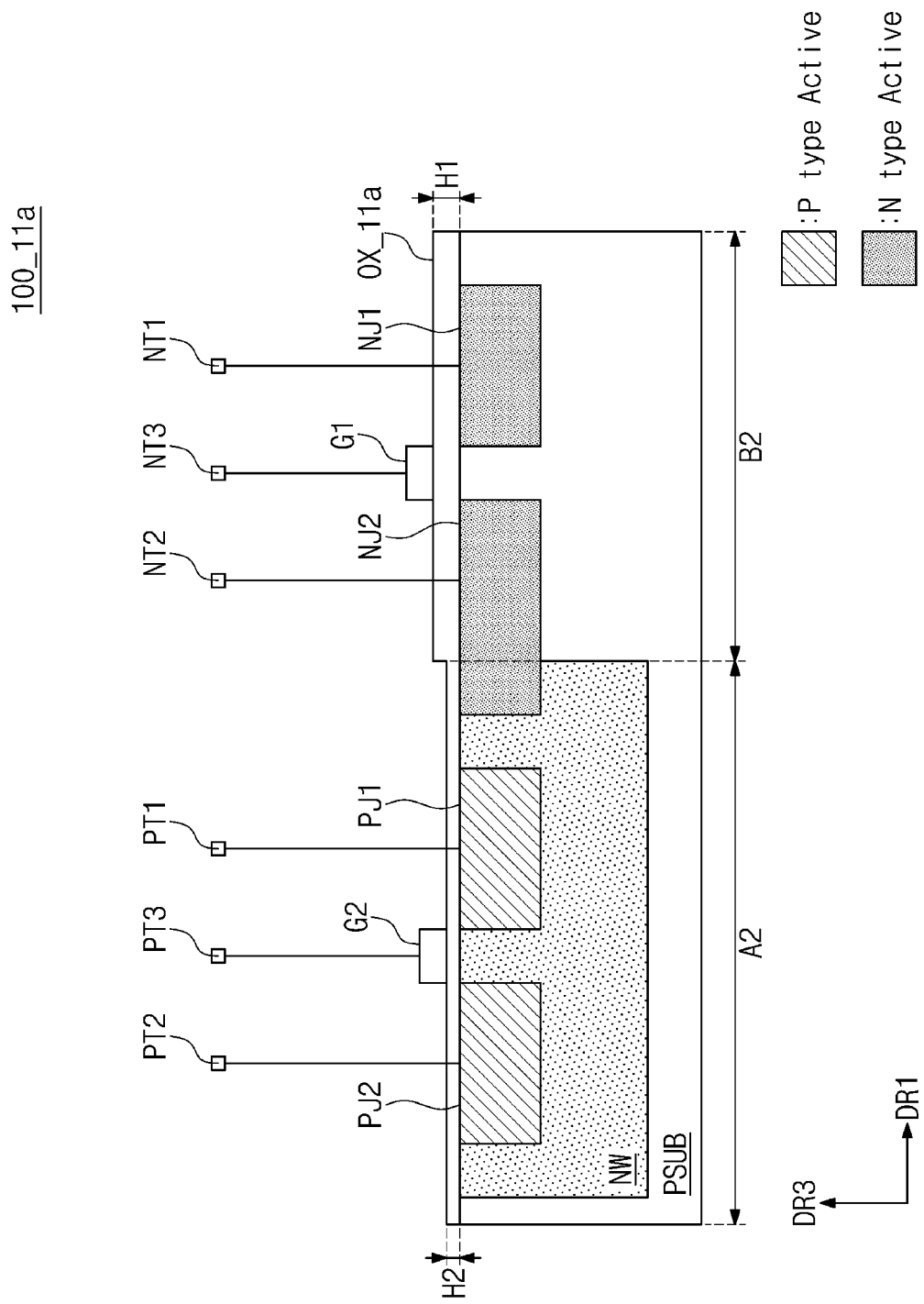
FIGS. 18A and 18B are vertical cross-sectional views of a semiconductor device of FIG. 3, according to some embodiments.
Figure 18B:
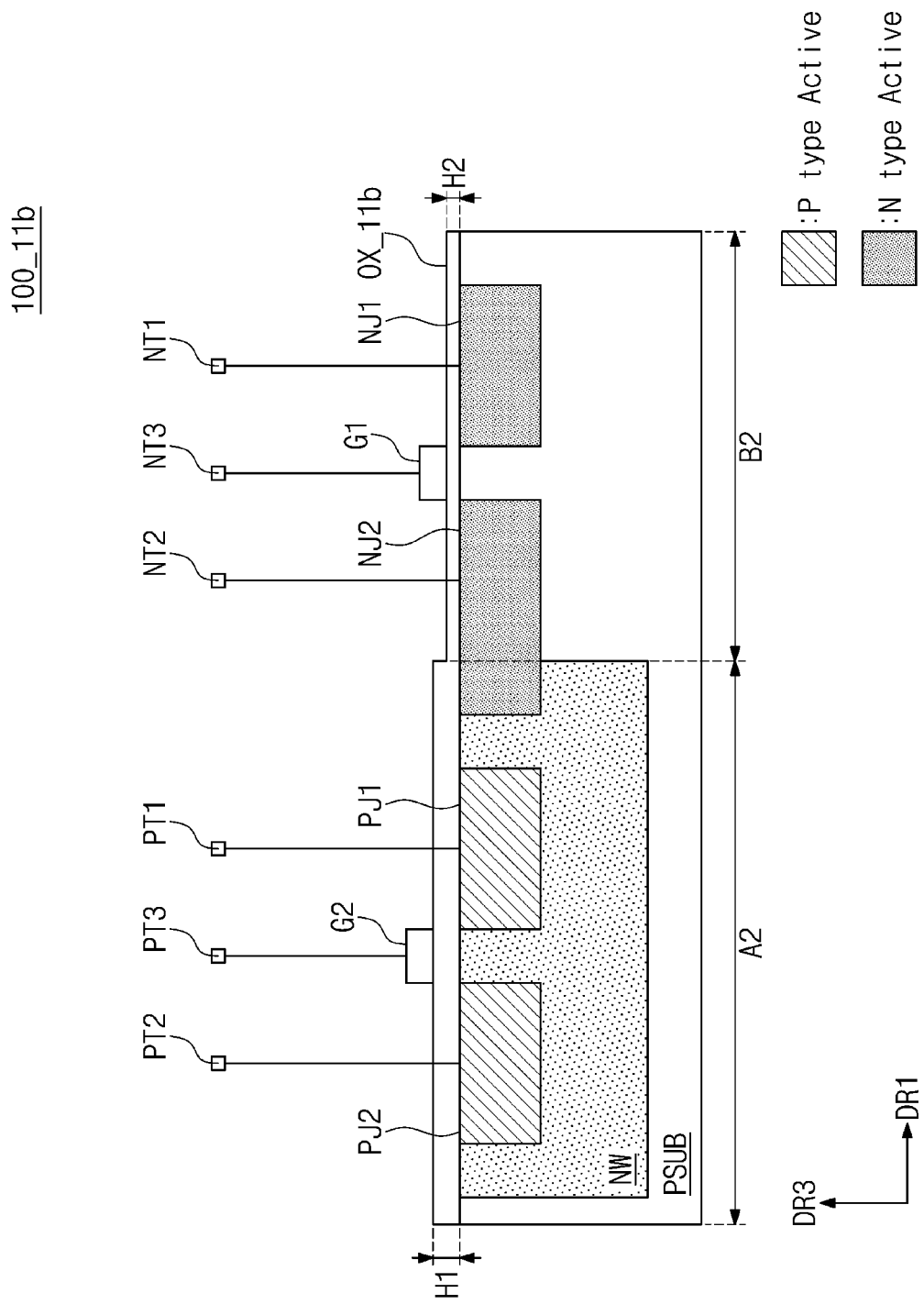

FIGS. 18A and 18B are vertical cross-sectional views of an example semiconductor device of FIG. 3. Referring to FIGS. 18A and 18B, a semiconductor device 100_11a or 100_11b may include a PMOS transistor MP_11a or MP_11b and an NMOS transistor MN_11a or MN_11b. Components of the PMOS transistor MP_11a or MP_11b and the NMOS transistor MN_11a or MN_11b are described above, and thus, additional description will be omitted to avoid redundancy.

A thickness or height of an oxide layer OX_11a or OX_11b corresponding to the PMOS transistor MP_11a or MP_11b and the NMOS transistor MN_11a or MN_11b may not be uniform. For example, as illustrated in FIG. 18A, the oxide layer OX_11a may have a height of H1 in area B2 and may have a height of H2 smaller than H1 in area A2. Alternatively, as illustrated in FIG. 18B, the oxide layer OX_11b may have a height of H1 in area A2 and may have a height of H2 smaller than H1 in area B2.

In an embodiment, area A2 may be an area including the first and second P-type active regions PH and PJ2 of the PMOS transistor MP_11a or MP_11b and a portion (e.g., a merged area) of a second N-type active region NJ2_11 of the NMOS transistor MN_11a or MN_11b. Alternatively, area A2 may be an area including the N-well area NW. Area B2 may be an area including first N-type active region NJ1 of the NMOS transistor MN_11a or MN_11b and the remaining portion of the second N-type active region NJ2_11 (e.g., the remaining portion of the second N-type active region NJ2_11 other than the merged area). In this embodiment, a height change of the oxide layer OX_11a or OX_11b may occur in an area where the N-well area NW and the horizontally adjacent P-type substrate PSUB are in contact with each other.

Figure 19:
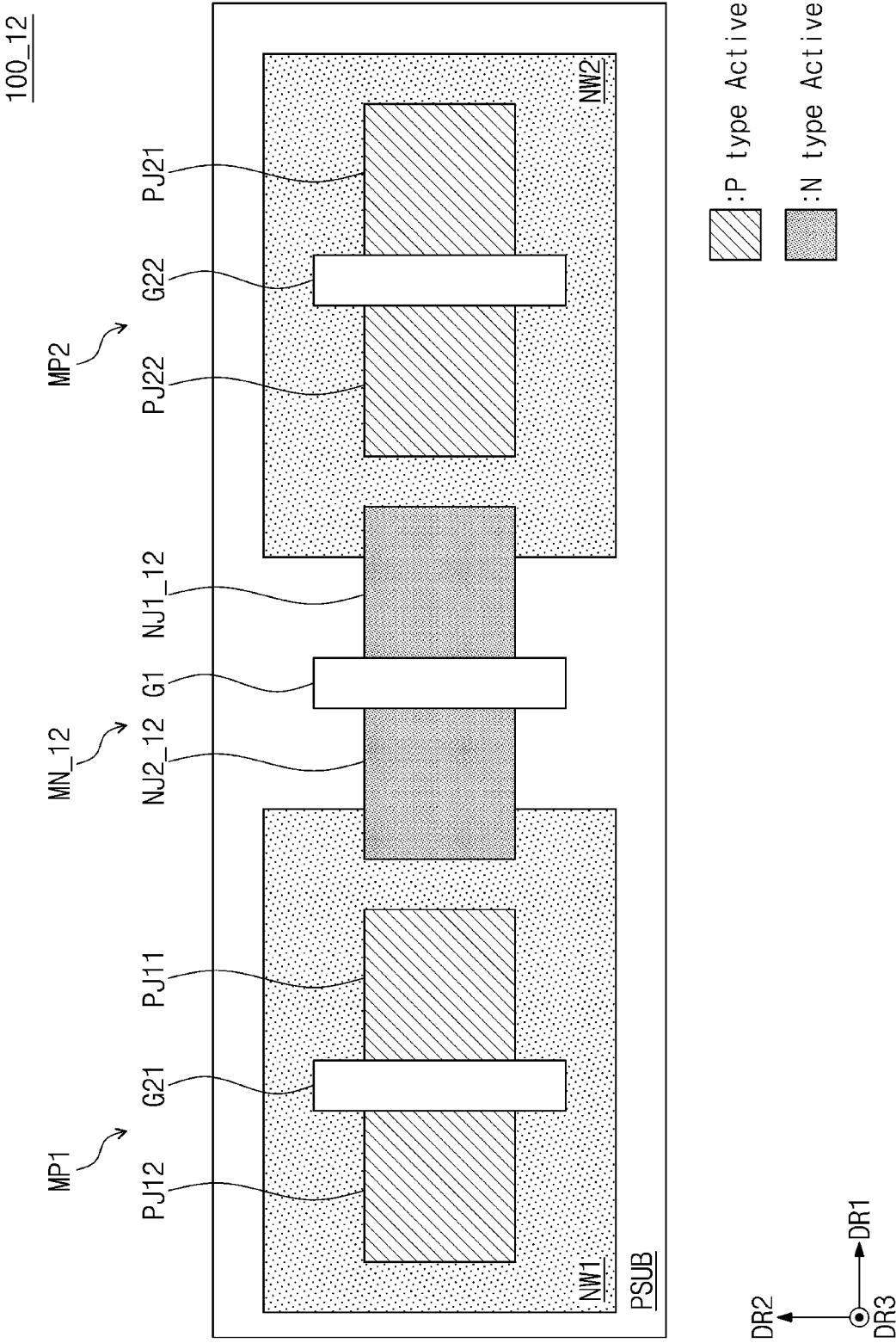
FIG. 19 is a plan view of a semiconductor device according to an embodiment of the present disclosure.
Figure 20:
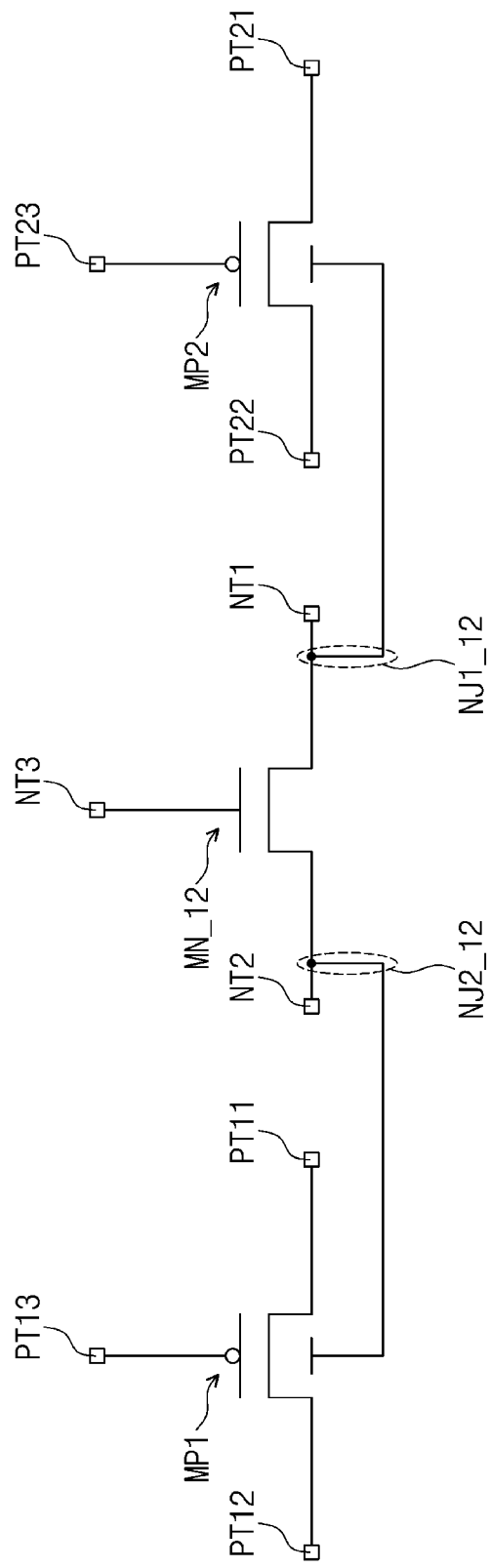
FIG. 20 is a circuit diagram of a semiconductor device of FIG. 19, according to some embodiments.

FIG. 19 is a plan view of a semiconductor device according to an embodiment of the present disclosure. FIG. 20 is a circuit diagram of a semiconductor device of FIG. 19. An embodiment of a semiconductor device 100_12 where one NMOS transistor provides a body bias to two PMOS transistors will be described with reference to FIGS. 19 and 20.

Referring to FIGS. 19 and 20, the semiconductor device 100_12 may include first and second PMOS transistors MP1 and MP2 and an NMOS transistor MN_12. The first PMOS transistor MP1 may include first and second P-type active regions PJ11 and PJ12 and a gate G21 formed in a first N-well area NW1. The second PMOS transistor MP2 may include first and second P-type active regions PJ21 and PJ22 and a gate G22 formed in a second N-well area NW2. The first and second PMOS transistors MP1 and MP2 are similar to the PMOS transistor MP described above except that the first and second PMOS transistors MP1 and MP2 are respectively formed in independent N-well areas NW1 and NW2, and thus, additional description will be omitted to avoid redundancy.

The NMOS transistor MN_12 may include a first N-type active region NJ1_12, a second N-type active region NJ2_12, and the gate G1. In an embodiment, at least a portion of the first N-type active region NJ1_12 may be formed in the second N-well area NW2, and the remaining portion thereof may be formed in the P-type substrate PSUB (e.g., a portion of the P-type substrate PSUB not vertically overlapping an N-well area). The first N-type active region NJ1_12 may be used as a source/drain of the NMOS transistor MN_12 and may simultaneously provide the body bias of the second PMOS transistor MP2. At least a portion of the second N-type active region NJ2_12 may be formed in the first N-well area NW1, and the remaining portion thereof may be formed in the P-type substrate PSUB (e.g., a portion of the P-type substrate PSUB not vertically overlapping an N-well area). For example, the second N-type active region NJ2_12 may be used as a drain/source of the NMOS transistor MN_12 and may simultaneously provide the body bias of the first PMOS transistor MP1.

In this case, a contact plug and a metal line for providing the body bias of the first and second PMOS transistors MP1 and MP2 may be omitted. For example, as illustrated in FIG. 20, the body bias of the first PMOS transistor MP1 may be provided directly through the second N-type active region NJ2_12 of the NMOS transistor MN_12. As a result, a separate terminal, a separate contact plug, or a separate metal line for providing the body bias of the first PMOS transistor MP1 are not required. Likewise, the body bias of the second PMOS transistor MP2 may be provided through the first N-type active region NJ1_12 of the NMOS transistor MN_12. Accordingly, a separate terminal, a separate contact plug, or a separate metal line for providing the body bias of the second PMOS transistor MP2 are not required.

Figure 21A:
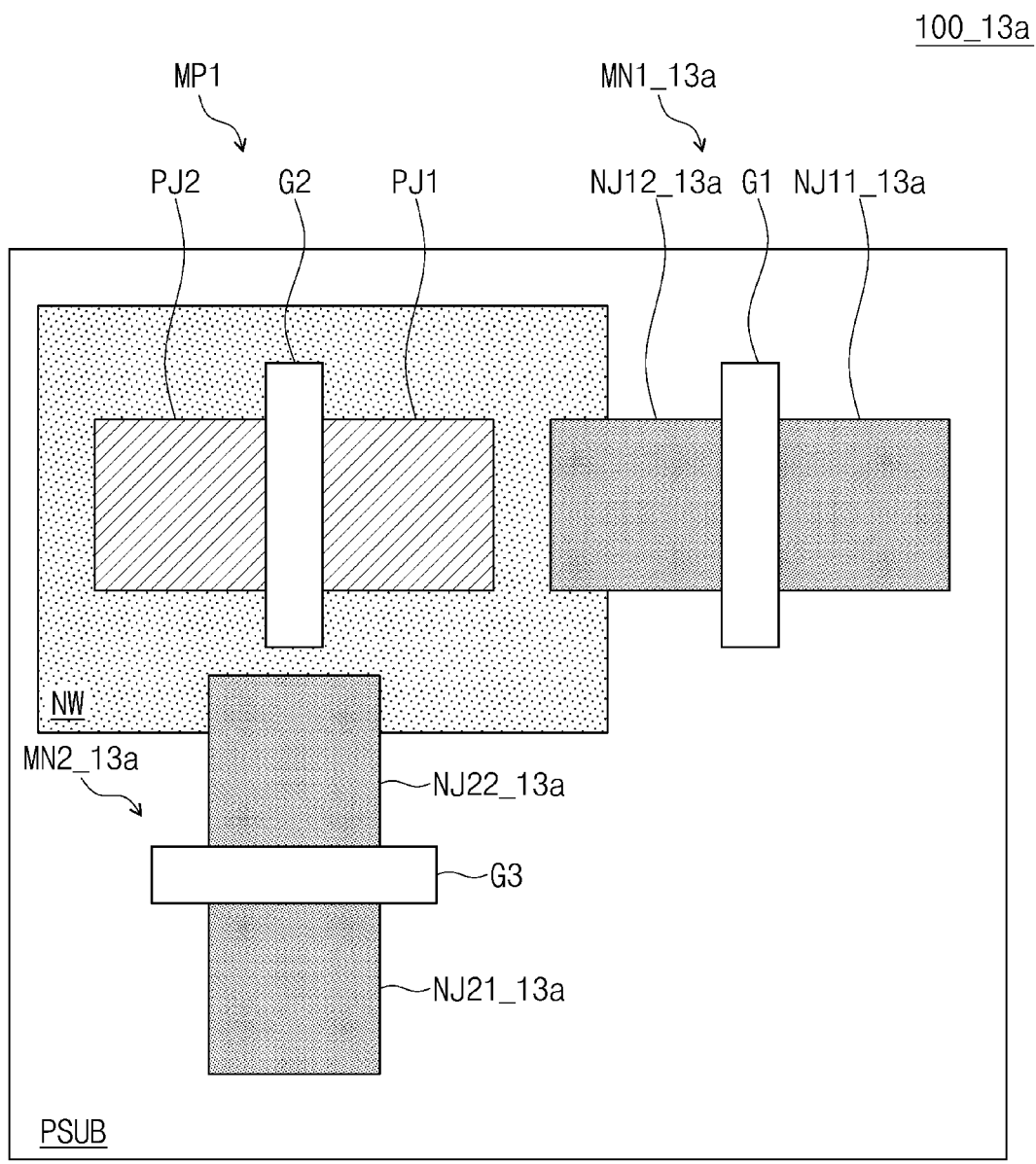
FIGS. 21A and 21B are plan views of a semiconductor device according to an embodiment of the present disclosure.
Figure 21B:
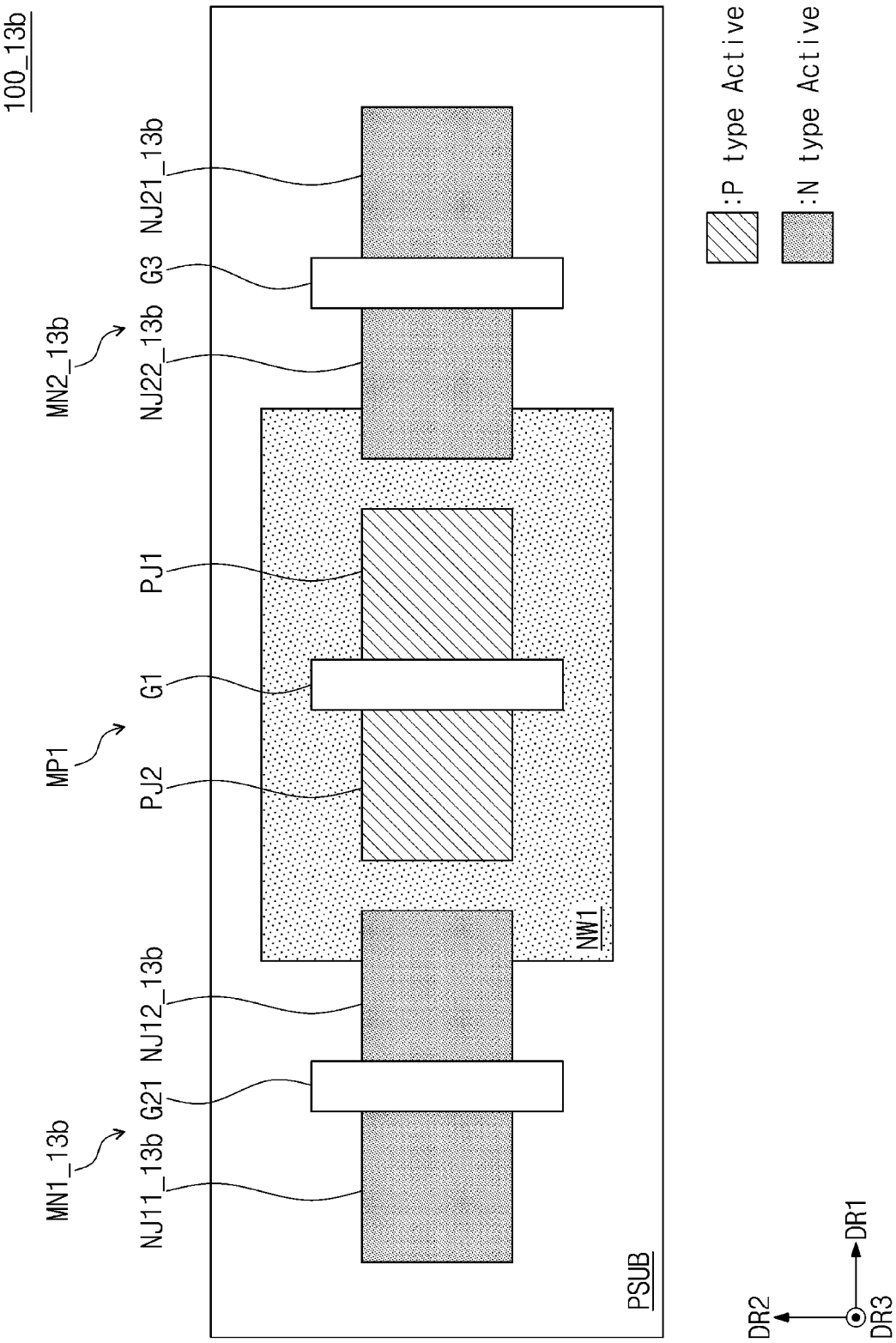
Figure 22:
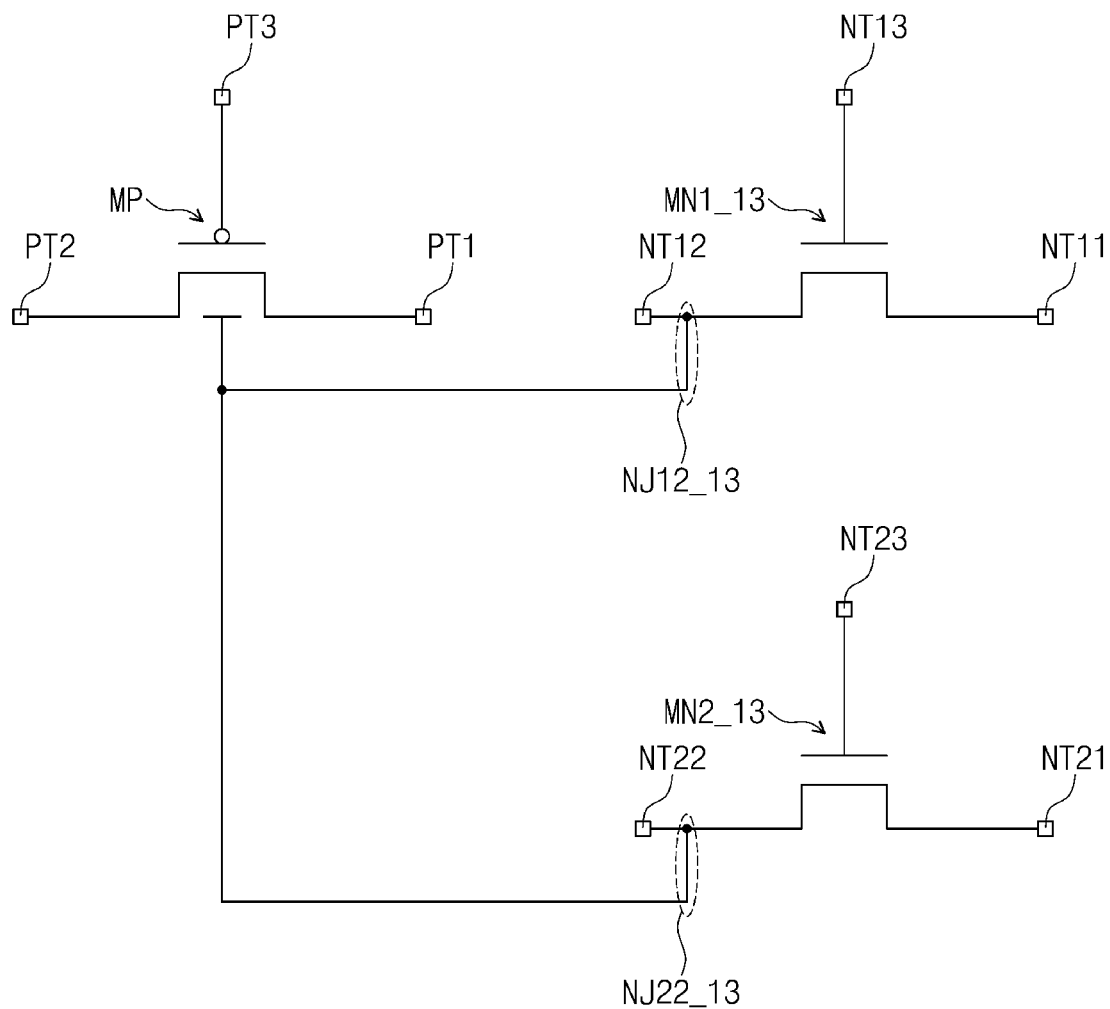
FIG. 22 is a circuit diagram illustrating semiconductor devices of FIGS. 21A and 21B, according to some embodiments.

FIGS. 21A and 21B are plan views of a semiconductor device according to an embodiment of the present disclosure. FIG. 22 is a circuit diagram illustrating semiconductor devices of FIGS. 21A and 21B. An embodiment of a semiconductor device 100_13 where two NMOS transistors MN1 and MN2 provide a body bias to one PMOS transistor MP will be described with reference to FIGS. 21A, 21B, and 22.

Referring to FIGS. 21A, 21B, and 22, the semiconductor device 100_13 may include a first PMOS transistor MP1, a first NMOS transistor MN1_13, and a second NMOS transistor MN2_13. The first PMOS transistor MP1 may include the first and second P-type active regions PJ1 and PJ2 and the gate G2 formed in the N-well area NW. The first NMOS transistor MN1_13 may include a first N-type active region NJ11_13, a second N-type active region NJ12_13, and the gate G1. The second NMOS transistor MN2_13 may include a first N-type active region NJ21_13, a second N-type active region NJ22_13, and the gate G3.

In an embodiment, as illustrated in FIG. 21A, the first PMOS transistor MP1 and the first NMOS transistor MN1_13a may be arranged along the first direction DR1, and the first PMOS transistor MP1 and the second NMOS transistor MN2_13a may be arranged along the second direction DR2. In this case, at least a partial area of the second N-type active region NJ12_13a of the first NMOS transistor MN1_13a may be formed in the N-well area NW, and at least a partial area of the second N-type active region NJ22_13a of the second NMOS transistor MN2_13a may be the formed in the N-well area NW.

Alternatively, as illustrated in FIG. 21B, the first NMOS transistor MN1_13b, the first PMOS transistor MP1, and the second NMOS transistor MN2_13b may be arranged along the first direction DR1. In this case, at least a partial area of the second N-type active region NJ12_13b of the first NMOS transistor MN1_13b may be formed in the N-well area NW, and at least a partial area of the second N-type active region NJ22_13b of the second NMOS transistor MN2_13b may be the formed in the N-well area NW.

As described above, at least a portion of each of the second N-type active regions NJ12_13 and NJ22_13 of the first and second NMOS transistors MN1_13 and MN2_13 may be formed in the N-well area NW where the first PMOS transistor MP1 is formed. As such, the body bias of the first PMOS transistor MP1 may be provided through the second N-type active regions NJ12_13 and NJ22_13 of the first and second NMOS transistors MN1_13 and MN2_13. For example, as illustrated in FIG. 22, because the body bias of the first PMOS transistor MP1 is provided through the second N-type active regions NJ12_13 and NJ22_13 of the first and second NMOS transistors MN1_13 and MN2_13, a separate contact plug or a separate metal line for the body bias of the first PMOS transistor MP1 may be omitted.

As described above, a semiconductor device according to embodiments of the present disclosure may include an NMOS transistor, and a PMOS transistor supplied with a body bias from a source/drain of the NMOS transistor. In this case, at least a portion of an N-type active region of the NMOS transistor may be formed in an N-well area where the PMOS transistor is formed. As such, because a separate contact plug and a separate metal line for providing the body bias of the PMOS transistor are omitted, the area of the semiconductor device may be reduced.

In the embodiments described above, various plan views, various layouts, and various vertical cross-sectional views of a semiconductor device according to the present disclosure are illustrated. However, the embodiments described above are simple examples for easily describing the technical idea of the invention, and the scope of the invention is not limited thereto. Even though embodiments of the present disclosure have been individually described, a plurality of embodiments may be variously combined and modified without departing from the technical idea of the invention. For example, one or more of the structures or shapes described above in connection with FIGS. 4-18B could be used for one or both of the NMOS transistors described in FIGS. 19-22.

In drawings associated with the above embodiments, the detailed description of some components or some reference signs is omitted, but this is for concise description of embodiments of the present disclosure. In addition, the omitted description of the components or the reference signs will be easily understood by one skilled in the art without departing from the technical idea of the invention.

Below, various embodiments of a semiconductor device where a body bias of an NMOS transistor is directly provided through a source/drain of a PMOS transistor will be described with reference to FIGS. 23 to 42.

Figure 23:
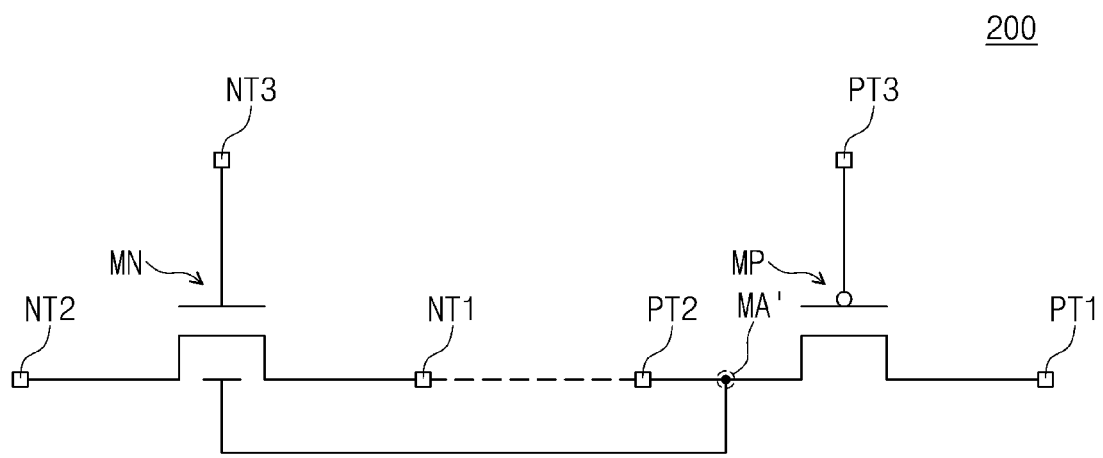
FIG. 23 is a circuit diagram of a semiconductor device according to an embodiment of the present disclosure.

FIG. 23 is a circuit diagram of a semiconductor device according to an embodiment of the present disclosure. Referring to FIG. 23, a semiconductor device 200 may include the PMOS transistor MP and the NMOS transistor MN. The NMOS transistor MN may include the first, second, and third NMOS terminals NT1, NT2, and NT3. The PMOS transistor MP may include first, second, and third PMOS terminals PT1, PT2, and PT3. A source area or a drain area of the PMOS transistor MP may include a merged area MA', and the body bias of the NMOS transistor MN may be provided through the merged area MA'. Accordingly, a separate contact plug and a separate metal line for the body bias of the NMOS transistor MN may be omitted.

The embodiment of FIG. 23 is similar to the embodiment of FIG. 3 except that types of transistors are changed, and thus, additional description will be omitted to avoid redundancy. Below, the detailed description for duplicated components or reference signs will be omitted to describe various embodiments of the present disclosure easily. For example, the embodiments described with reference to FIGS. 3 to 22 may refer to a semiconductor device providing a body bias of a PMOS transistor through an N-type active region of an NMOS transistor, embodiments of FIGS. 23 to 42 may refer to a semiconductor device providing a body bias of an NMOS transistor through a P-type active region of a PMOS transistor. That is, the technical idea and structures of semiconductor devices of FIGS. 23 to 42 may be similar to those of the semiconductor devices of FIGS. 3 to 22 except that types of transistors are changed, and thus, additional description will be omitted to avoid redundancy. However, the detailed contents about omitted components and omitted reference signs may be understood easily by one skilled in the art.

Figure 24:
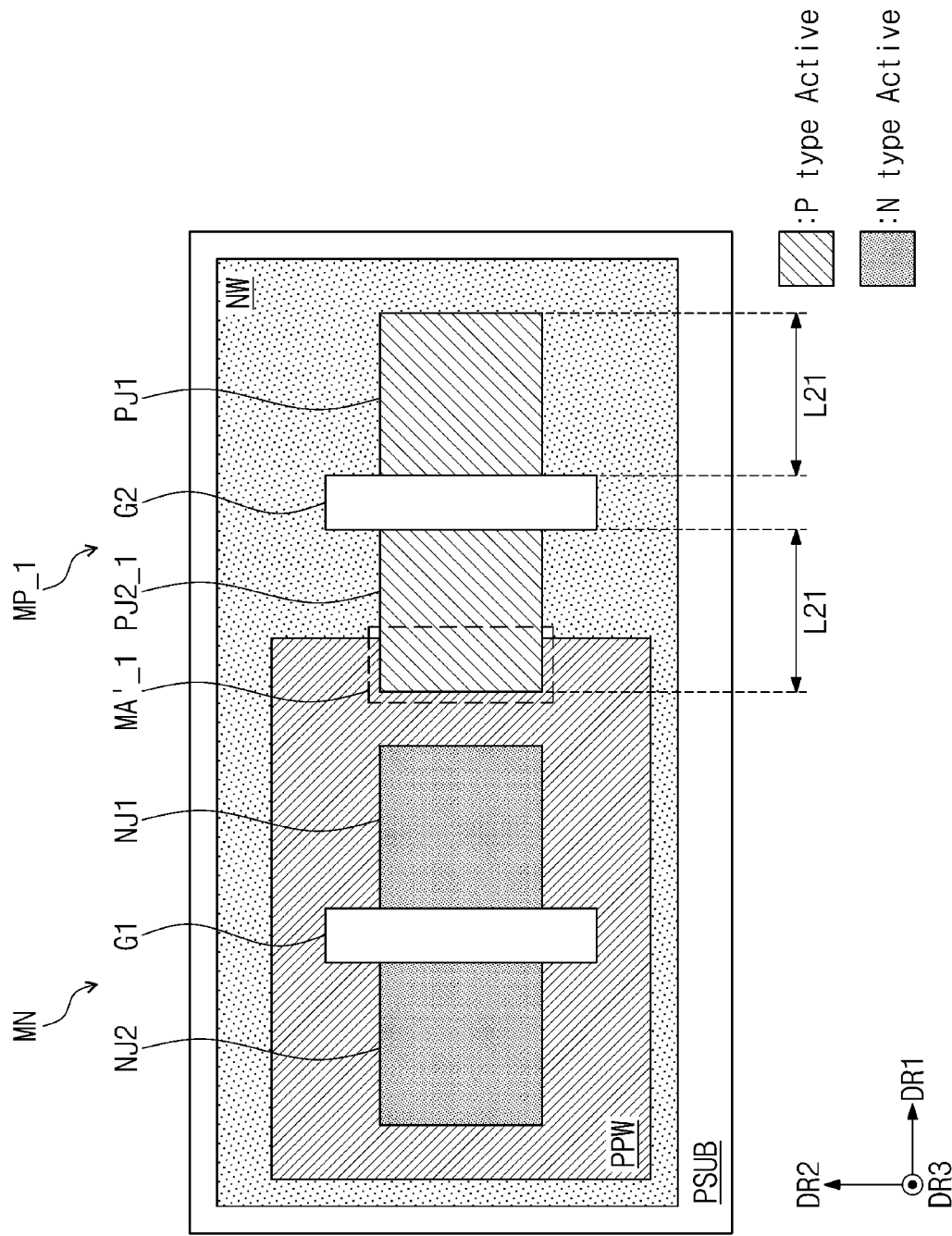
FIG. 24 is a plan view of a semiconductor device of FIG. 23, according to some embodiments.

FIG. 24 is a plan view of a semiconductor device of FIG. 23. FIGS. 25A to 25D are vertical cross-sectional views of a semiconductor device of FIG. 24. Referring to FIGS. 24 to 25D, a semiconductor device 200_1 may include the NMOS transistor MN and a PMOS transistor MP_1. The NMOS transistor MN may be formed in a pocket P-well area PPW, and the PMOS transistor MP_1 may be formed in the N-well area NW.

The NMOS transistor MN may include the first N-type active region NJ1, the second N-type active region NJ2, and the first gate G1. The first and second N-type active regions NJ1 and NJ2 may be formed on the pocket P-well area PPW (e.g., directly on the pocket P-well area PPW). The oxide layer OX may be formed on the P-type substrate PSUB, and the first gate G1 may be formed on the oxide layer OX. The first N-type active region NJ1 may be connected to the first NMOS terminal NT1, the second N-type active region NJ2 may be connected to the second NMOS terminal NT2, and the first gate G1 may be connected to the third NMOS terminal NT3. In an embodiment, the pocket P-well area PPW may be formed in the N-well area NW, and the N-well area NW may be formed in the P-type substrate PSUB.

The PMOS transistor MP_1 may include the first P-type active region PJ1, a second P-type active region PJ2_1 and the second gate G2. The first and second P-type active regions PJ1 and PJ2_1 may be formed in the N-well area NW (e.g., directly on the N-well area NW). The second gate G2 may be formed on the oxide layer OX. The first P-type active region PJ1 may be connected to the first PMOS terminal PT1, the second P-type active region PJ2_1 may be connected to the second PMOS terminal PT2, and the second gate G2 may be connected to the third PMOS terminal PT3.

In an embodiment, the second P-type active region PJ2_1 may be formed in both the N-well area NW and the pocket P-well area PPW. For example, a portion of the second P-type active region PJ2_1 may be formed in the pocket P-well area PPW, and the remaining portion thereof may be formed in the N-well area NW horizontally adjacent to the pocket P-well area PPW. The portion of the second P-type active region PJ2_1, which is formed in the pocket P-well area PPW, may be a merged area MA'_1. A bias of the pocket P-well area PPW (i.e., a body bias of the NMOS transistor MN) may be provided through the merged area MA'_1. Accordingly, a separate terminal, a separate contact plug, and a separate metal line for providing the body bias of the NMOS transistor MN may be omitted.

In an embodiment, as illustrated in FIG. 24, each of the first and second P-type active regions PJ1 and PJ2_1 may have a length of L21 in the first direction DR1, and may have the same shape or the same form when viewed from above a plane defined by the first and second directions DR1 and DR2 (i.e., a plane parallel to the P-type substrate PSUB). On the other hand, the second P-type active region PJ2_1 may have various shapes when viewed from a vertical cross-section defined by the first and third directions DR1 and DR3.

Figure 25A:
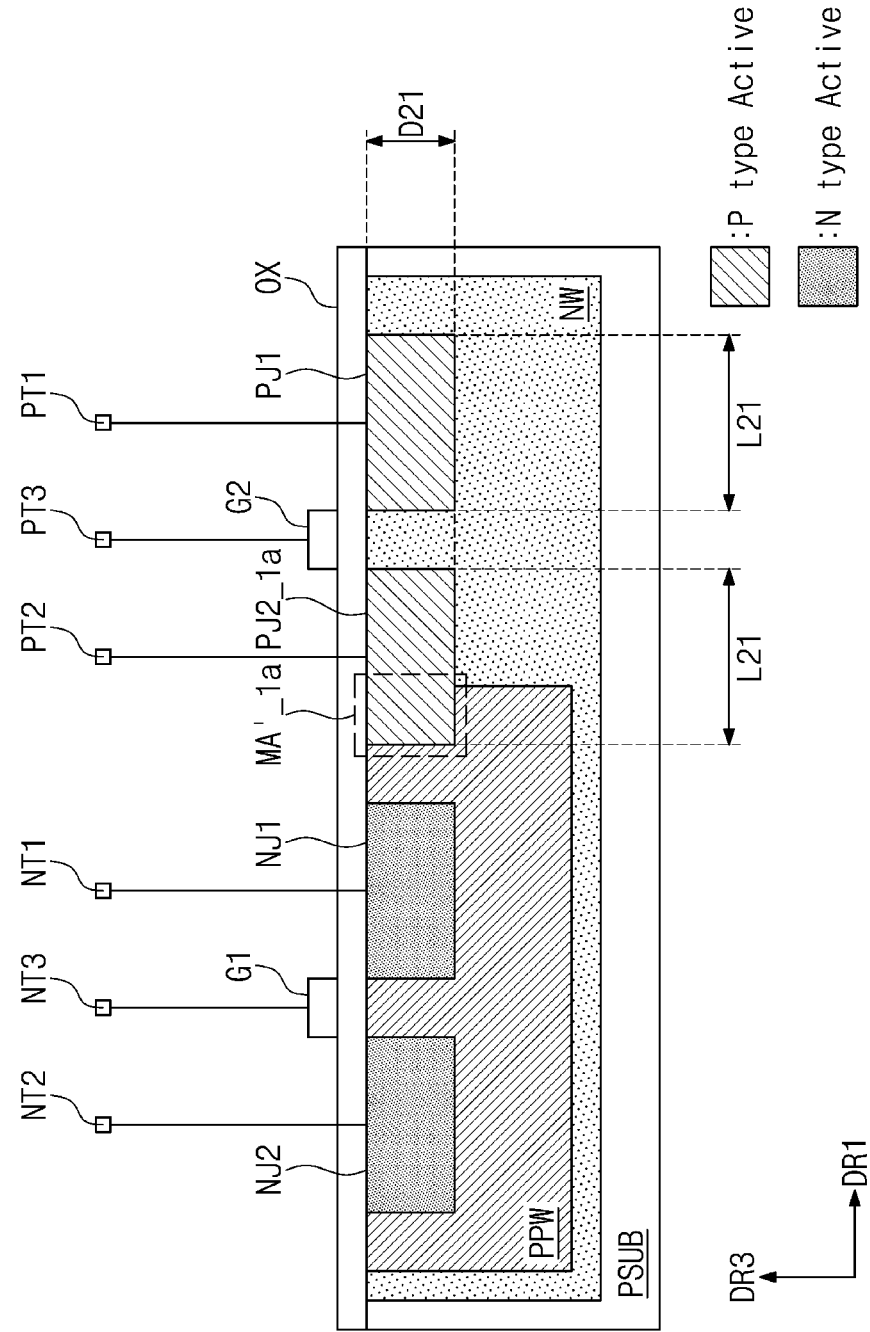
FIGS. 25A to 25D are vertical cross-sectional views of a semiconductor device of FIG. 24, according to some embodiments.

For example, as illustrated in FIG. 25A, when viewed from a vertical cross-section defined by the first and third directions DR1 and DR3, each of the first and second P-type active regions PJ1 and PJ2_1 may have a length of L21 in the first direction DR1 and may have a depth of D21 in the third direction DR3. For example, the first and second P-type active regions PJ1 and PJ2_1 may have the same shape when viewed from a vertical cross-section defined by the first and third directions DR1 and DR3.

Figure 25B:
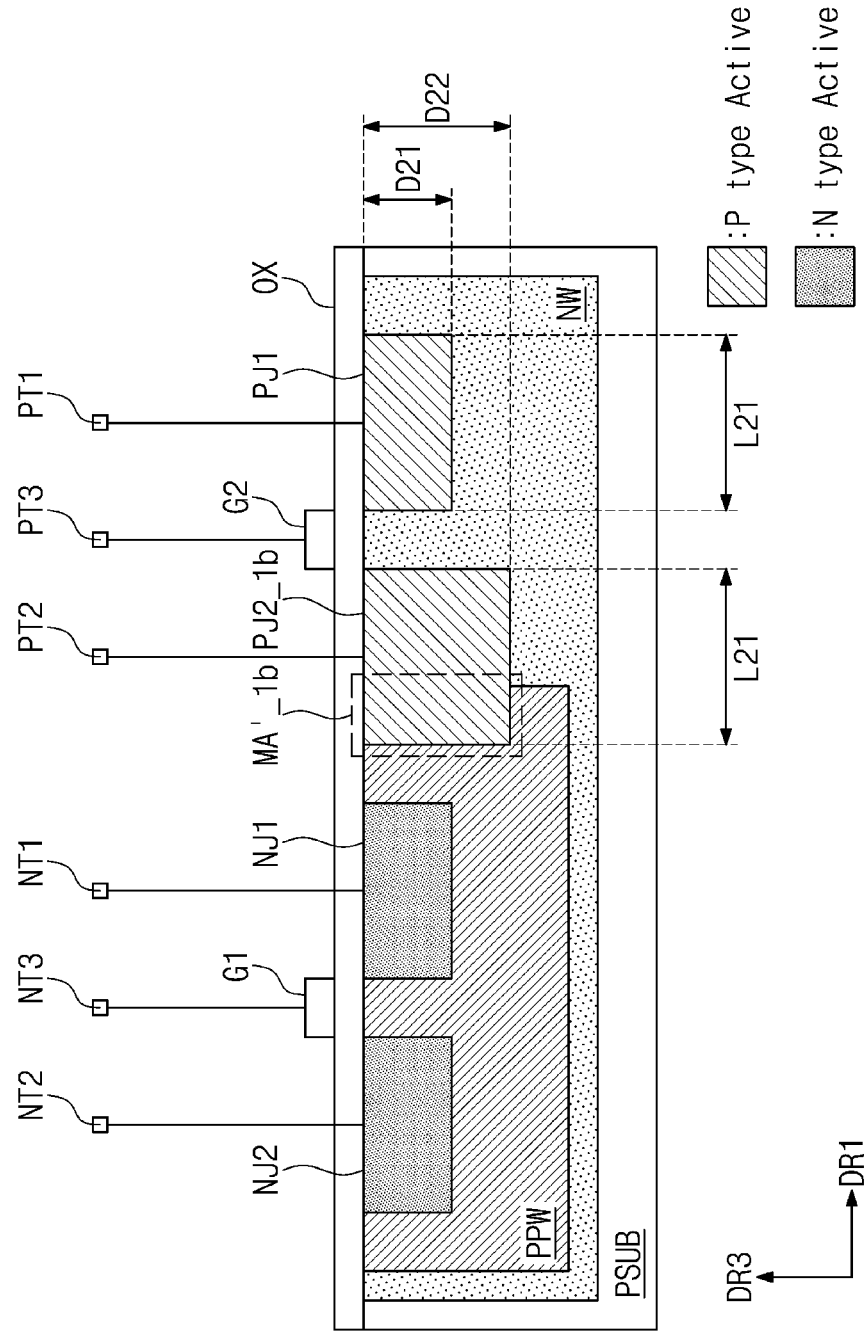

Alternatively, as illustrated in FIG. 25B, when viewed from a vertical cross-section defined by the first and third directions DR1 and DR3, each of the first P-type active region PJ1 and a second P-type active region PJ2_1b may have a length of L21 in the first direction DR1, the first P-type active region PJ1 may have a depth of D21 in the third direction DR3, and the second P-type active region PJ2_1b may have a depth of D22 in the third direction DR3. D22 may be greater than D21. Although not illustrated in drawings, a depth of the first P-type active region PJ1 may be deeper than a depth of the second P-type active region PJ2_1b.

Figure 25C:
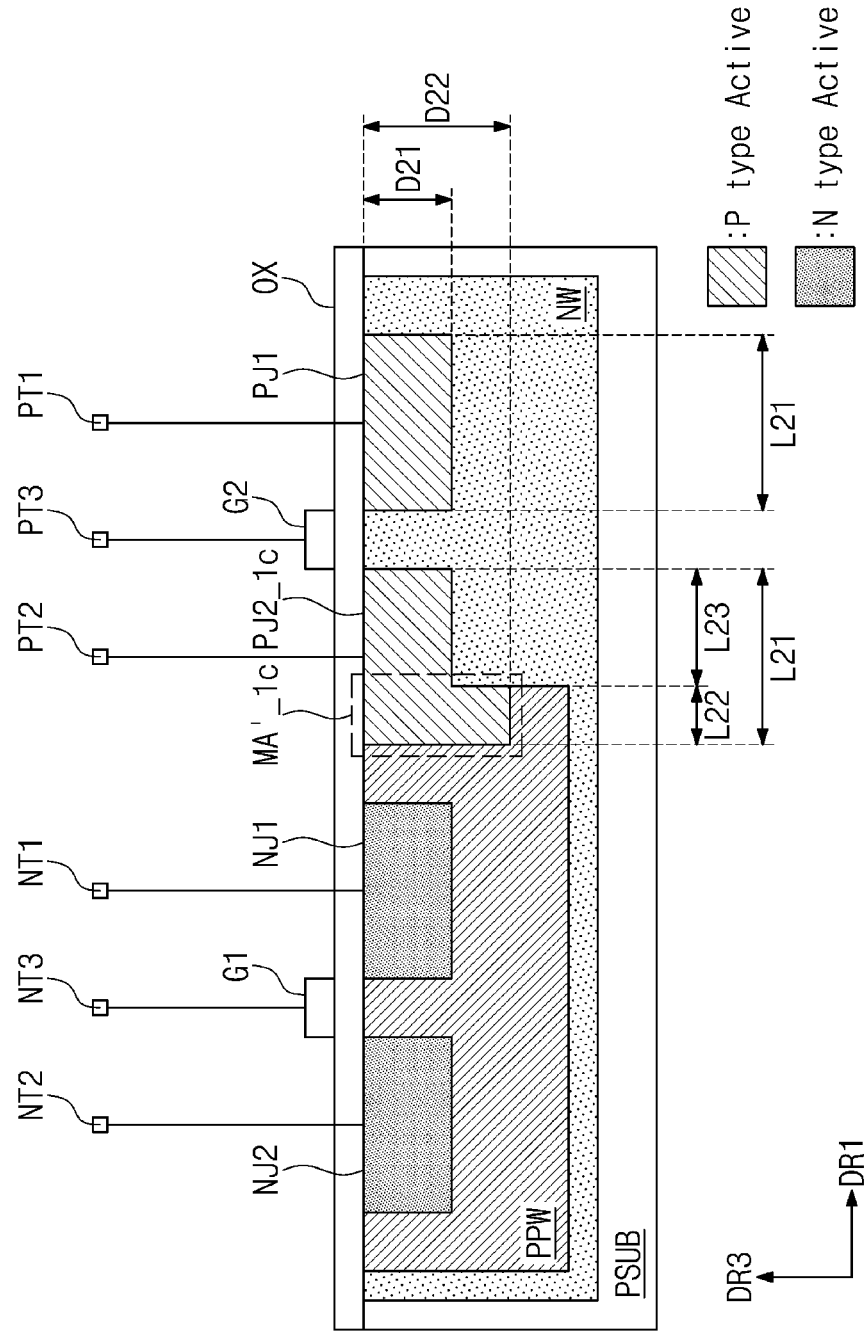
Figure 25D:
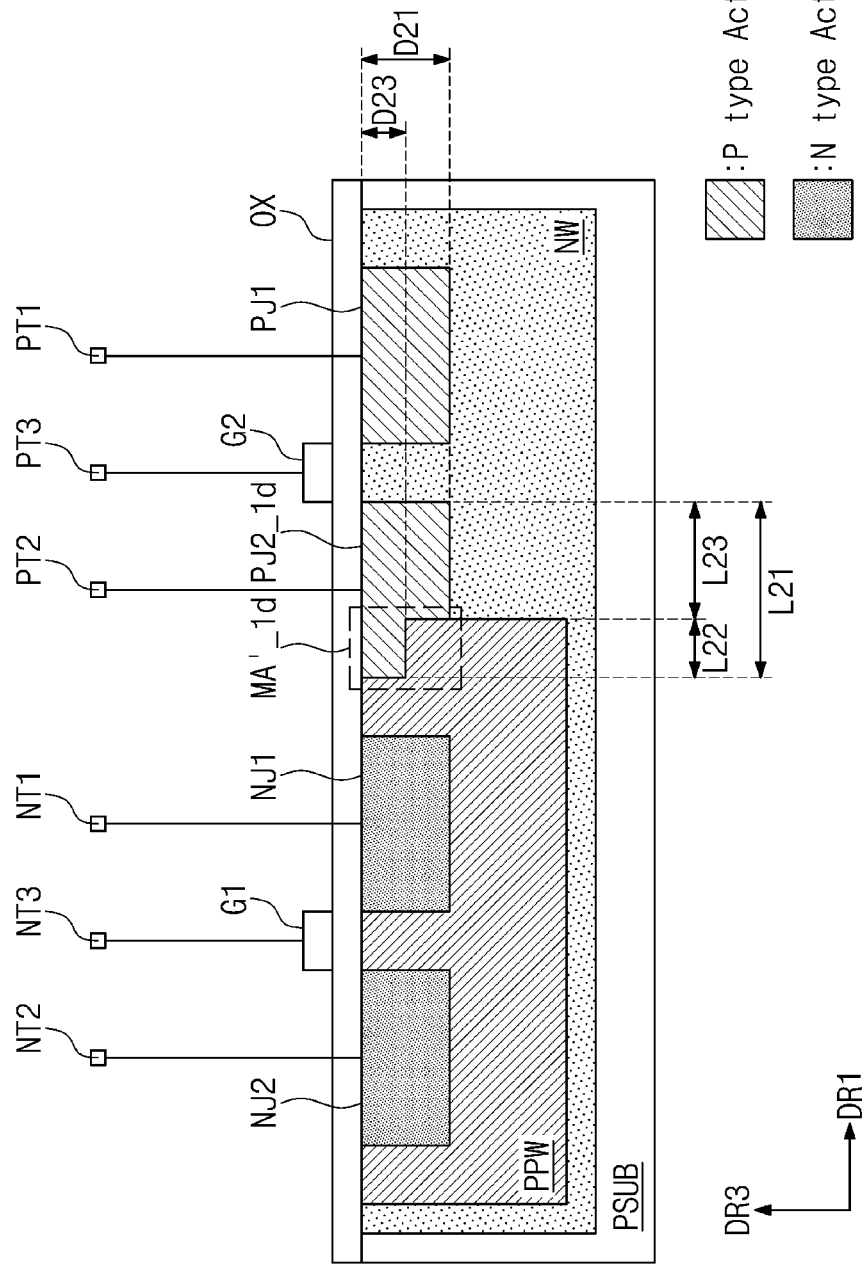

Alternatively, as illustrated in FIG. 25C, when viewed from a vertical cross-section defined by the first and third directions DR1 and DR3, the first P-type active region PJ1 and a second P-type active region PJ2_1c may have different shapes. For example, a length of the first P-type active region PJ1 in the first direction DR1 may be L21, and a depth of the first P-type active region PJ1 in the third direction DR3 may be D21.

The second P-type active region PJ2_1c may have different depths depending on locations. For example, a length of the second P-type active region PJ2_1c in the first direction DR1 may be L21. A portion of the second P-type active region PJ2_1c, which is formed in the N-well area NW (and not in the pocket P-well area PPW), may have a length of L23 in the first direction DR1 and may have a depth of D21 in the third direction DR3. A portion of the second P-type active region PJ2_1c, which is formed in the pocket P-well area PPW, (i.e., the merged area MA'_1c) may have a length of L22 in the first direction DR1 and may have a depth of D22 different from D21 in the third direction DR3. In an embodiment, D22 may be greater than D21. That is, the portion of the second P-type active region PJ2_1c, which is formed in the pocket P-well area PPW, (i.e., the merged area MA'_1c), may be formed to be deeper along the third direction DR3 than the remaining portion thereof.

In an embodiment, as illustrated in FIG. 25D, when viewed from a plane (or vertical cross-section) defined by the first and third directions DR1 and DR3, the first P-type active region PJ1 and a second P-type active region PJ2_1d may have different shapes. For example, a merged area MA'_1d of the second P-type active region PJ2_1d may have a depth of D23 in the third direction DR3, and the remaining area thereof may have a depth of D21 deeper than D23 in the third direction DR3. That is, the merged area MA'_1d of the second P-type active region PJ2_1d may be formed to be shallower than the remaining area thereof. The remaining components are similar to those described above, and thus, additional description will be omitted to avoid redundancy.

Figure 26:
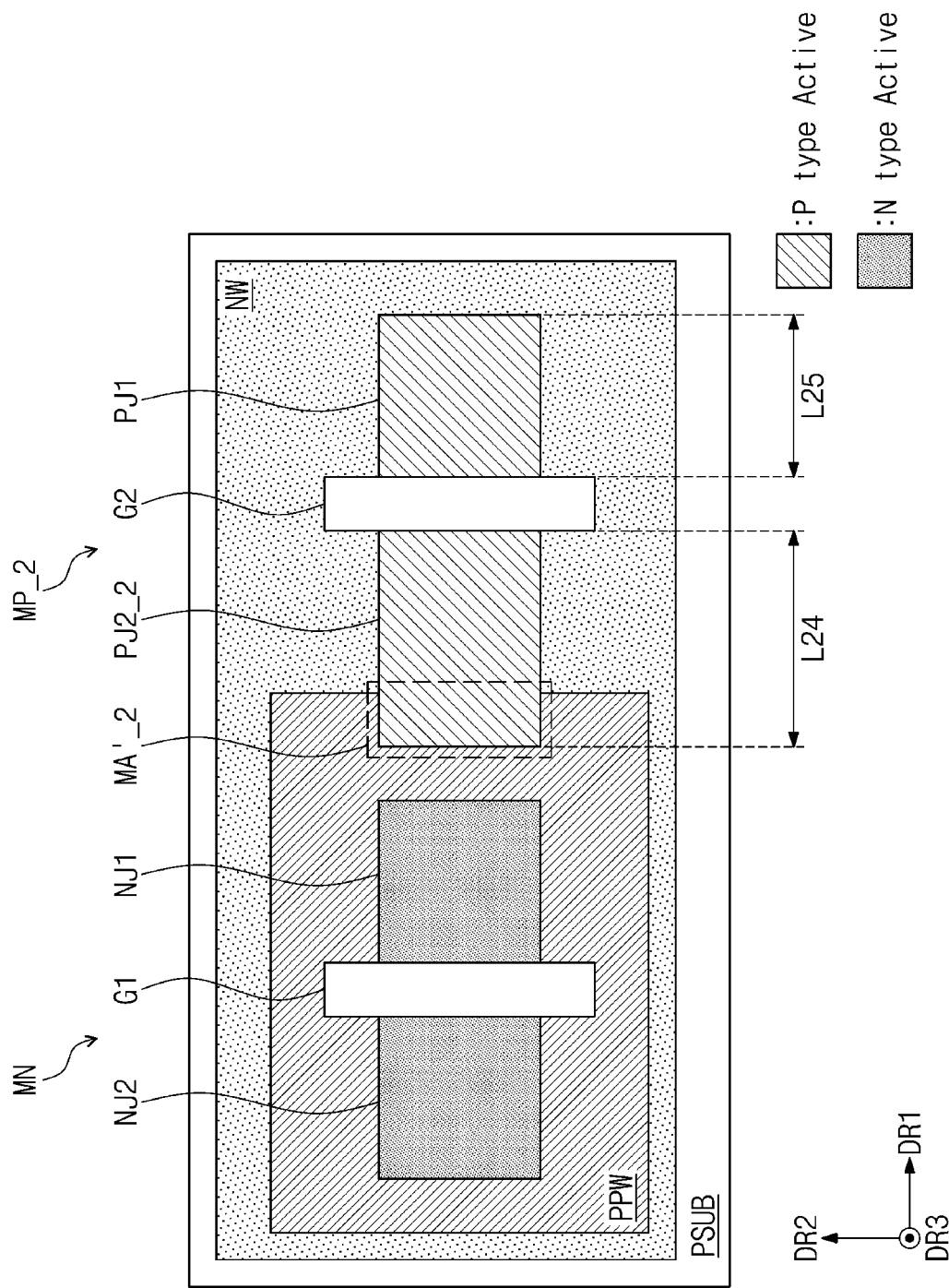
FIG. 26 is a plan view of a semiconductor device of FIG. 23, according to some embodiments.
Figure 27:
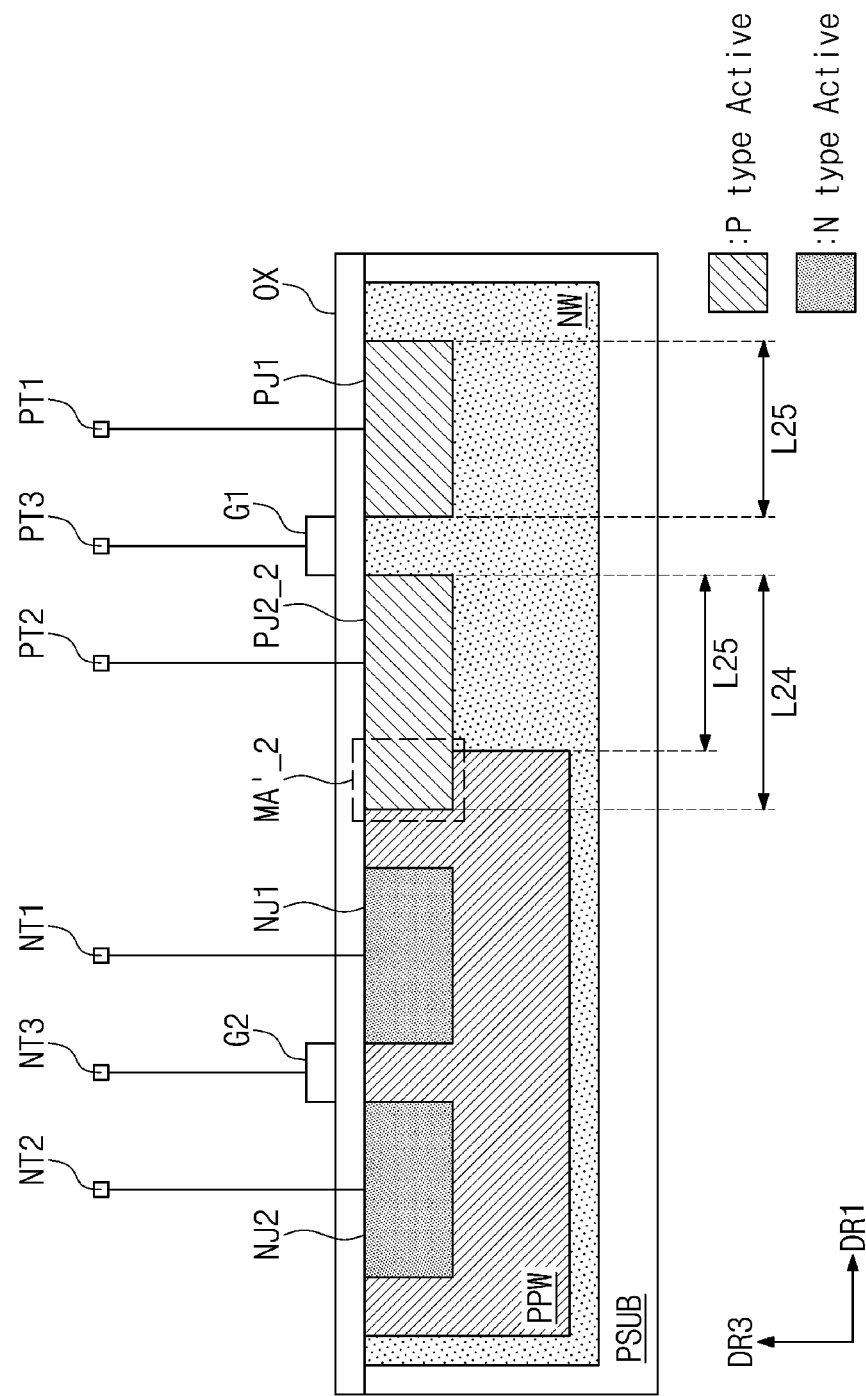
FIG. 27 is a vertical cross-sectional view of a semiconductor device of FIG. 26, according to some embodiments.

FIG. 26 is a plan view of a semiconductor device of FIG. 23. FIG. 27 is a vertical cross-sectional view of a semiconductor device of FIG. 26. Referring to FIGS. 26 and 27, a semiconductor device 200_2 may include the NMOS transistor MN and a PMOS transistor MP_2. Components of the NMOS transistor MN and the PMOS transistor MP_2 are described above, and thus, additional description will be omitted to avoid redundancy.

In an embodiment, a shape of a second P-type active region PJ2_2 may be different from a shape of the first P-type active region PJ1. For example, as illustrated in FIGS. 26 and 27, a length of the second P-type active region PJ2_2 in the first direction DR1 may be L24, and a length of the first P-type active region PJ1 in the first direction DR1 may be L25. L24 may be greater than L25.

In an embodiment, the second P-type active region PJ2_2 may include a merged area MA'_2. The merged area MA'_2 may be formed in the pocket P-well area PPW. The remaining portion of the second P-type active region PJ2_2 other than the merged area MA'_2 (i.e., a portion of the second P-type active region PJ2_2, which is formed directly in the N-well area NW) may have a length of L25 in the first direction DR1. Accordingly, an area of the second P-type active region PJ2_2, which is used as a source or a drain of the PMOS transistor MP_2 may be the same as or similar to the first P-type active region PJ1 in shape.

An embodiment where the length L24 of the second P-type active region PJ2_2 in the first direction DR1 is longer than the length L25 of the first P-type active region PJ1 in the first direction DR1 is illustrated in FIGS. 26 and 27, but the present disclosure is not limited thereto. For example, a length of the second P-type active region PJ2_2 in the first direction DR1 may be shorter than a length of the first P-type active region PJ1 in the first direction DR1.

Alternatively, a width of the second P-type active region PJ2_2 in the second direction DR2 may be different from a width of the first P-type active region PJ1 in the second direction DR2. Alternatively, a depth of the second P-type active region PJ2_2 in the third direction DR3 may be different from a depth of the first P-type active region PJ1 in the third direction DR3. Alternatively, the second P-type active region PJ2_2 may have various shapes described with reference to FIGS. 25A to 25D, when viewed from a vertical cross-section defined by the first and third directions DR1 and DR3.

Figure 28:
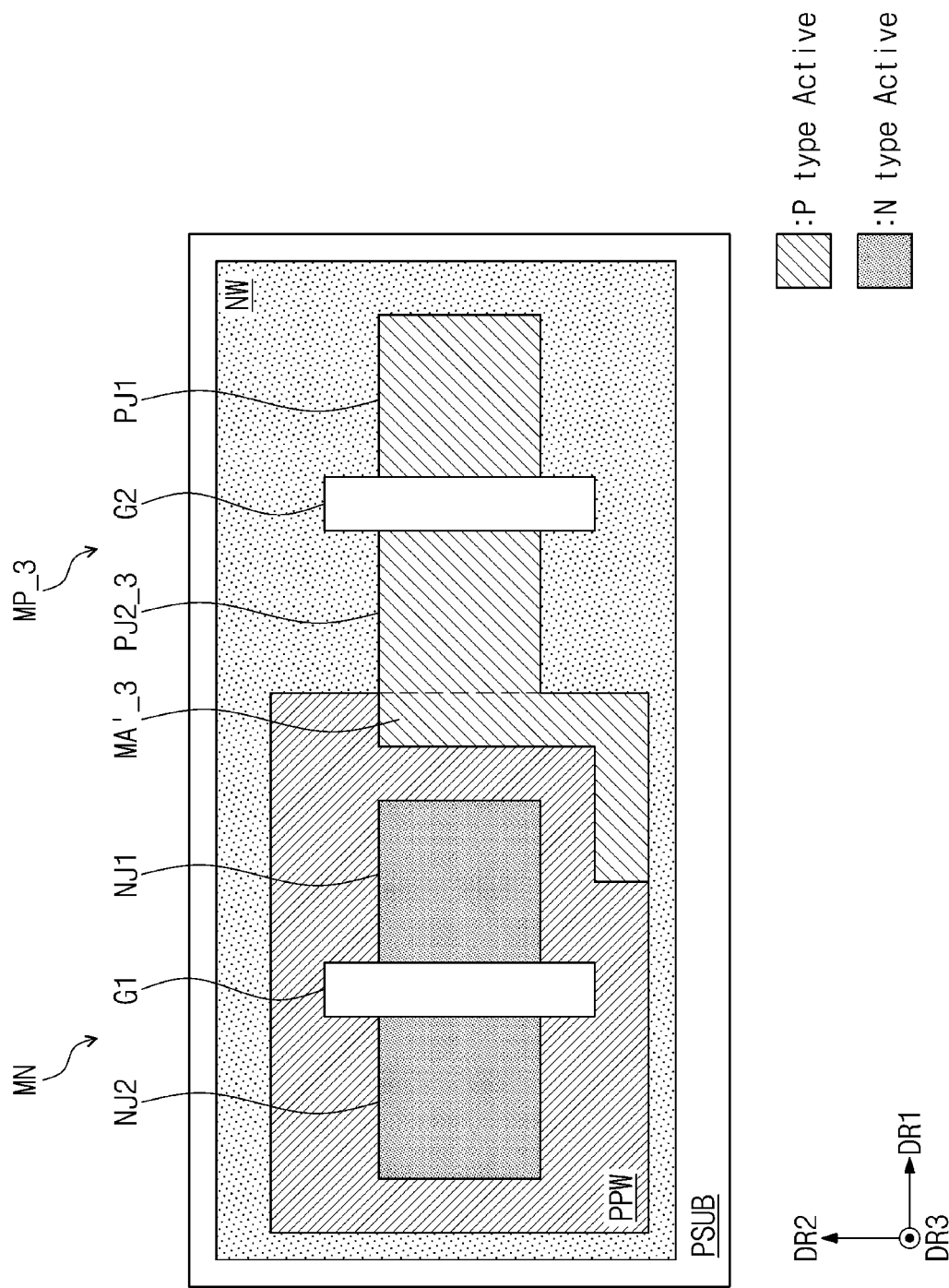
FIG. 28 is a plan view of a semiconductor device of FIG. 23, according to some embodiments.

FIG. 28 is a plan view of a semiconductor device of FIG. 23. Referring to FIG. 28, a semiconductor device 200_3 may include the NMOS transistor MN and a PMOS transistor MP_3. Components of the NMOS transistor MN and the PMOS transistor MP_3 are described above, and thus, additional description will be omitted to avoid redundancy.

In an embodiment, as illustrated in FIG. 28, a shape or form of a second P-type active region PJ2_3 of the PMOS transistor MP_3 may be different from a shape or form of the first P-type active region PJ1. For example, when viewed from above a plane defined by the first and second directions DR1 and DR2 (i.e., when viewed from above a plane parallel to the P-type substrate PSUB), the first P-type active region PJ1 may have a quadrangular shape, and the second P-type active region PJ2_3 may have a polygonal shape having more than four sides. In an embodiment, a merged area MA'_3 of the second P-type active region PJ2_3 of the PMOS transistor MP_3 may operate as a guard active region or a well guard-ring active region for the NMOS transistor MN.

In an embodiment, a shape or form of the second P-type active region PJ2_3 illustrated in FIG. 28 is an example of a portion thereof, and the present disclosure is not limited thereto. The shape or form of the second P-type active region PJ2_3 may be variously implemented. For example, the merged area MA'_3 may be placed at an edge portion of the pocket P-well area PPW or may be formed to surround the edge portion (i.e., in the shape of rectangle).

Figure 29:
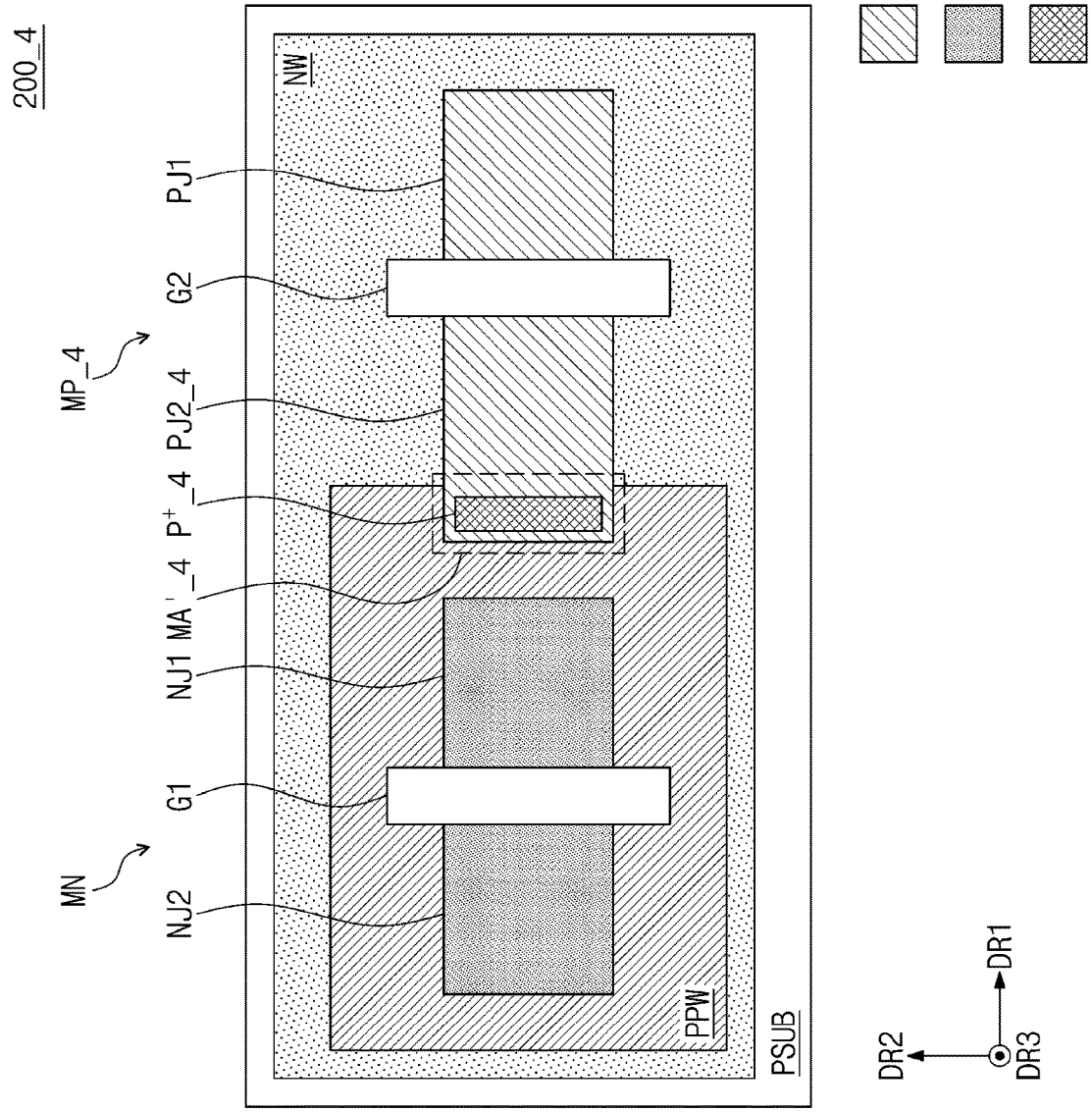
FIG. 29 is a plan view of a semiconductor device of FIG. 23, according to some embodiments.
Figure 30A:
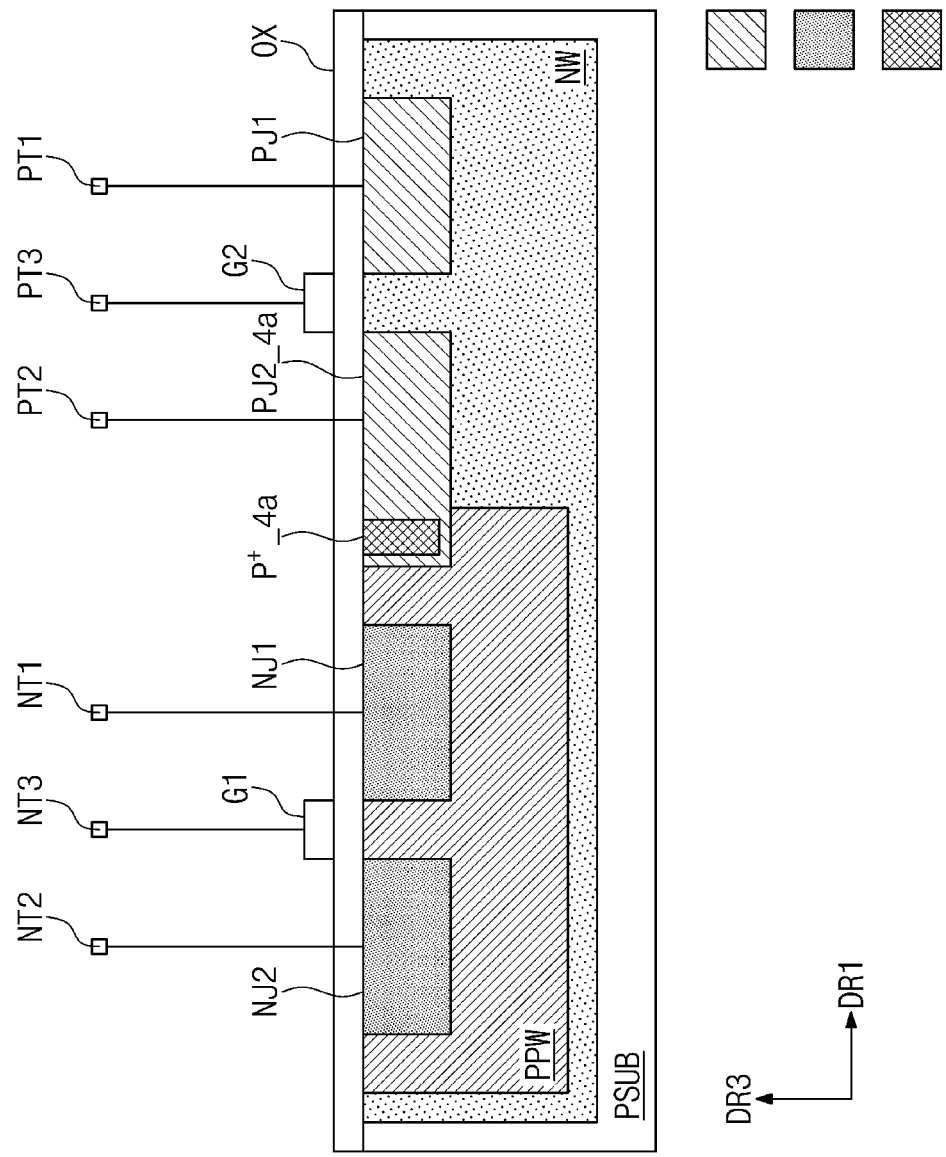
FIGS. 30A to 30C are vertical cross-sectional views of a semiconductor device of FIG. 29, according to some embodiments.
Figure 30B:
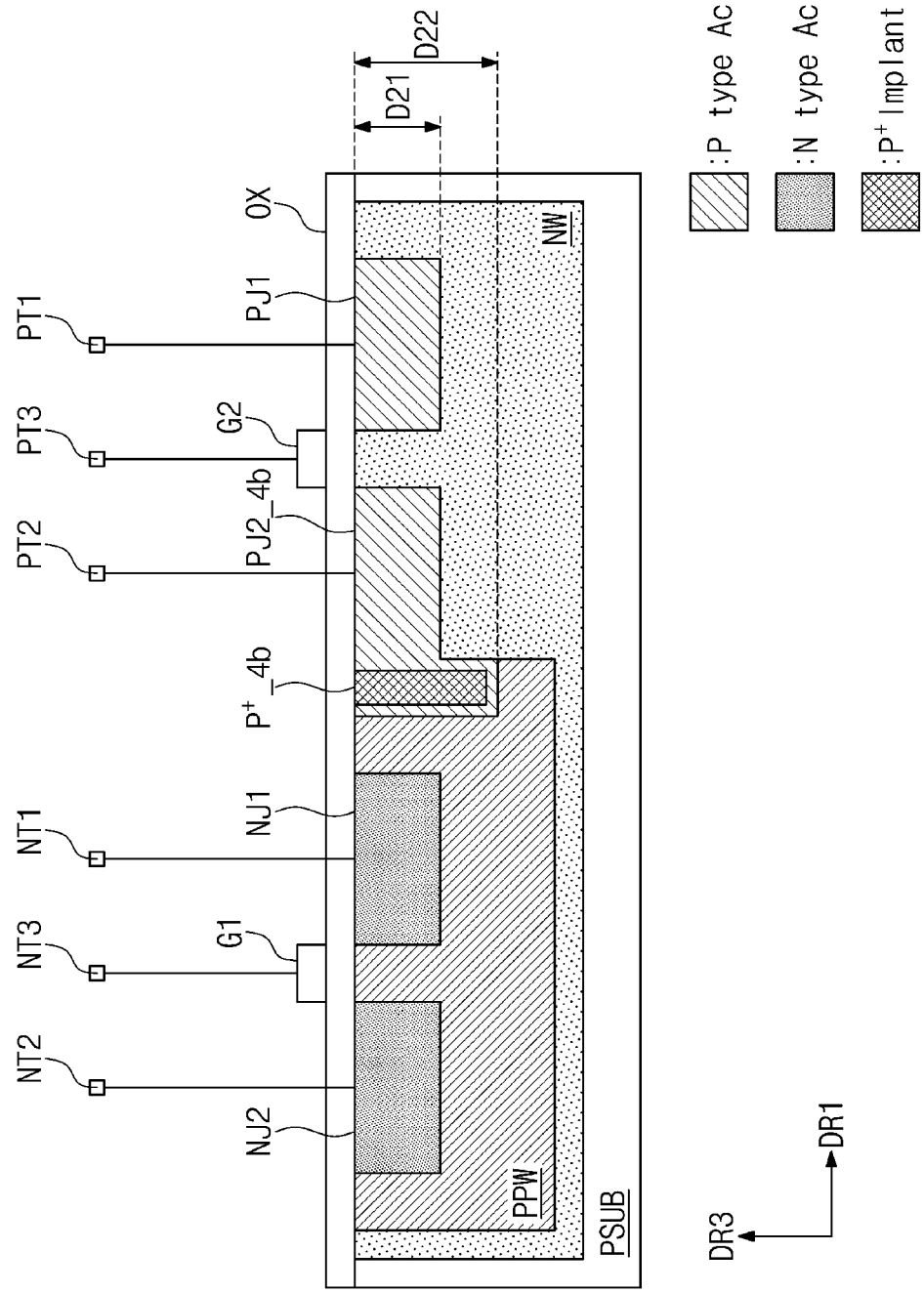
Figure 30C:
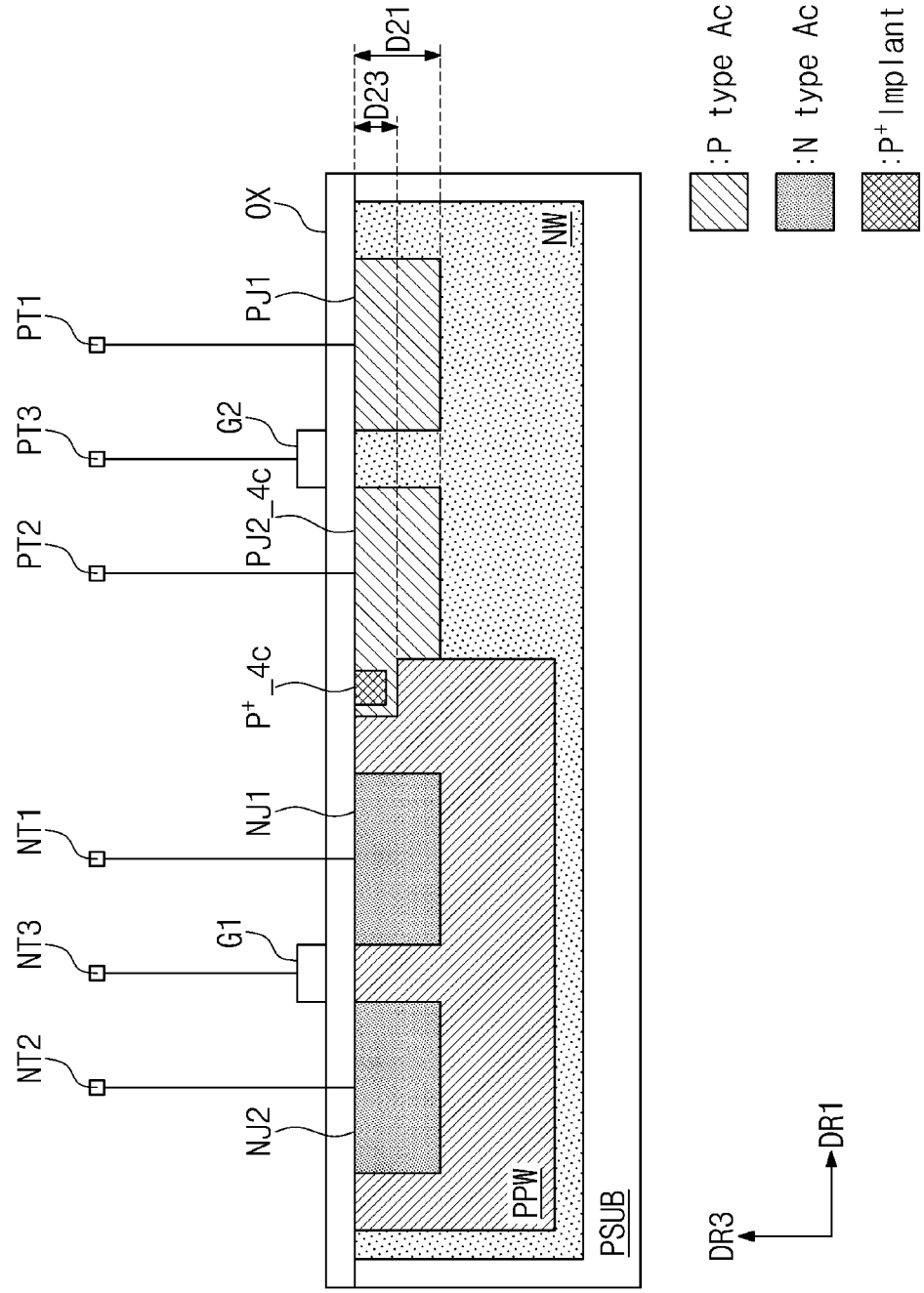

FIG. 29 is a plan view of an example semiconductor device of FIG. 23. FIGS. 30A to 30C are vertical cross-sectional views of examples of a semiconductor device of FIG. 29. Referring to FIGS. 29 to 30C, a semiconductor device 200_4 may include the NMOS transistor MN and a PMOS transistor MP_4. Components of the NMOS transistor MN and the PMOS transistor MP_4 and reference signs associated with the components are described above, and thus, additional description will be omitted to avoid redundancy.

In an embodiment, the PMOS transistor MP_4 may provide the body bias of the NMOS transistor MN. For example, as in the above description, a second P-type active region PJ2_4 of the PMOS transistor MP_4 may be formed on the N-well area NW and the pocket P-well area PPW. A portion of the second P-type active region PJ2_4, which is formed in the pocket P-well area PPW, may be a merged area MA'_4.

In an embodiment, the merged area MA'_4 may include a $P^+$ implant area $P^+\_4$. The $P^+$ implant area $P^+\_4$ may be formed in the second P-type active region PJ2_4 or the merged area MA'_4. A doping concentration of the $P^+$ implant area $P^+\_4$ may be higher than a doping concentration of the merged area MA'_4, the second P-type active region PJ2_4, or the pocket P-well area PPW. For example, A doping concentration of the $P^+$ implant area $P^+\_4$ may be higher than a doping concentration of the remainder of the merged area MA'_4 or the second P-type active region PJ2_4, which may have a higher doping concentration than the pocket P-well area PPW.

In different embodiments, a depth of the $P^+$ implant area $P^+\_4$ in the third direction DR3 may be different. For example, as shown in FIG. 30A, each of the first P-type active region PJ1 and a second P-type active region PJ2_4a may have a depth of D21 in the third direction DR3. In this case, the $P^+$ implant area $P^+\_4$ may be placed in the pocket P-well area PPW and may have a depth of D22 in the third direction DR3. In an embodiment, D21 may be greater than D22.

Alternatively, as shown in FIG. 30B, the first P-type active region PJ1 and a second P-type active region PJ2_4b may have similar shapes or forms as described with reference to FIG. 25C. In this case, a P$^+$ implant area P$^+$_4b may be placed in the pocket P-well area PPW, and a depth of the P$^+$ implant area P$^+$_4b in the third direction DR3 may be deeper than a depth of D21 and may be shallower than a depth of D22.

Alternatively, as shown in FIG. 30C, the first P-type active region PJ1 and a second P-type active region PJ2_4c may have similar shapes or forms as described with reference to FIG. 25D. In this case, a P$^+$ implant area P$^+$_4c may be placed in the pocket P-well area PPW, and a depth of the P$^+$ implant area P$^+$_4c in the third direction DR3 may be shallower than a depth of D23.

As described above, the merged area MA'_4 of the second P-type active region PJ2_4 may include the P$^+$ implant area P$^+$_4, and a depth of the P$^+$ implant area P$^+$_4 may have different values depending on depths of the merged area MA'_4. Alternatively, a depth of the P$^+$ implant area P$^+$_4 may have different values regardless of a depth of the merged area MA'_4. Alternatively, the P$^+$ implant area P$^+$_4 may have one of various shapes or forms depending on doping concentrations or shapes of the pocket P-well area PPW.

Figure 31:
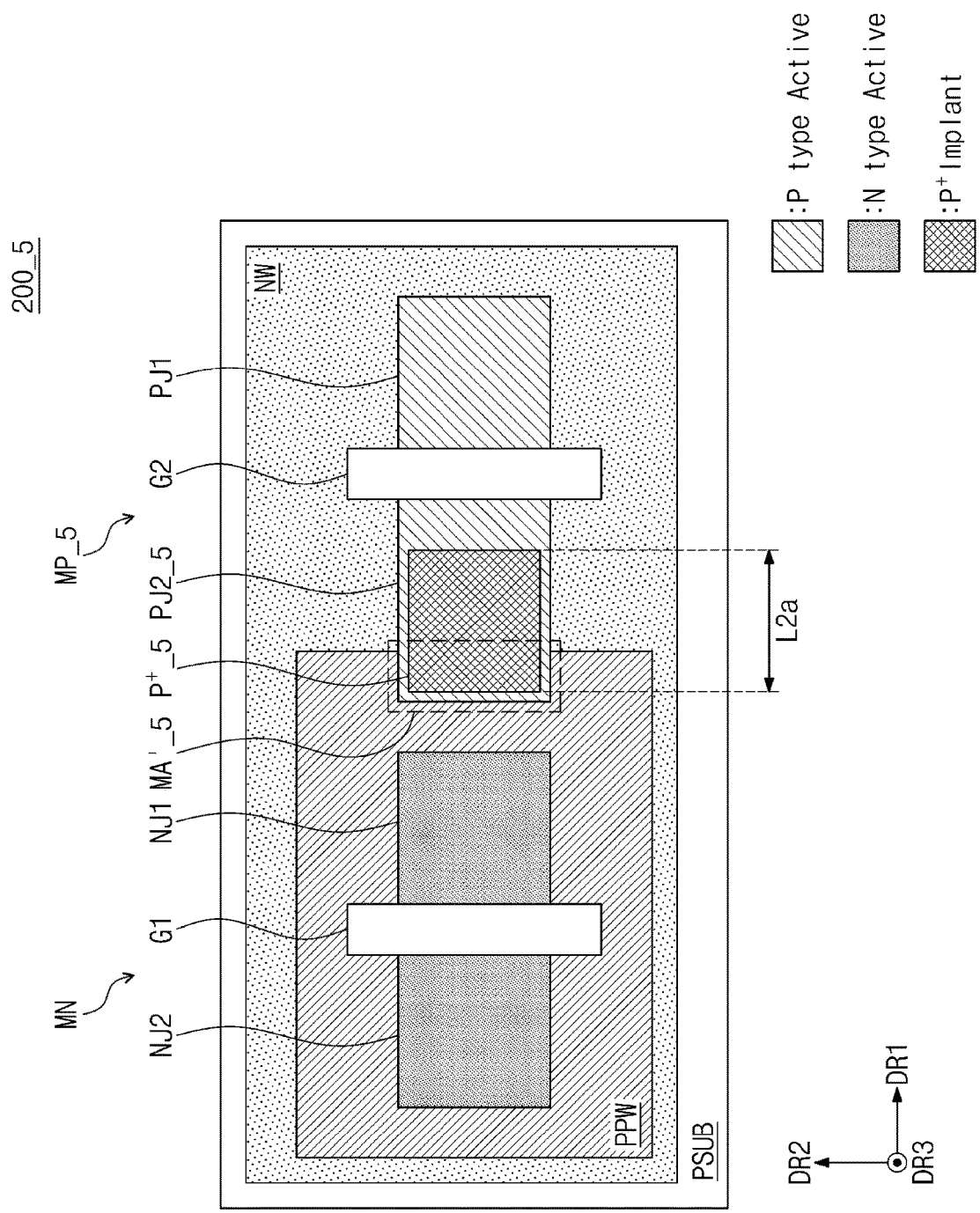
FIG. 31 is a plan view of a semiconductor device of FIG. 24, according to some embodiments.
Figure 32A:
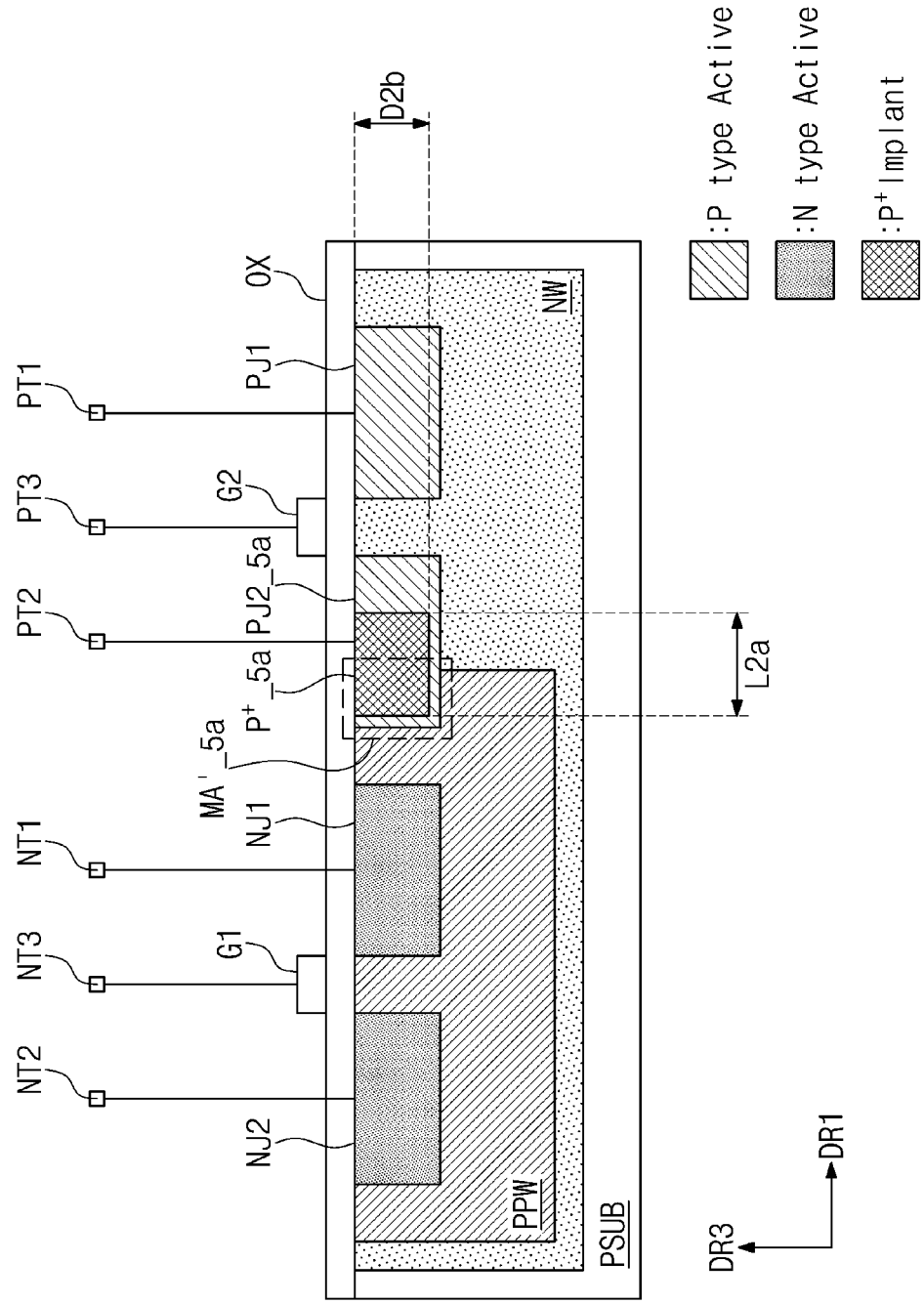
FIGS. 32A to 32E are vertical cross-sectional views of a semiconductor device of FIG. 31, according to various embodiments.

FIG. 31 is a plan view of an example semiconductor device of FIG. 24. FIGS. 32A to 32E are vertical cross-sectional views of a semiconductor device of FIG. 31, according to various embodiments. Referring to FIGS. 31 to 32E, a semiconductor device 200_5 may include the NMOS transistor MN and a PMOS transistor MP_5. Components of the NMOS transistor MN and the PMOS transistor MP_5 are described above, and thus, additional description will be omitted to avoid redundancy.

A second P-type active region PJ2_5 may include a P$^+$ implant area P$^+$_5. When viewed from above a plane defined by the first and second directions DR1 and DR2 (i.e., the P-type substrate PSUB), the P$^+$ implant area P$^+$_5 may be placed in the N-well area NW and the pocket P-well area PPW. For example, a length of the P$^+$ implant area P$^+$_5 in the first direction DR1 may be L2a; L2a may be longer than a length that a portion (i.e., a merged area MA'_5) of the second P-type active region PJ2_5 formed in the pocket P-well area PPW has in the first direction DR1. For example, when viewed from above a plane parallel to the P-type substrate PSUB, the area of the P$^+$ implant area P$^+$_5 included in the second P-type active region PJ2_5 illustrated in FIG. 31 may be larger than the area of the P$^+$ implant area P$^+$_4 included in the second P-type active region PJ2_4 illustrated in FIG. 29.

In an embodiment, the P$^+$ implant area P$^+$_5 included in the second P-type active region PJ2_5 may be formed in various shapes or forms. For example, as illustrated in FIG. 32A, a P$^+$ implant area P$^+$_5a included in a second P-type active region PJ2_5a may have a length of L2a in the first direction DR1 and may have a depth of D2b in the third direction DR3.

Figure 32B:
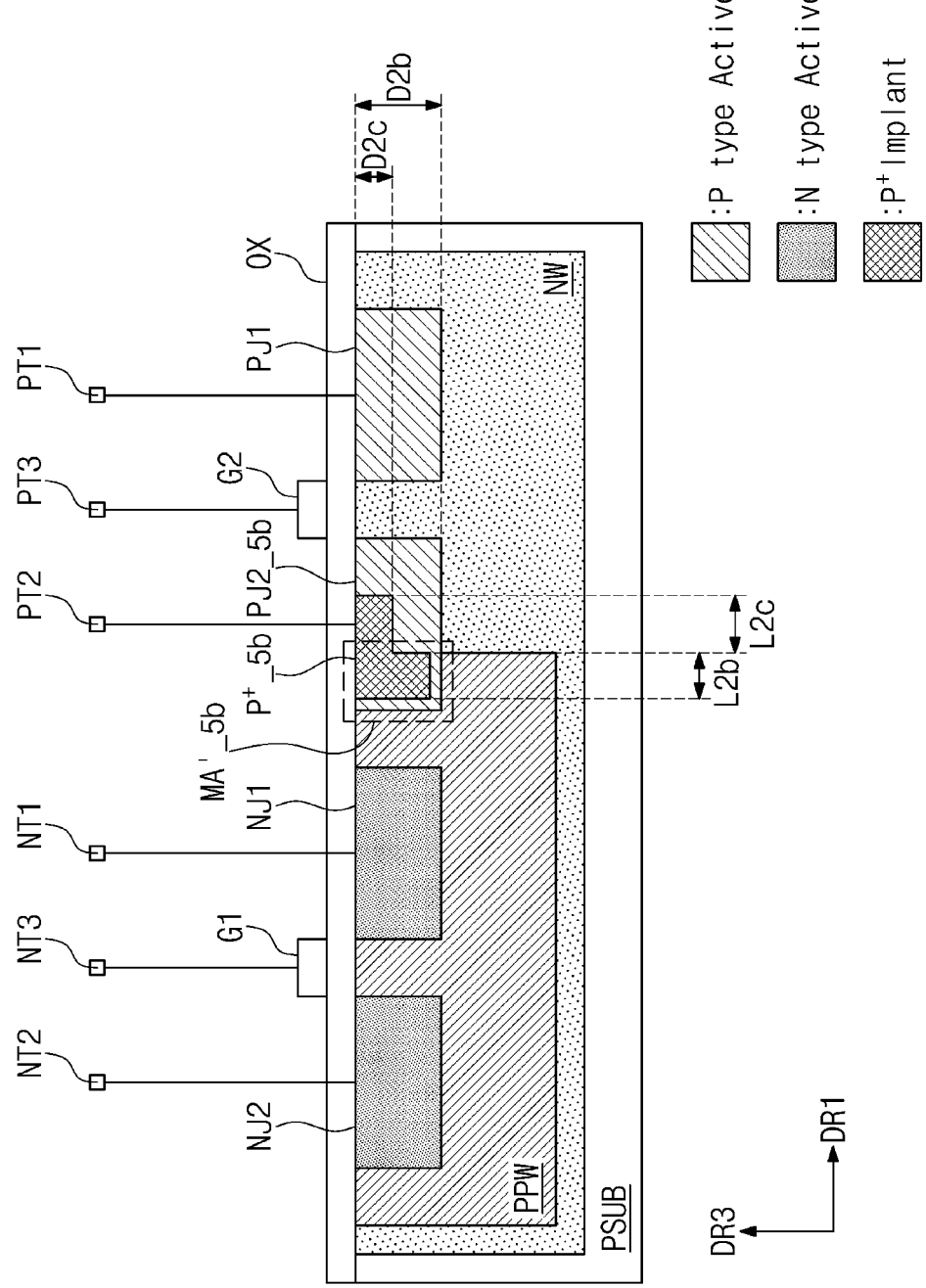

Alternatively, as illustrated in FIG. 32B, at a portion (i.e., a merged area MA'_5b) of a second P-type active region PJ2_5b formed in the pocket P-well area PPW, a P$^+$ implant area P$^+$_5b included in the second P-type active region PJ2_5b may have a length of L2b in the first direction DR1 and may have a depth of D2b in the third direction DR3; at a portion (i.e., the remaining portion thereof other than merged area MA'_5b) of the second P-type active region PJ2_5b formed in the N-well area NW, the P$^+$ implant area P$^+$_5b may have a length of L2c in the first direction DR1 and may have a depth of D2c in the third direction DR3. For example, the P$^+$ implant area P$^+$_5b included in the second P-type active region PJ2_5b may have a deeper depth in the merged area MA'_5b.

Figure 32C:
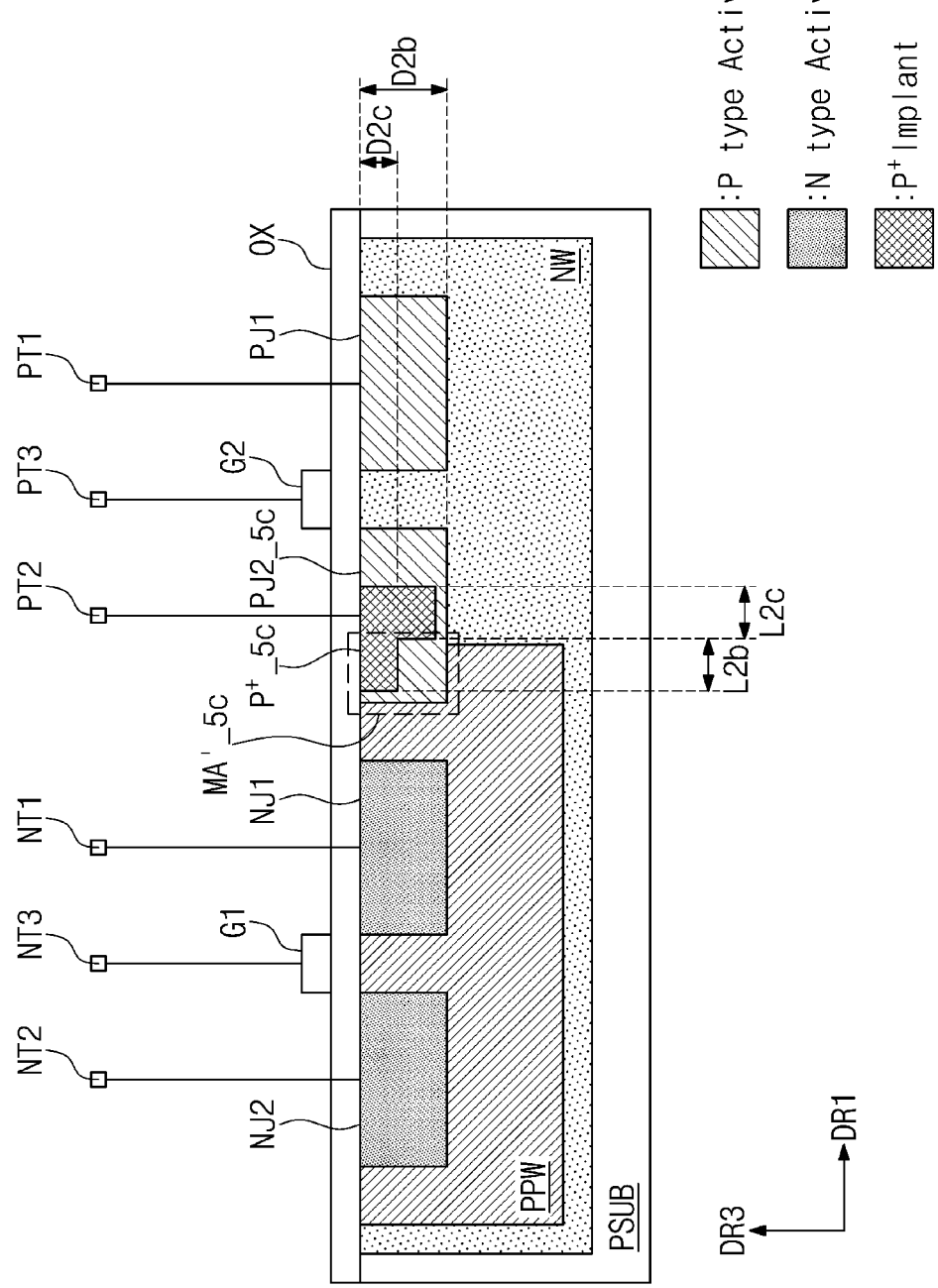

Alternatively, as illustrated in FIG. 32C, at a portion (i.e., a merged area MA'_5c) of a second P-type active region PJ2_5c formed in the pocket P-well area PPW, a P$^+$ implant area P$^+$_5c included in the second P-type active region PJ2_5c may have a length of L2b in the first direction DR1 and may have a depth of D2c in the third direction DR3; at a portion (i.e., the remaining portion thereof other than merged area MA'_5c) of the second P-type active region PJ2_5c formed in the N-well area NW, the P$^+$ implant area P$^+$_5c may have a length of L2c in the first direction DR1 and may have a depth of D2b in the third direction DR3. For example, the P$^+$ implant area P$^+$_5c included in the second P-type active region PJ2_5c may have a shallower depth in the merged area MA'_5c.

Figure 32D:
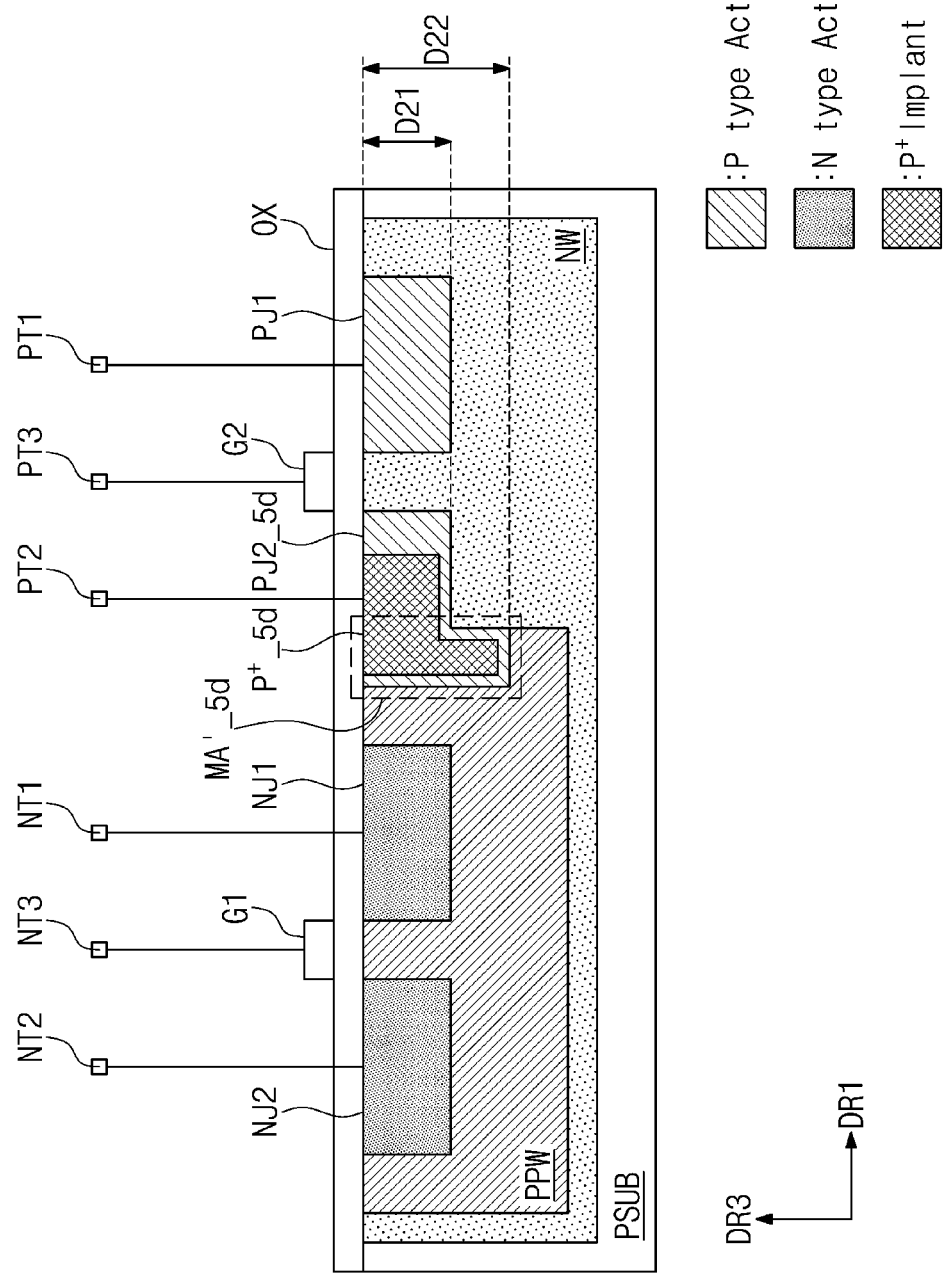
Figure 32E:
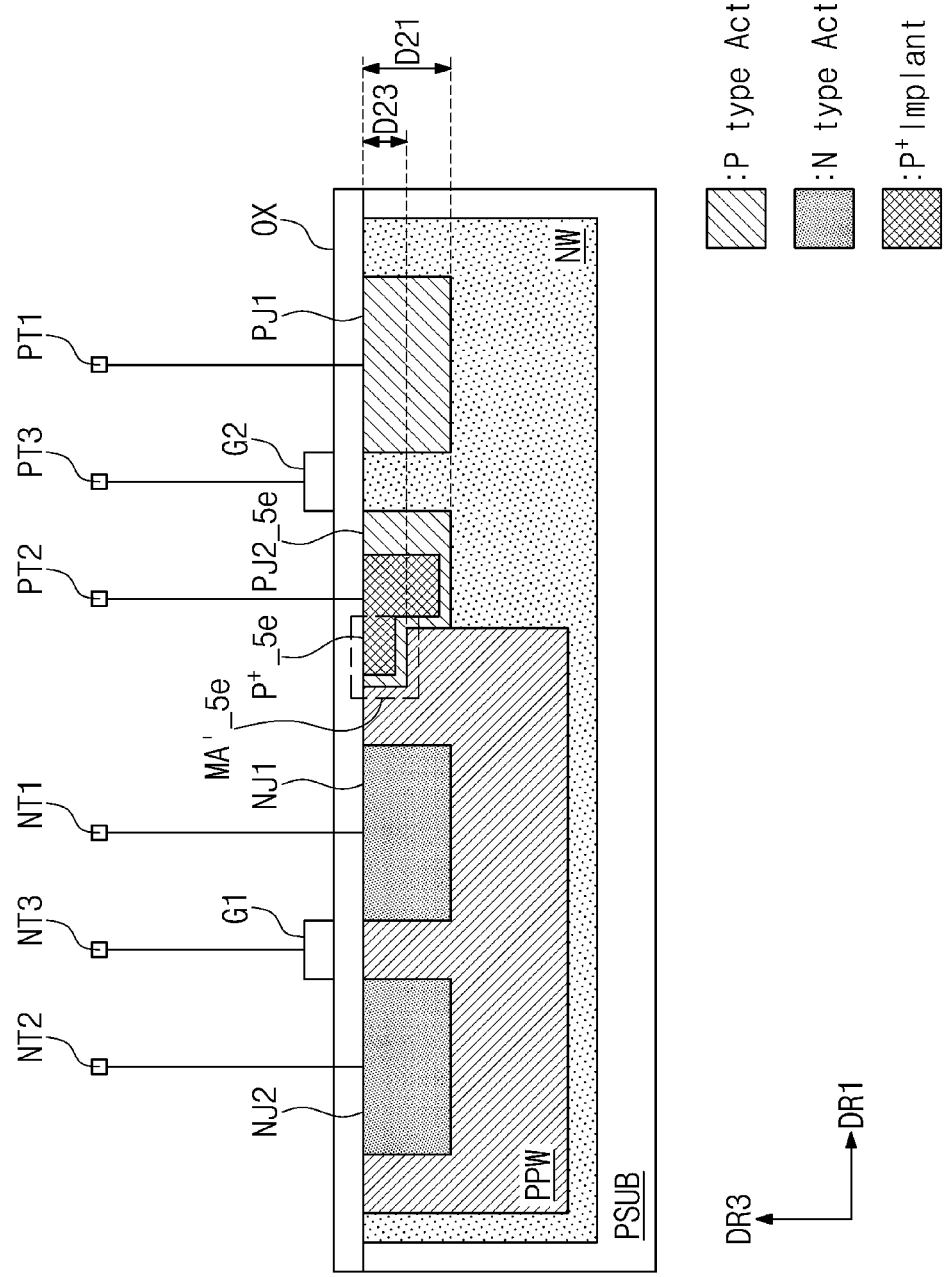

Alternatively, as illustrated in FIG. 32D, a merged area MA'_5d of a second P-type active region PJ2_5d may have a depth of D22, and the remaining area thereof may have a depth of D21. A shape or form of the second P-type active region PJ2_5d is similar to that described with reference to FIG. 25C, and thus, additional description will be omitted to avoid redundancy. In an embodiment, as illustrated in FIG. 32D, the second P-type active region PJ2_5d may include a P$^+$ implant area P$^+$_5d. The P$^+$ implant area P$^+$_5d may have a first depth in the third direction DR3 in the merged area MA'_5d and may have a second depth in the third direction DR3 in the remaining area of the second P-type active region PJ2_5d other than the merged area MA'_5d, and the first depth may be deeper than the second depth.

Alternatively, as illustrated in FIG. 32E, a second P-type active region PJ2_5e may have a depth of D23 in a merged area MA'_5e and may have a depth of D21 in the remaining area other than merged area MA'_5e. A shape or form of the second P-type active region PJ2_5e is similar to that described with reference to FIG. 25D, and thus, additional description will be omitted to avoid redundancy. In an embodiment, as illustrated in FIG. 32E, the second P-type active region PJ2_5e may include a P$^+$ implant area P$^+$_5e. The P$^+$ implant area P$^+$_5e may have a first depth in the third direction DR3 in the merged area MA'_5e and may have a second depth in the third direction DR3 in the remaining area of the second P-type active region PJ2_5e other than the merged area MA'_5e, and the first depth may be shallower than the second depth.

As described above, the second P-type active region PJ2_5 may be formed in the N-well area NW and the pocket P-well area PPW horizontally adjacent to the N-well area NW, and thus, the body bias of the NMOS transistor MN may be provided through the second P-type active region PJ2_5 used as a source/drain of the PMOS transistor MP_5. In an embodiment, the second P-type active region PJ2_5 may include the P$^+$ implant area P$^+$_5, and the P$^+$ implant area P$^+$_5 may be formed in various shapes or forms.

Figure 33:
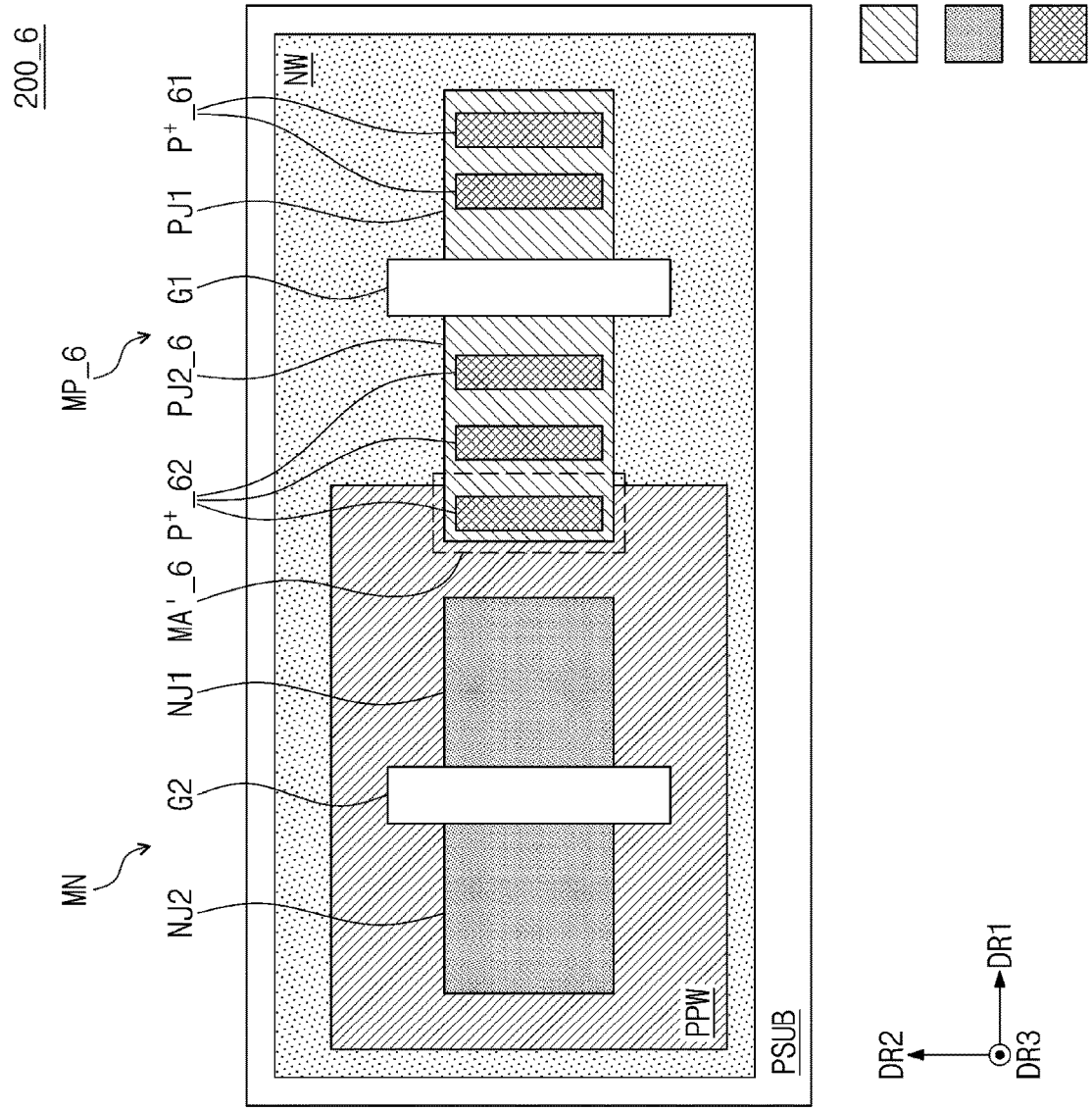
FIG. 33 is a plan view of a semiconductor device of FIG. 23, according to some embodiments.

FIG. 33 is a plan view of an example semiconductor device of FIG. 23. Referring to FIG. 33, a semiconductor device 200_6 may include a PMOS transistor MP_6 and the NMOS transistor MN. Components of the PMOS transistor MP_6 and the NMOS transistor MN are described above, and thus, additional description will be omitted to avoid redundancy.

In an embodiment, the first P-type active region PJ1 of the PMOS transistor MP_6 may include a plurality of P+ implant areas P+_61, and a second P-type active region PJ2_6 thereof may include a plurality of P+ implant areas P+_62. In an embodiment, the plurality of P+ implant areas P+_61 and P+_62 may have the same shape or form. Alternatively, at least one of the plurality of P+ implant areas P+_61 may be different from at least one of the plurality of P+ implant areas P+_62 in shape or form.

In an embodiment, the number of P+ implant areas P+_61 included in the first P-type active region PJ1 may be the same as the number of P+ implant areas P+_62 included in the second P-type active region PJ2_6. Alternatively, the number of P+ implant areas P+_61 included in the first P-type active region PJ1 may be different from the number of P+ implant areas P+_62 included in the second P-type active region PJ2_6. For example, the number of P+ implant areas P+_61 included in the first P-type active region PJ1 may be more than the number of P+ implant areas P+_62 included in the second P-type active region PJ2_6. Alternatively, the number of P+ implant areas P+_61 included in the first P-type active region PJ1 may be less than the number of P+ implant areas P+_62 included in the second P-type active region PJ2_6.

In an embodiment, when viewed from above a plane defined by the first and second directions DR1 and DR2 (i.e., a plane parallel to a top surface of the P-type substrate PSUB), at least one of the P+ implant areas P+_62 included in the second P-type active region PJ2_6 may overlap the pocket P-well area PPW. Accordingly, at least one of the P+ implant areas P+_62 included in the second P-type active region PJ2_6 may be included in a merged area MA'_6.

In an embodiment, at least one of the P+ implant areas P+_62 included in the second P-type active region PJ2_6 may have at least one of various shapes of P+ implant areas described with reference to FIGS. 29 to 32E.

Figure 34:
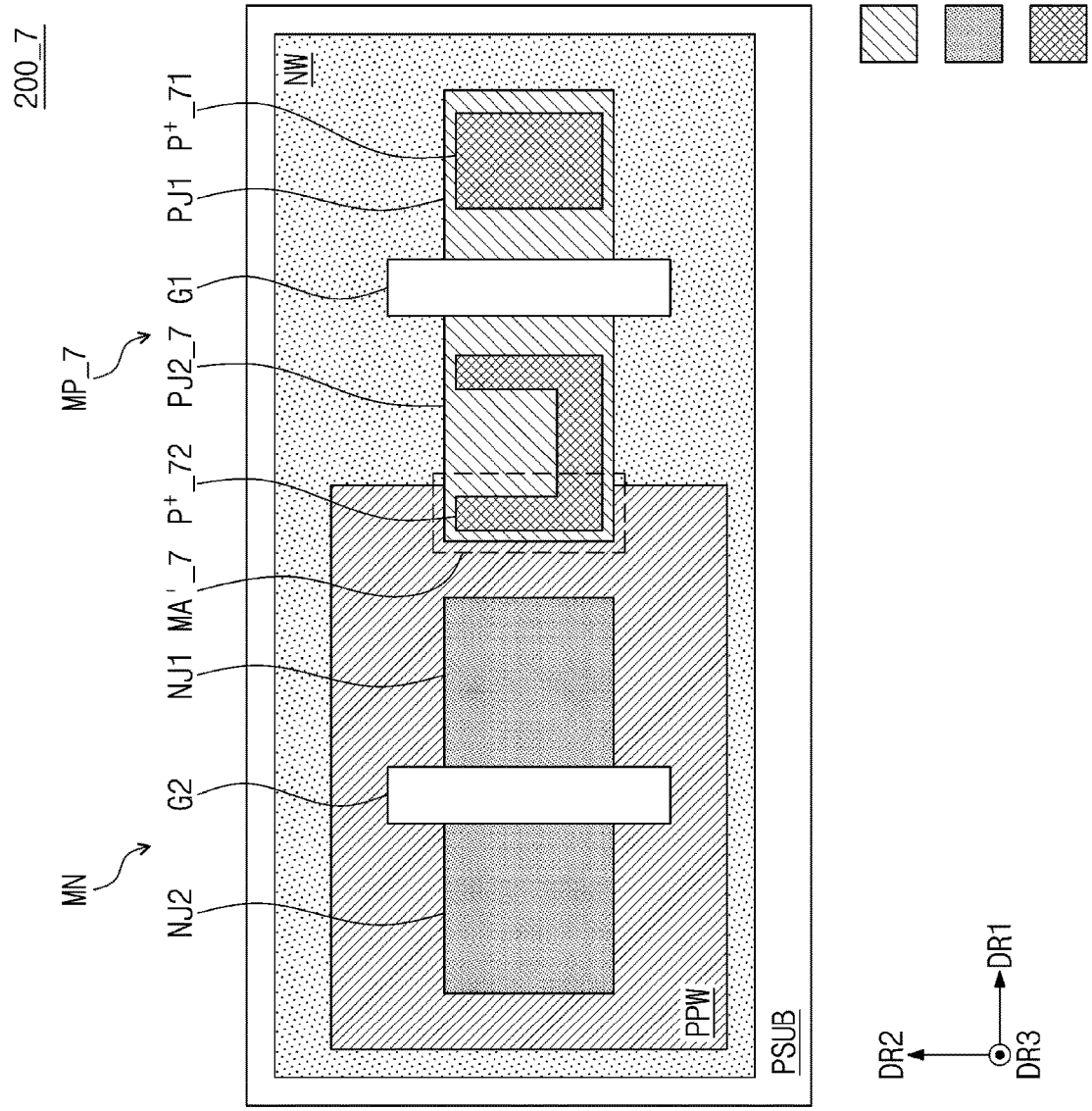
FIG. 34 is a plan view of a semiconductor device of FIG. 23, according to some embodiments.

FIG. 34 is a plan view of an example semiconductor device of FIG. 23. Referring to FIG. 34, a semiconductor device 200_7 may include the NMOS transistor MN and a PMOS transistor MP_7. Components of the NMOS transistor MN and the PMOS transistor MP_7 are described above, and thus, additional description will be omitted to avoid redundancy.

In an embodiment, a second P-type active region PJ2_7 may include a P+ implant area P+_72. When viewed from above a plane parallel to the P-type substrate PSUB, a portion of the P+ implant area P+_72 of the second P-type active region PJ2_7 may overlap the pocket P-well area PPW, and the remaining portion thereof may overlap the N-well area NW. Accordingly, a portion of the P+ implant area P+_72 may be included in a merged area MA'_7.

In an embodiment, the first P-type active region PJ1 of the PMOS transistor MP_7 may include a P+ implant area P+_71. As illustrated in FIG. 34, the P+ implant area P+_71 of the first P-type active region PJ1 and the P+ implant area P+_72 of the second P-type active region PJ2_7 may be different in shape or form. For example, the P+ implant area P+_71 of the first P-type active region PJ1 may be quadrangular, and the P+ implant area P+_72 of the second P-type active region PJ2_7 may be polygonal having more than four sides. However, the present disclosure is not limited thereto. For example, shapes or forms of the P+ implant area P+_71 of the first P-type active region PJ1 and the P+ implant area P+_72 of the second P-type active region PJ2_7 may be variously changed.

Figure 35:
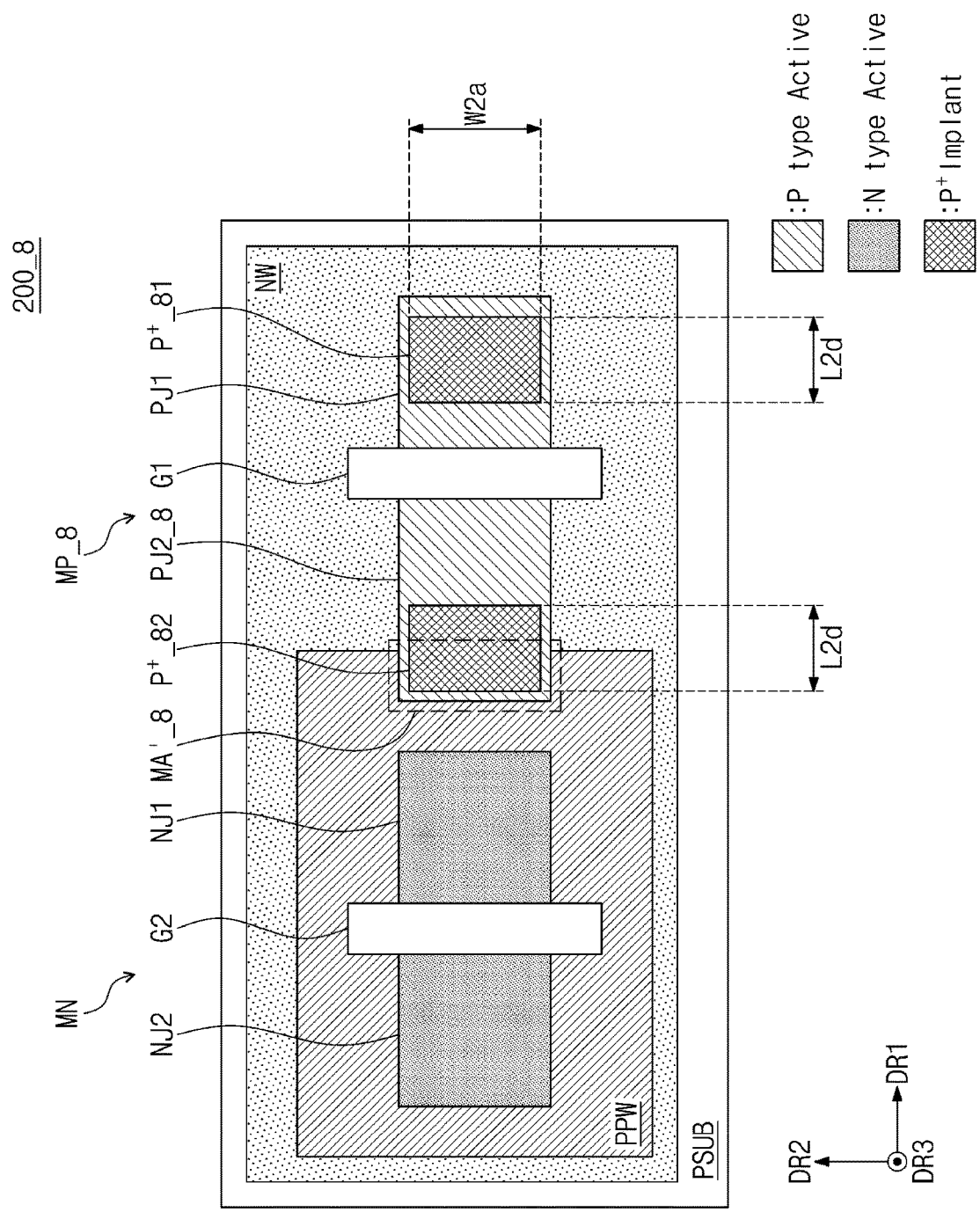
FIG. 35 is a plan view of a semiconductor device of FIG. 23, according to some embodiments.

FIG. 35 is a plan view of a semiconductor device of FIG. 23. Referring to FIG. 35, a semiconductor device 200_8 may include the NMOS transistor MN and a PMOS transistor MP_8. Components of the NMOS transistor MN and the PMOS transistor MP_8 are described above, and thus, additional description will be omitted to avoid redundancy.

In an embodiment, a second P-type active region PJ2_8 may include a P+ implant area P+_82. When viewed from above a plane parallel to the P-type substrate PSUB, a portion of the P+ implant area P+_82 of the second P-type active region PJ2_8 may overlap the pocket P-well area PPW, and the remaining portion thereof may overlap the N-well area NW horizontally adjacent to the P-well are PPW. A portion of the P+ implant area P+_82 of the second P-type active region PJ2_8 may be included in a merged area MA'_8.

In an embodiment, a first P-type active region PJ1 may include a P+ implant area P+_81. As illustrated in FIG. 35, the P+ implant area P+_81 of the first P-type active region PJ1 and the P+ implant area P+_82 of the second P-type active region PJ2_8 may be the same shape or form. For example, when viewed from above a plane parallel to a top surface of the P-type substrate PSUB, each of the P+ implant area P+_81 of the first P-type active region PJ1 and the P+ implant area P+_82 of the second P-type active region PJ2_8 may have a length of L2d in the first direction DR1 and may have a width of W2a in the second direction DR2.

Figure 36:
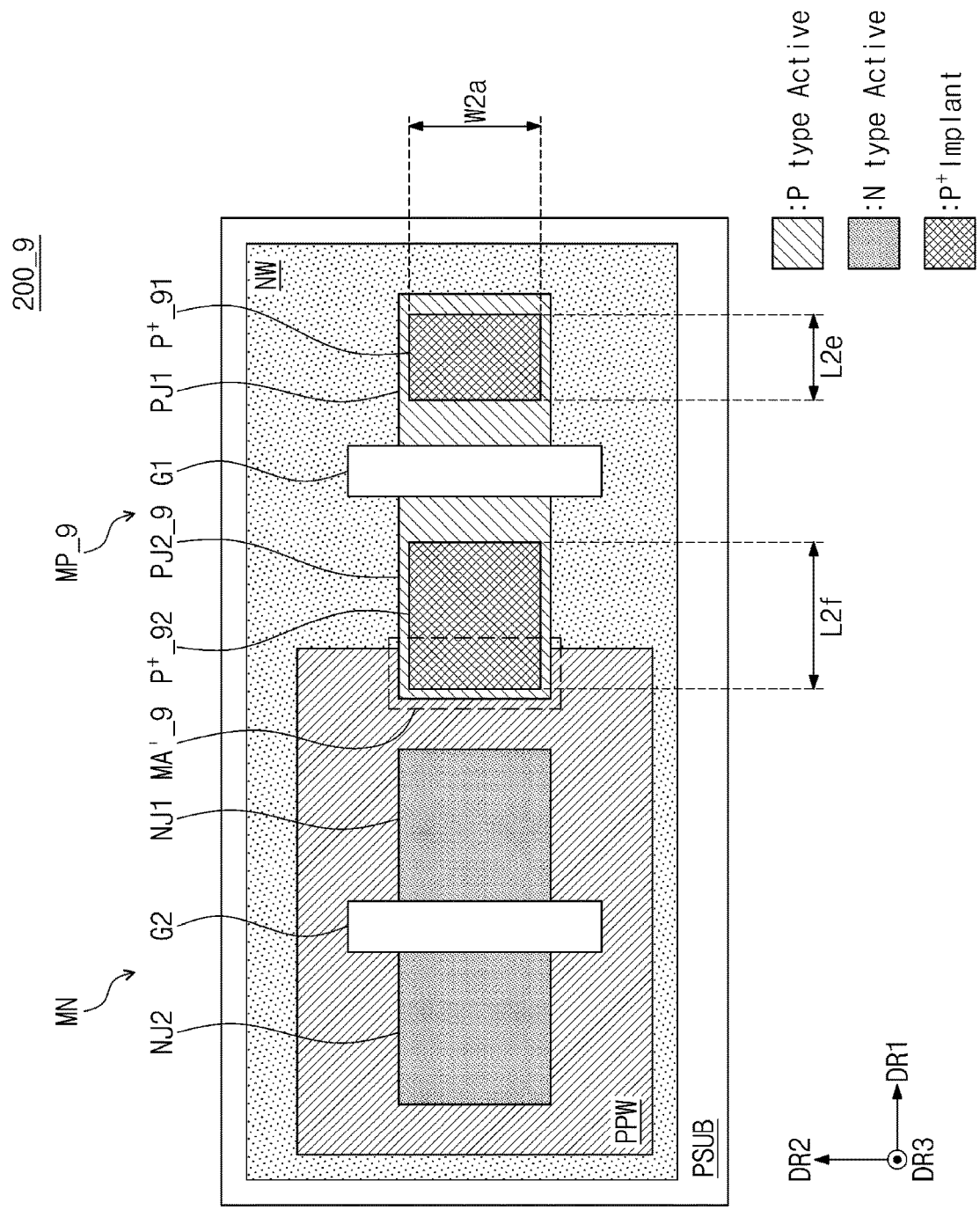
FIG. 36 is a plan view of a semiconductor device of FIG. 23, according to some embodiments.

FIG. 36 is a plan view of a semiconductor device of FIG. 23. Referring to FIG. 36, a semiconductor device 200_9 may include the NMOS transistor MN and a PMOS transistor MP_9. Components of the NMOS transistor MN and the PMOS transistor MP_9 are described above, and thus, additional description will be omitted to avoid redundancy.

In an embodiment, a second P-type active region PJ2_9 may include a P+ implant area P+_92. A portion of the P+ implant area P+_92 may be included in a merged area MA'_9. The first P-type active region PJ1 may include a P+ implant area P+_91.

The P+ implant area P+_91 of the first P-type active region PJ1 and the P+ implant area P+_92 of the second P-type active region PJ2_9 may be different in shape or form. For example, as illustrated in FIG. 36, when viewed from above a plane parallel to a top surface of the P-type substrate PSUB, the P+ implant area P+_91 of the first P-type active region PJ1 may have a length of L2e in the first direction DR1 and may have a width of W2a in the second direction DR2. When viewed from above a plane parallel to a top surface of the P-type substrate PSUB, the P+ implant area P+_92 of the second P-type active region PJ2_9 may have a length of L2f in the first direction DR1 and may have a width of W2a in the second direction DR2. As such, the P+ implant area P+_91 of the first P-type active region PJ1 and the P+ implant area P+_92 of the second P-type active region PJ2_9 may have similar quadrangular shapes; but, the P+ implant area P+_91 of the first P-type active region PJ1 and the P+ implant area P+_92 of the second P-type active region PJ2_9 may have different lengths in the first direction DR1 or different widths in the second direction DR2 or may have the different areas.

As described above, each of P-type active regions (hereinafter referred to as "first and second P-type active regions") of a PMOS transistor may include a P+ implant area that is doped with impurities of a high concentration. In this case, the number of P+ implant areas of the first P-type active region may be different from or the same as the number of P+ implant areas of the second P-type active region. Alternatively, when viewed from above a plane parallel to a top surface of the P-type substrate, shapes of the P+ implant areas of the first P-type active region may be different from or the same as shapes of the P+ implant areas of the second P-type active region. Alternatively, when viewed from above a plane parallel to a top surface of the P-type substrate, the areas of the P+ implant areas of each P-type active region may be the same or different.

In an embodiment, even though not illustrated explicitly in drawings, when viewed from a vertical cross-section defined by the first and third directions DR1 and DR3, the P+ implant areas of each of the first and second P-type active regions may be the same or different in shape, form, or area.

Figure 37A:
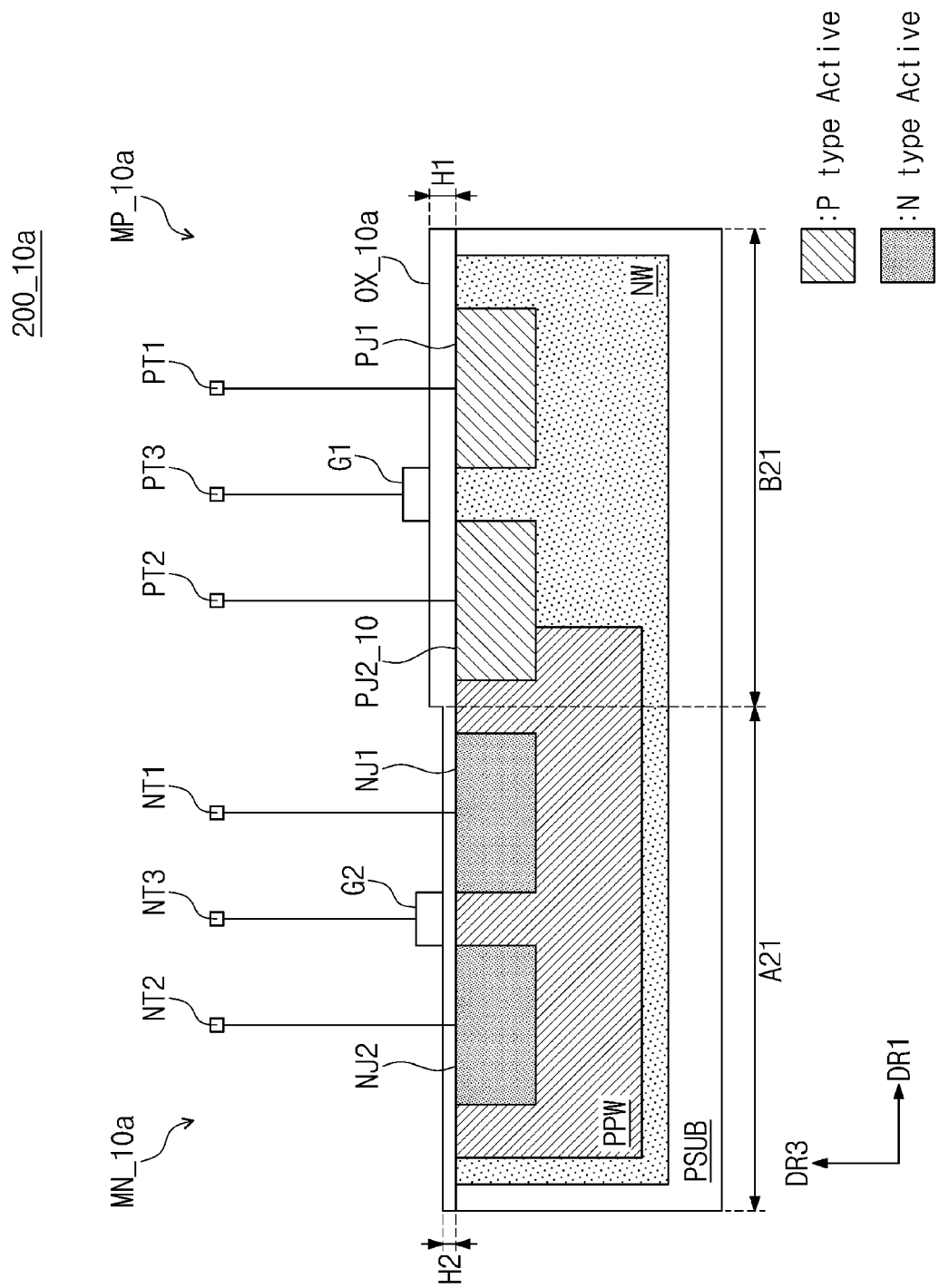
FIGS. 37A and 37B are vertical cross-sectional views of a semiconductor device of FIG. 23, according to some embodiments.
Figure 37B:
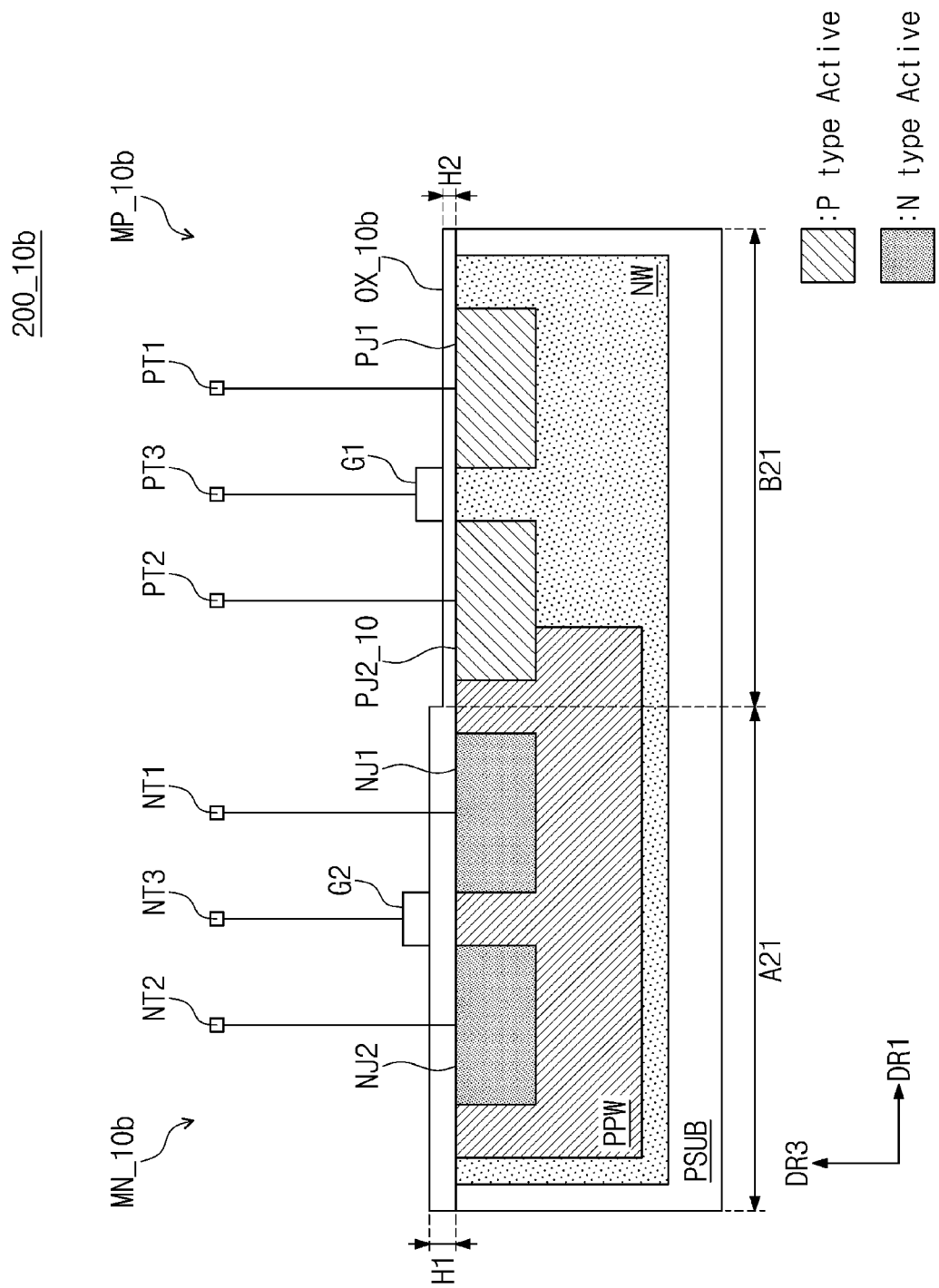

FIGS. 37A and 37B are vertical cross-sectional views of an example semiconductor device of FIG. 23. Referring to FIGS. 37A and 37B, a semiconductor device 200_10a or 200_10b may include a PMOS transistor MP_10a or MP_10b and an NMOS transistor MN_10a or MN_10b. Components of the PMOS transistor MP_10a or MP_10b and the NMOS transistor MN_10a or MN_10b are in detail described above, and thus, additional description will be omitted to avoid redundancy.

A thickness or height of an oxide layer OX_10a or OX_10b corresponding to the PMOS transistor MP_10a or MP_10b and the NMOS transistor MN_10a or MN_10b may not be uniform. A configuration where a thickness or height of the oxide layer OX_10a or OX_10b corresponding to the PMOS transistor MP_10a or MP_10b and the NMOS transistor MN_10a or MN_10b is not uniform is similar to that described with reference to FIGS. 17A and 17B except that types of transistors are changed, and thus, additional description will be omitted to avoid redundancy.

In an embodiment, area A21 illustrated in FIG. 37A may be an area including the first and second N-type active regions NJ1 and NJ2 of the NMOS transistor MN_10a or MN_10b. Area B21 may be an area including first and second P-type active regions PH and PJ2_10 of the PMOS transistor MP_10a or MP_10b.

Figure 38A:
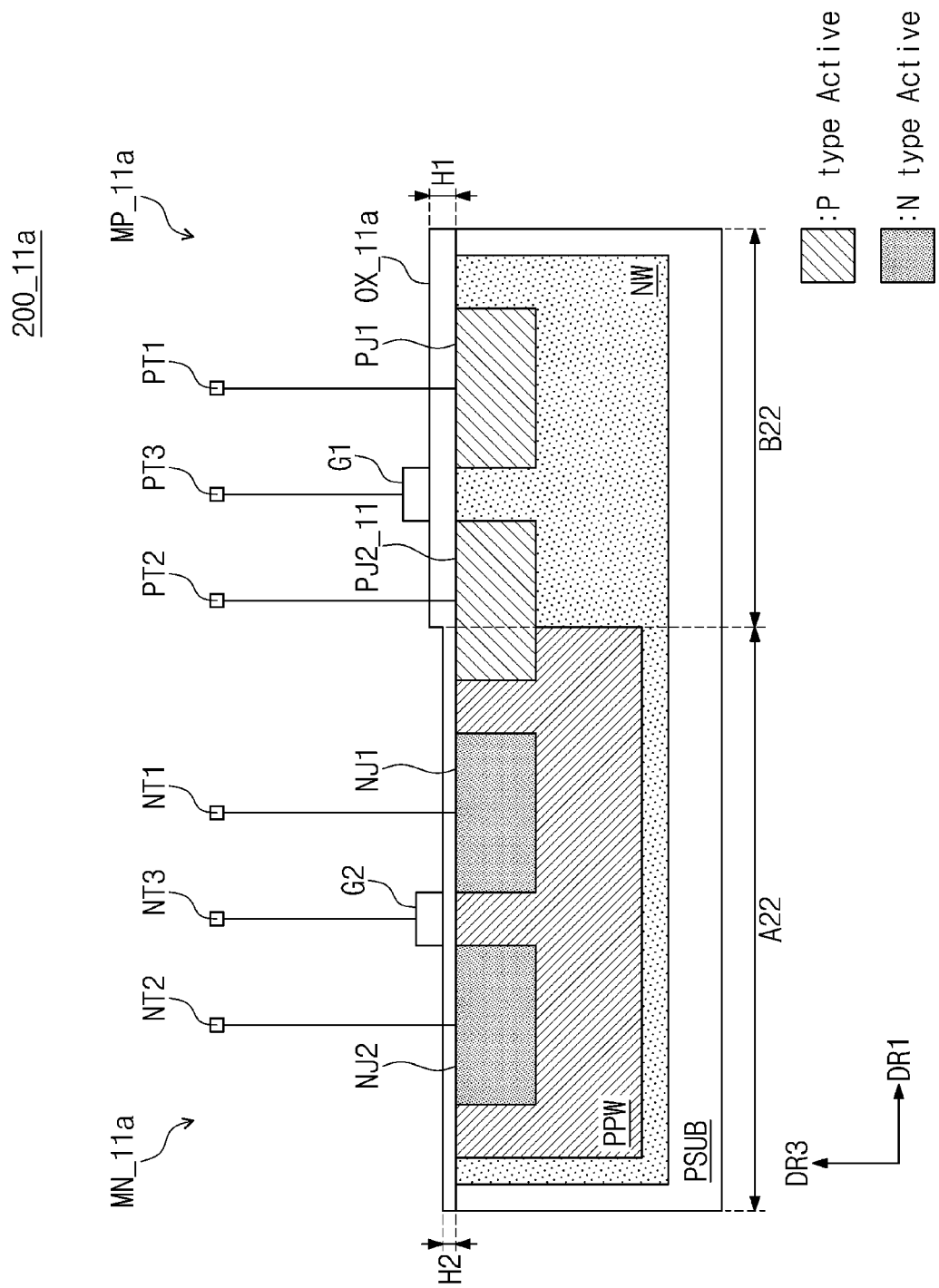
FIGS. 38A and 38B are vertical cross-sectional views of a semiconductor device of FIG. 23, according to some embodiments.
Figure 38B:
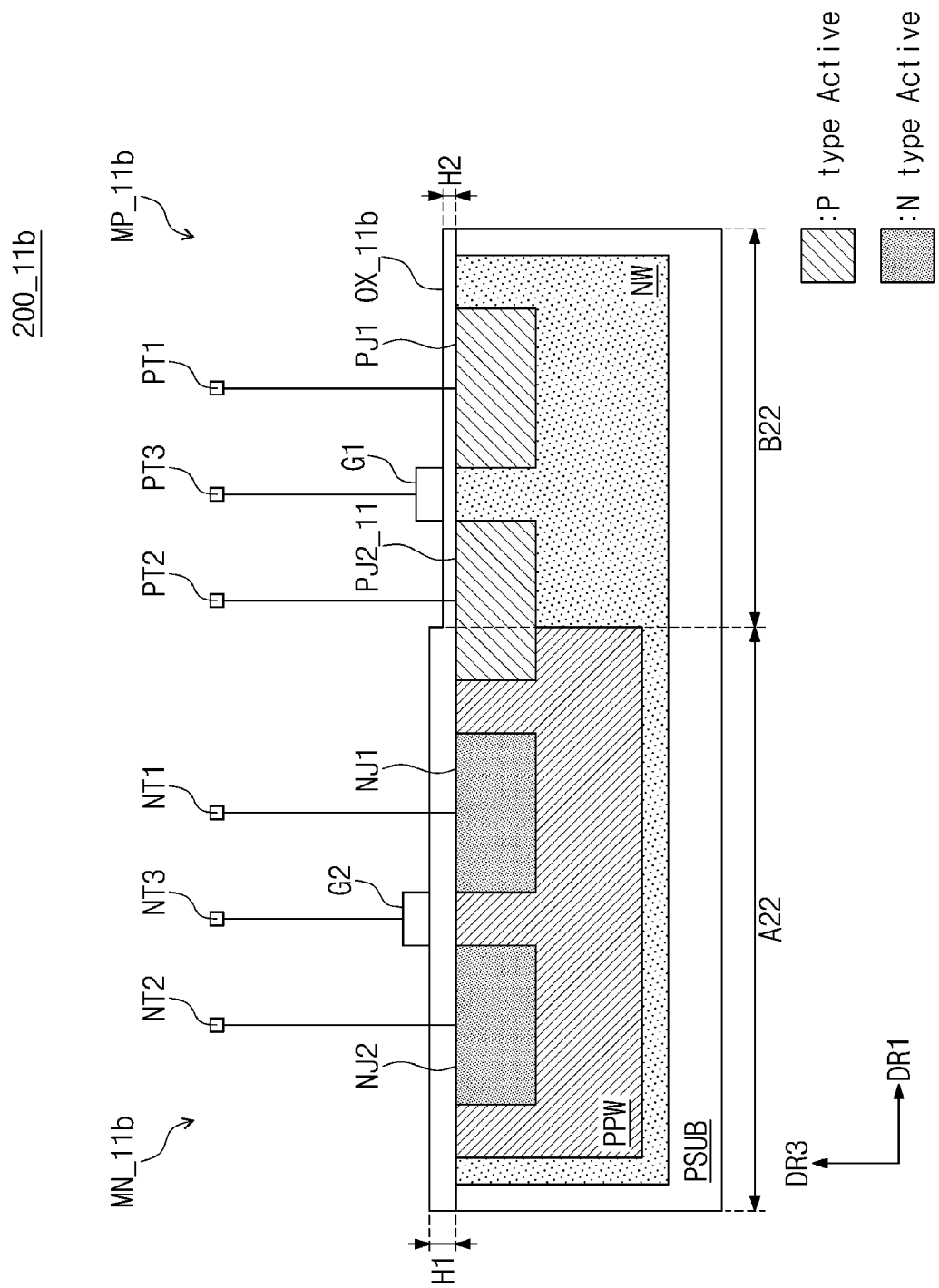

FIGS. 38A and 38B are vertical cross-sectional views of an example semiconductor device of FIG. 23. Referring to FIGS. 38A and 38B, a semiconductor device 200_11a or 200_11b may include a PMOS transistor MP_11a or MP_11b and an NMOS transistor MN_11a or MN_11b. Components of the PMOS transistor MP_11a or MP_11b and the NMOS transistor MN_11a or MN_11b are in detail described above, and thus, additional description will be omitted to avoid redundancy.

A thickness or height of an oxide layer OX_11a or OX_11b corresponding to the PMOS transistor MP_11a or MP_11b and the NMOS transistor MN_11a or MN_11b may not be uniform. A configuration where a thickness or height of the oxide layer OX_11a or OX_11b corresponding to the PMOS transistor MP_11a or MP_11b and the NMOS transistor MN_11a or MN_11b is not uniform is similar to that described with reference to FIGS. 18A and 18B except that types of transistors are changed, and thus, additional description will be omitted to avoid redundancy.

In an embodiment, area A22 may be an area including the first and second N-type active regions NJ1 and NJ2 of the NMOS transistor MN_11a or MN_11b and a portion (e.g., a merged area) of a second P-type active region PJ2_11 of the PMOS transistor MP_11a or MP_11b. Alternatively, area A22 may be an area including the pocket P-well area PPW. Area B22 may be an area including the first P-type active region PJ1 of the PMOS transistor MP_11a or MP_11b and the remaining portion of the second P-type active region PJ2_11 thereof (e.g., the remaining portion of the second P-type active region PJ2_11 other than the merged area). As shown in FIGS. 38A and 38B, a height change of the oxide layer OX_11a or OX_11b may occur in an area where the N-well area NW and the pocket P-well area PPW contact each other (e.g., at side surfaces or boundaries of each area).

Figure 39:
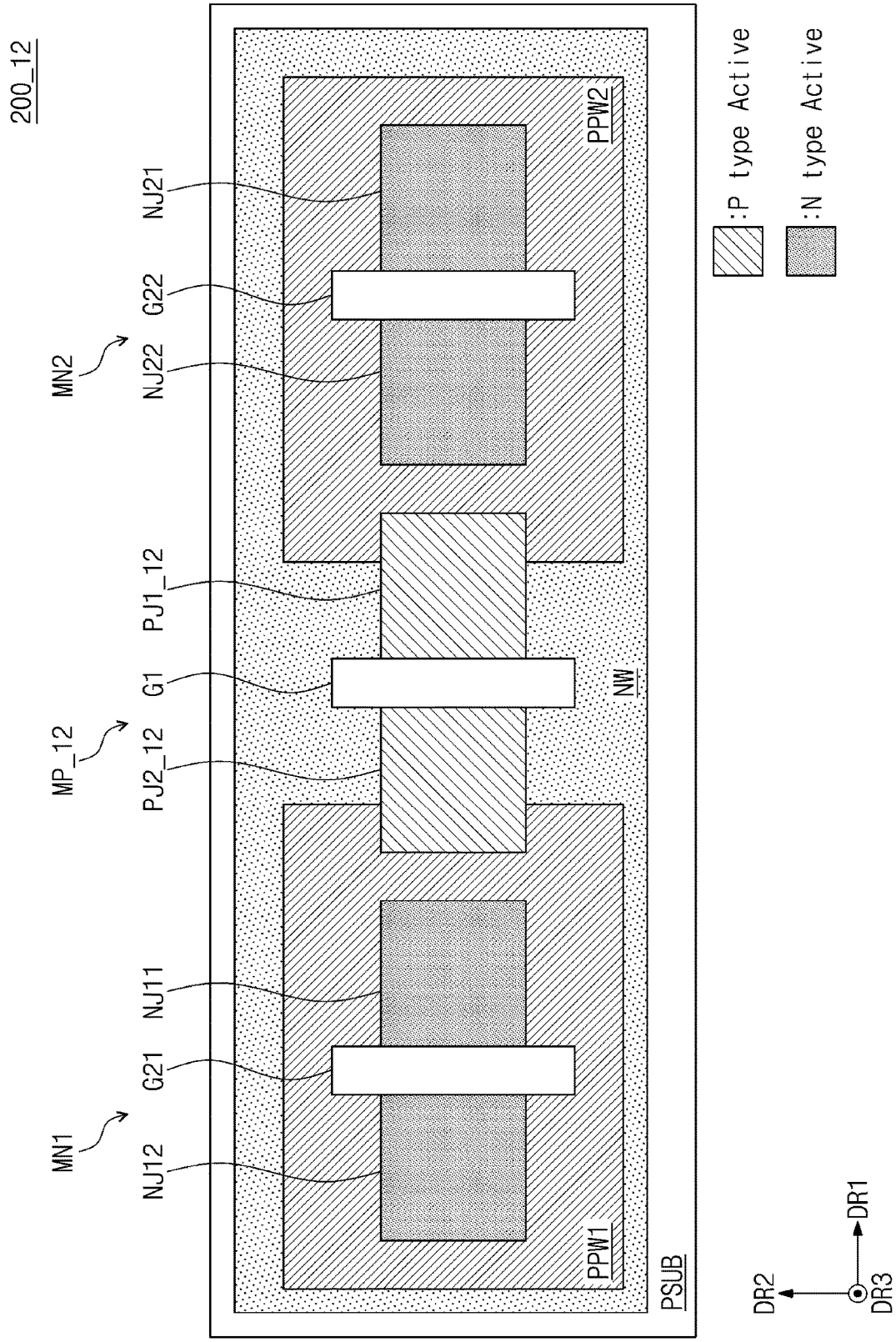
FIG. 39 is a plan view of a semiconductor device according to an embodiment of the present disclosure.
Figure 40:
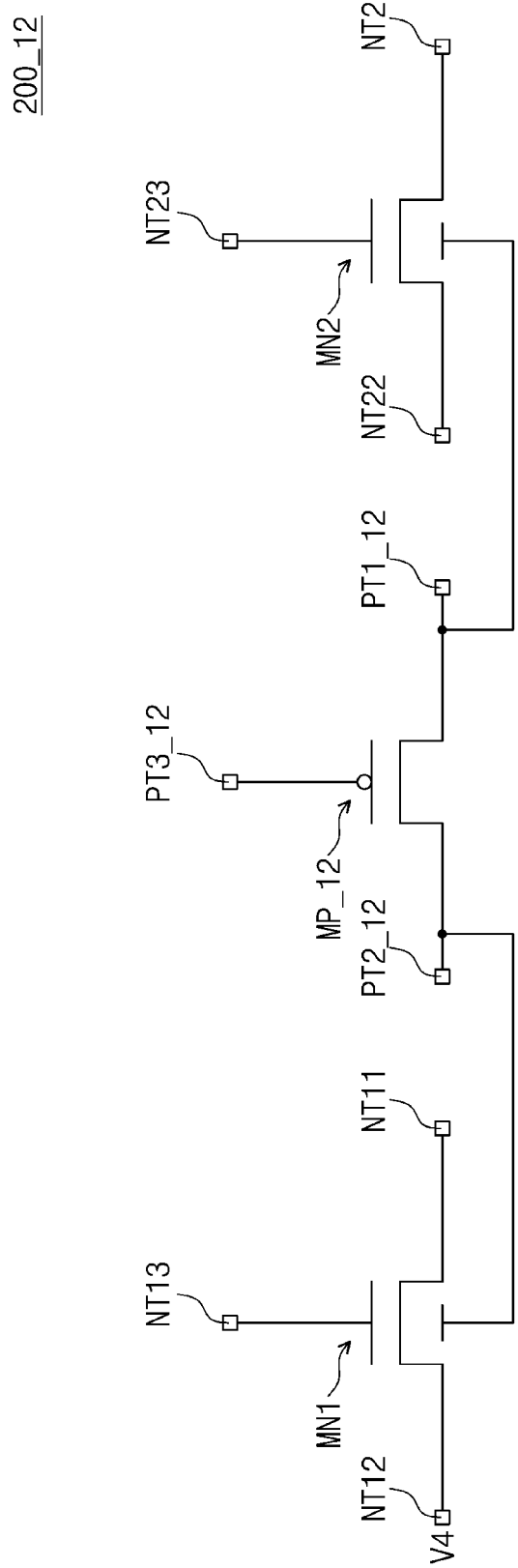
FIG. 40 is a circuit diagram of a semiconductor device of FIG. 39, according to some embodiments.

FIG. 39 is a plan view of a semiconductor device according to an embodiment of the present disclosure. FIG. 40 is a circuit diagram of a semiconductor device of FIG. 39. An embodiment of a semiconductor device 200_12 where one PMOS transistor provides a body bias to two NMOS transistors will be described with reference to FIGS. 39 and 40.

Referring to FIGS. 39 and 40, the semiconductor device 200_12 may include first and second NMOS transistors MN1 and MN2 and a PMOS transistor MP_12. The first NMOS transistor MN1 may include first and second N-type active regions NJ11 and NJ12 and a gate G21 formed in a first pocket P-well area PPW1. The second NMOS transistor MN2 may include first and second N-type active regions NJ21 and NJ22 and a gate G22 formed in a second pocket P-well area PPW2. The first and second NMOS transistors MN1 and MN2 are similar to the NMOS transistor MN described above except that the first and second NMOS transistors MN1 and MN2 are respectively formed in independent pocket P-well areas PPW1 and PPW2, and thus, additional description will be omitted to avoid redundancy.

The PMOS transistor MP_12 may include a first P-type active region PJ1_12, a second P-type active region PJ2_12 and the gate G1. In an embodiment, at least a portion of the first P-type active region PJ1_12 may be formed in the second pocket P-well area PPW2, and the remaining portion thereof may be formed in the N-well area NW (e.g., horizontally adjacent to the second pocket P-well area PPW2). The first P-type active region PJ1_12 may be used as a source/drain of the PMOS transistor MP_12 and may simultaneously provide the body bias of the second NMOS transistor MN2. At least a portion of the second P-type active region PJ2_12 may be formed in the first pocket P-well area PPW1, and the remaining portion thereof may be formed in the N-well area NW (e.g., horizontally adjacent to the first pocket P-well area PPW1). The second P-type active region PJ2_12 may be used as a drain/source of the PMOS transistor MP_12 and may simultaneously provide the body bias of the first NMOS transistor MN1.

In this case, a contact plug and a metal line for providing the body bias of the first and second NMOS transistors MN1 and MN2 may be omitted. For example, as illustrated in FIG. 40, the body bias of the first NMOS transistor MN1 may be provided through the second P-type active region PJ2_12 of the PMOS transistor MP_12. Likewise, the body bias of the second NMOS transistor MN2 may be provided through the first P-type active region PJ1_12 of the PMOS transistor MP_12. A separate terminal, a separate contact plug, or a separate metal line for providing the body bias of the first and second NMOS transistors MN1 and MN2 are not required.

Figure 41A:
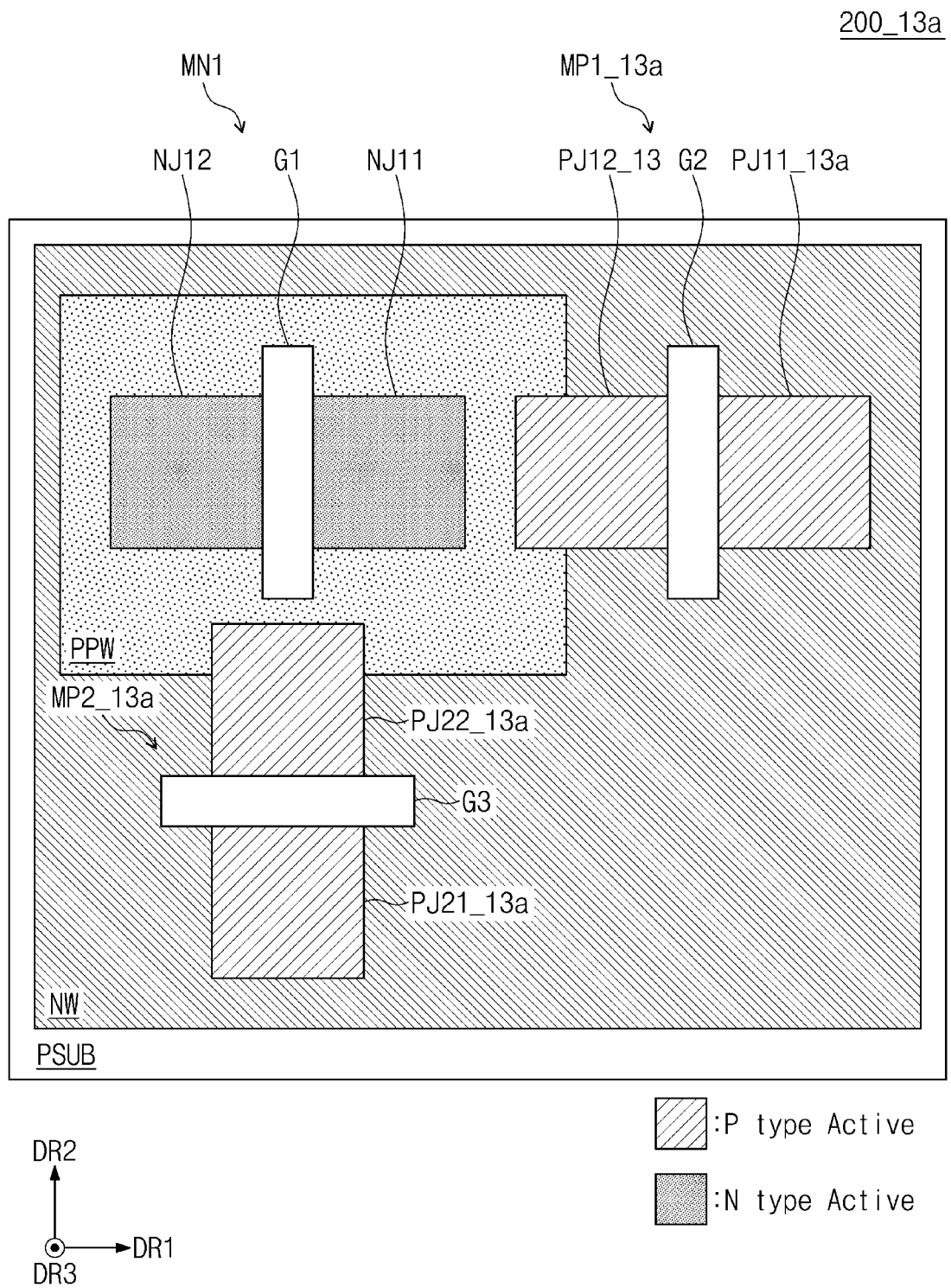
FIGS. 41A and 41B are plan views of a semiconductor device according to an embodiment of the present disclosure.
Figure 41B:
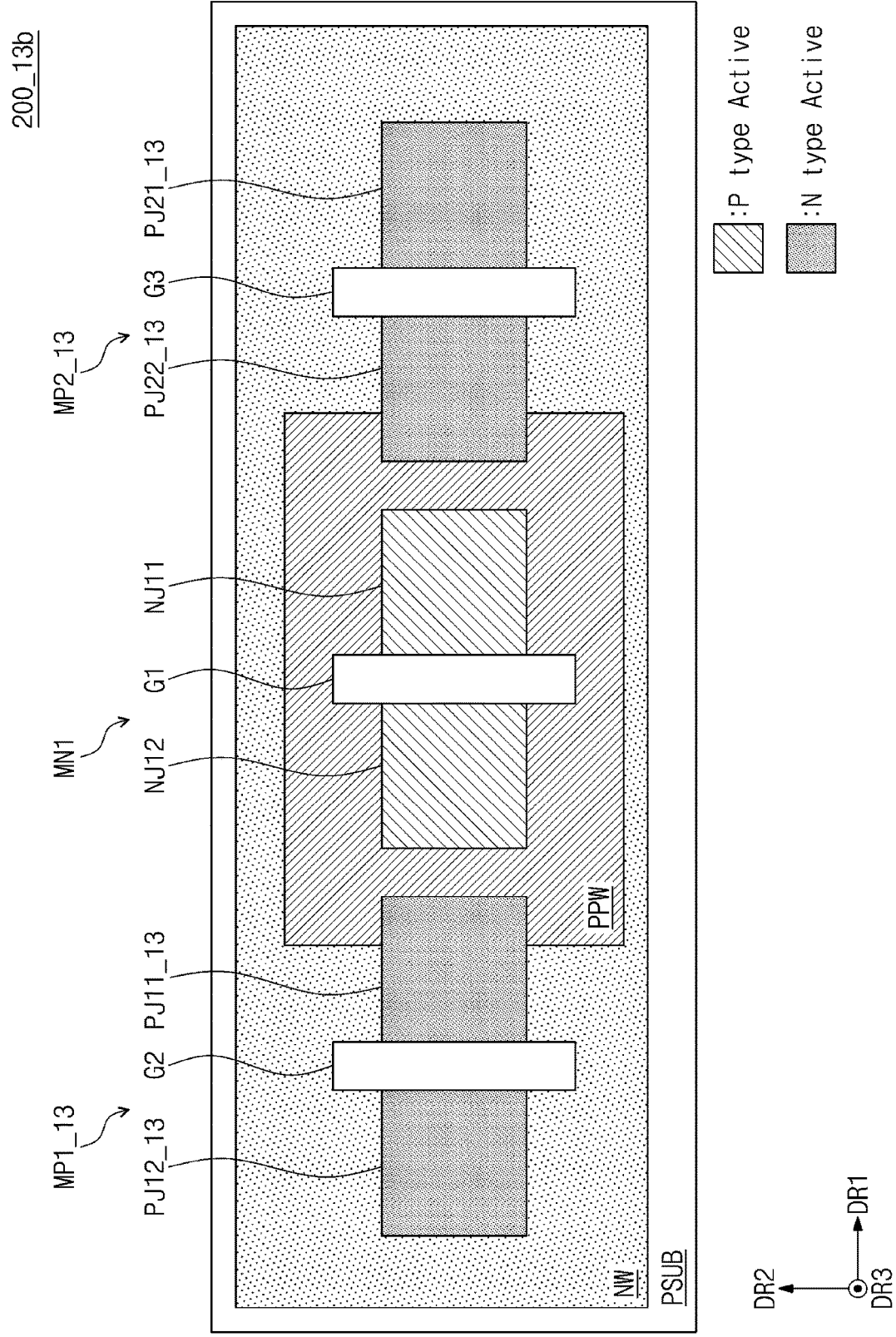
Figure 42:
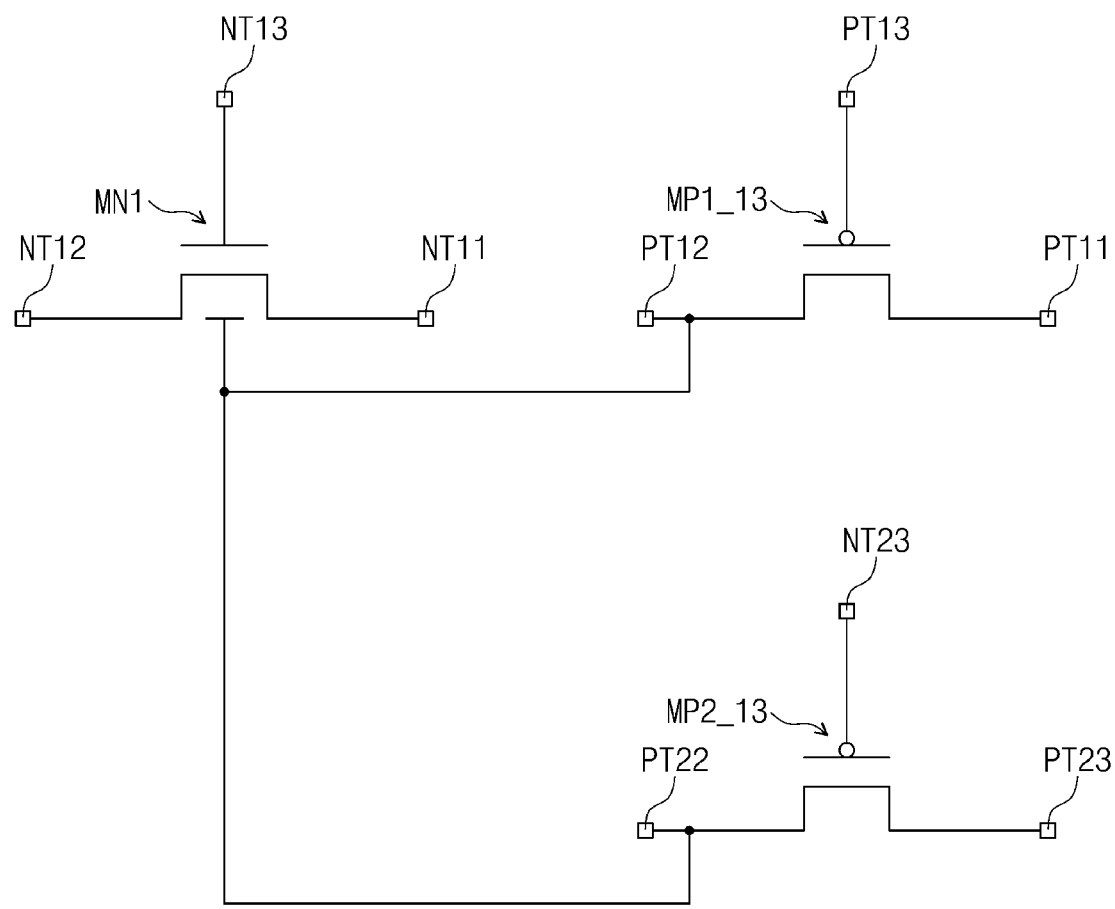
FIG. 42 is a circuit diagram illustrating semiconductor devices of FIGS. 41A and 41B, according to some embodiments.

FIGS. 41A and 41B are plan views of a semiconductor device according to an embodiment of the present disclosure. FIG. 42 is a circuit diagram illustrating semiconductor devices of FIGS. 41A and 41B. An embodiment of a semiconductor device 200_13 where two PMOS transistors MP1 and MP2 provide a body bias to one NMOS transistor MN1 will be described with reference to FIGS. 41A, 41B, and 42.

Referring to FIGS. 41A, 41B, and 42, the semiconductor device 200_13 may include a first NMOS transistor MN1, a first PMOS transistor MP1_13, and a second PMOS transistor MP2_13. The first NMOS transistor MN1 may include the first and second N-type active regions NJ1 and NJ2 and the gate G1 formed in the pocket P-well area PPW. The first PMOS transistor MP1_13 may include a first P-type active region PJ11_13, a second P-type active region PJ12_13 and the gate G2. The second PMOS transistor MP2_13 may include a first P-type active region PJ21_13, a second P-type active region PJ22_13, and the gate G3.

In an embodiment, as illustrated in FIG. 41A, the first NMOS transistor MN1 and a first PMOS transistor MP1_13a may be arranged along the first direction DR1, and the first NMOS transistor MN1 and a second PMOS transistor MP2_13a may be arranged along the second direction DR2. In this case, at least a partial area of the second P-type active region PJ12_13a of the first PMOS transistor MP1_13a and at least a partial area of the second P-type active region PJ22_13a of the second PMOS transistor MP2_13a may be formed in the pocket P-well area PPW.

Alternatively, as illustrated in FIG. 41B, a first PMOS transistor MP_13b, the first NMOS transistor MN1, and a second PMOS transistor MP2_13b may be arranged along the first direction DR1. In this case, at least a partial area of a second P-type active region PJ12_13b of the first PMOS transistor MP1_13b and at least a partial area of a second P-type active region PJ22_13b of the second PMOS transistor MP2_13b may be formed in the pocket P-well area PPW.

As described above, at least a portion of each of the second P-type active regions PJ12_13 and PJ22_13 of the first and second PMOS transistors MP1_13 and MP2_13 may be formed in the pocket P-well area PPW where the first NMOS transistor MN1 is formed. As such, the body bias of the first NMOS transistor MN1 may be provided through the second P-type active regions PJ12_13 and PJ22_13 of the first and second PMOS transistors MP1_13 and MP2_13. For example, as illustrated in FIG. 42, because the body bias of the first NMOS transistor MN1 is provided through the second P-type active regions PJ12_13 and PJ22_13 of the first and second PMOS transistors MP1_13 and MP2_13, a separate contact plug or a separate metal line for the body bias of the first NMOS transistor MN1 may be omitted.

As described above, a semiconductor device according to embodiments of the present disclosure may include a PMOS transistor, and an NMOS transistor supplied with a body bias from a source/drain of the PMOS transistor. In this case, at least a portion of a P-type active region of the PMOS transistor may be formed in a pocket P-well area where the NMOS transistor is formed. As such, because a separate contact plug and a separate metal line for providing the body bias of the NMOS transistor may be omitted, the area of the semiconductor device may be reduced. The embodiments of the present disclosure described above are simple examples for describing the technical idea of the invention easily, and the present disclosure is not limited thereto. Even though embodiments of the present disclosure have been individually described, a plurality of embodiments may be variously combined and modified without departing from the technical idea of the invention.

In drawings associated with the above embodiments, the detailed description of some components or some reference signs is omitted, but this is for concise description of embodiments of the present disclosure. In addition, the omitted description of the components or the reference signs will be easily understood by one skilled in the art without departing from the technical idea of the invention.

The embodiments of the present disclosure described above are simple examples for describing various embodiments of the present disclosure easily, and the scope of the invention is not limited thereto. It may be understood that various embodiments described above are independently implemented or at least two thereof is combined or merged.

Figure 43:
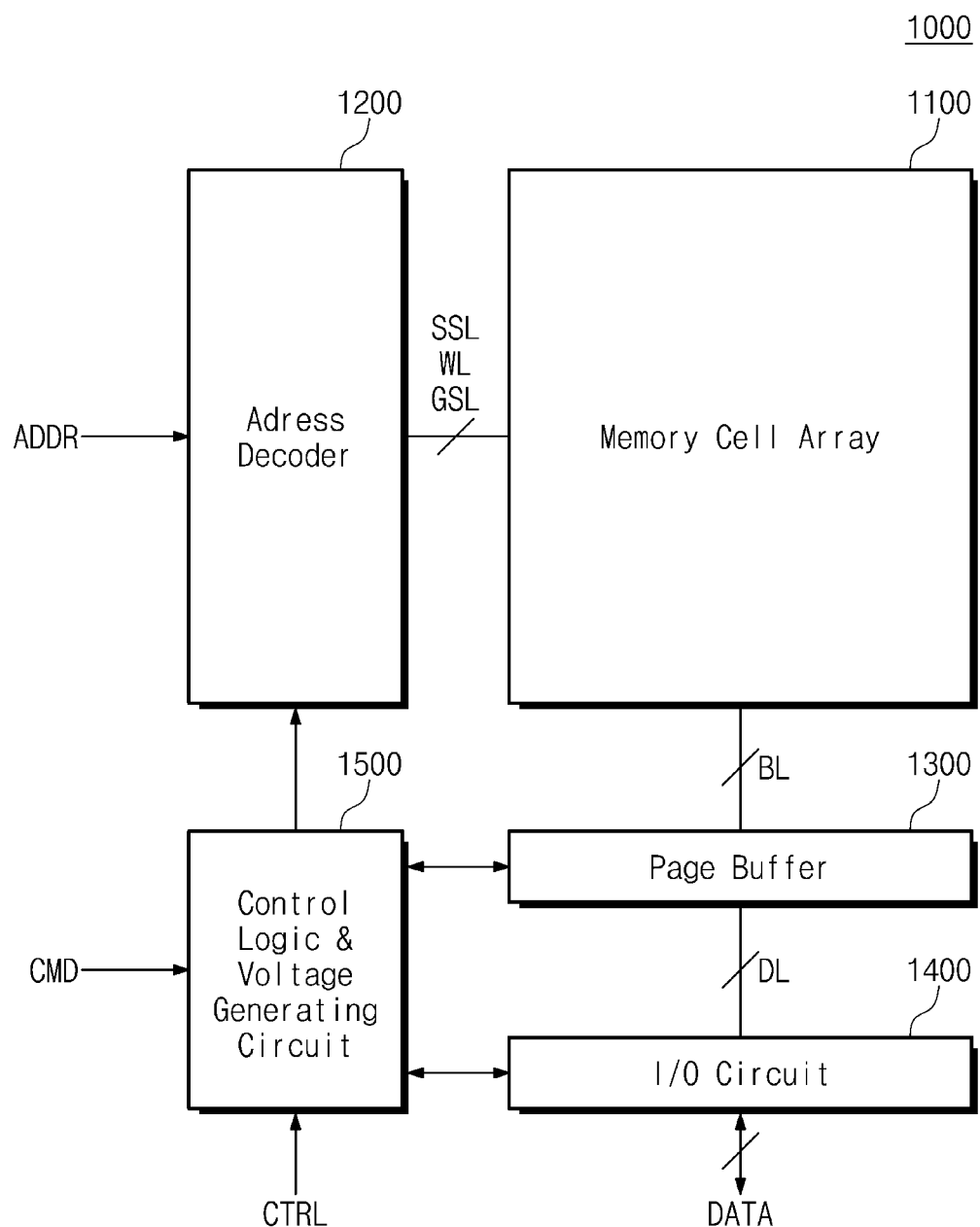
FIG. 43 is a block diagram illustrating a memory device to which a semiconductor device according to the present disclosure is applied.

FIG. 43 is a block diagram illustrating a memory device to which a semiconductor device according to the present disclosure is applied. Referring to FIG. 43, a memory device 1000 may include a memory cell array 1100, an address decoder 1200, a page buffer 1300, an input/output circuit 1400, and a control logic and voltage generating circuit 1500.

In an embodiment, the remaining components other than the memory cell array 1100, for example, the address decoder 1200, the page buffer 1300, the input/output circuit 1400, and the control logic and voltage generating circuit 1500 may be included in a peripheral circuit. In an embodiment, the memory device 1000 may have a cell on peripheral (COP) or CMOS under array (CUA) structure in which the memory cell array 1100, a memory cell structure, or a memory cell area is stacked on the peripheral circuit (or a peripheral circuit area).

The memory cell array 1100 may include a plurality of memory blocks. Each of the plurality of memory blocks may include a plurality of cell strings, and each of the plurality of cell strings may be connected with a plurality of bit lines BL. Each of the plurality of cell strings may include a plurality of cell transistors connected in series. The plurality of cell transistors may be connected with string selection lines SSL, word lines WL, and ground selection lines GSL.

The address decoder 1200 may be connected with the memory cell array 1100 through the string selection lines SSL, the word lines WL, and the ground selection lines GSL. The address decoder 1200 may receive an address ADDR from an external device (e.g., a memory controller) and may decode the received address ADDR. The address decoder 1200 may control or drive voltages of the string selection lines SSL, the word lines WL, and the ground selection lines GSL based on the decoded address ADDR.

The page buffer 1300 may be connected with the memory cell array 1100 through the bit lines BL. The page buffer 1300 may read data stored in the memory cell array 1100 by sensing voltage changes of the bit lines BL. The page buffer 1300 may provide the read data to the input/output circuit 1400. The page buffer 1300 may be configured to temporarily store data "DATA" received through the input/output circuit 1400. The page buffer 1300 may control or drive the bit lines BL based on the temporarily stored data "DATA".

The input/output circuit 1400 may exchange data "DATA" with the external device (e.g., a memory controller). The input/output circuit 1400 may provide the data "DATA" received from the external device to the page buffer 1300 or may send the data "DATA" received from the page buffer 1300 to the external device.

The control logic and voltage generating circuit 1500 (hereinafter referred to as a "control logic circuit") may be configured to generate the following voltages necessary for the memory device 1000 to operate: a plurality of program voltages, a plurality of program verification voltages, a plurality of pass voltages, a plurality of read voltages, and a plurality of erase voltages.

The control logic circuit 1500 may control an operation of the memory device 1000 in response to a command CMD and a control signal CTRL from the external device. For example, the control logic circuit 1500 may control the address decoder 1200, the page buffer 1300, the input/output circuit 1400, and the dummy bit line driver 1600 in response to the command CMD such that an operation (e.g., a program operation, a read operation, or an erase operation) corresponding to the command CMD is performed.

Figure 44:
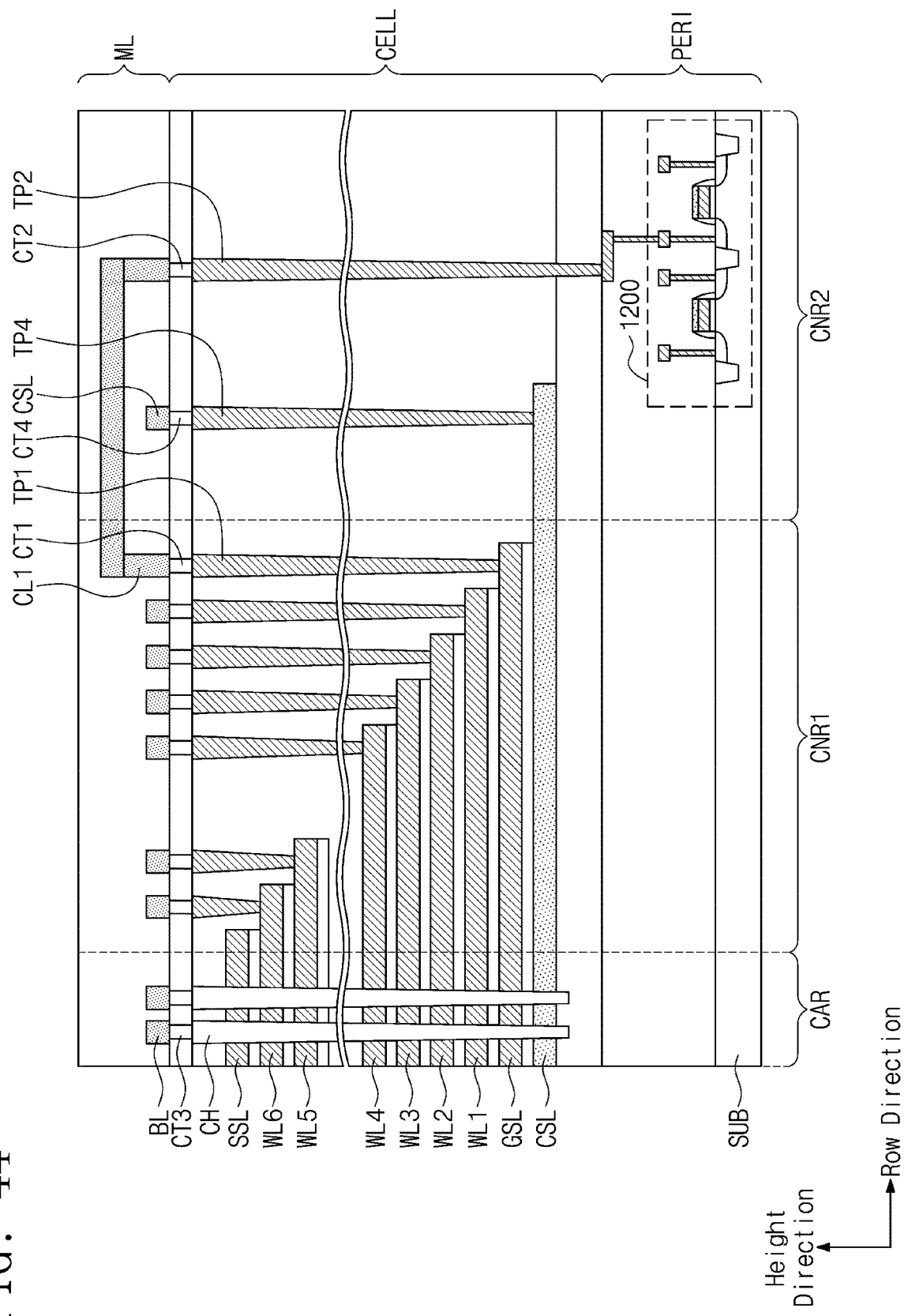
FIG. 44 is a vertical cross-sectional view illustrating a memory device of FIG. 43, according to some embodiments.

FIG. 44 is a vertical cross-sectional view illustrating a memory device of FIG. 43. For brevity of drawing and for convenience of description, components that are unnecessary to describe an embodiment of the present disclosure and detailed descriptions thereof will be omitted. For example, some string selection lines, some word lines, some ground selection lines, etc. of a memory block BLK will be omitted, but the present disclosure is not limited thereto.

Referring to FIGS. 43 and 44, a peripheral circuit PERI may be formed on a semiconductor substrate SUB. A cell area CELL may be formed from an upper portion of the peripheral circuit PERI or from the peripheral circuit PERI along a height direction. The cell area CELL may indicate an area where the memory block BLK is formed. In the cell area CELL, a common source line CSL, a ground selection line GSL, word lines WL1 to WL6, and a string selection line SSL may be vertically stacked from the peripheral circuit PERI in the height direction.

In a first contact region CNR1, the common source line CSL, the ground selection line GSL, the word lines WL1 to WL6, and the string selection line SSL may be formed in a stair shape. For example, in the first contact region CNR1, lengths of the common source line CSL, the ground selection line GSL, the word lines WL1 to WL6, and the string selection line SSL in a row direction may decrease as a distance from the peripheral circuit PERI increases.

In the first contact region CNR1, the ground selection line GSL, the word lines WL1 to WL6, and the string selection line SSL may be connected with first contact plugs CT1 through first through plugs TP1. The first contact plugs CT1 may be connected with first conductive lines CL1 of a metal layer ML. In the cell area CELL, the first through plugs TP1 may be formed along the height direction (i.e., a direction perpendicular to the peripheral circuit PERI). In an embodiment, the first through plugs TP1 or through plugs to be described below may indicate a vertical through structure such as a through silicon via (TSV) or a through hole via (THV). In an embodiment, the metal layer ML may include a plurality of layers for providing various wires or patterns of the conductive lines CL1.

The first conductive lines CL1 of the metal layer ML may be connected with a second contact plug CT2 in a second contact region CNR2. The second contact plug CT2 may be electrically connected with the peripheral circuit PERI through a second through plug TP2. In an embodiment, as illustrated in FIG. 44, the first word line WL1 may be electrically connected with the peripheral circuit PERI, in particular, the address decoder 1200 through the first through plug TP1, the first contact plug CT1, the first conductive line CL1, the second contact plug CT2, and the second through plug TP2. The above connection structures of the word lines WL1 to WL6 of the memory block BLK are simple examples, and the present disclosure is not limited thereto.

Channels CH may be provided in a cell core region CAR. The channels CH may be provided to penetrate the common source line CSL, the ground selection line GSL, the word lines WL1 to WL6, and the string selection line SSL. The channels CH may be connected with the bit lines BL through third contacts CT3.

In an embodiment, the metal layer ML may include a conductive line corresponding to the common source line CSL. The conductive line corresponding to the common source line CSL may be connected with the common source line CSL of the cell area CELL through a fourth contact plug CT4 and a fourth through plug TP4. In an embodiment, in the metal layer ML, the common source line CSL may be connected in common with the whole or part of the memory cell array through a mesh structure or a ring structure. In an embodiment, in the cell area CELL, the common source line CSL may be connected in common with the whole or part of the memory cell array through a mesh structure or a ring structure.

In an embodiment, the address decoder 1200 may be included in the peripheral circuit PERI and may perform a high-voltage switching operation by using the semiconductor device 100 or 200 described with reference to FIGS. 1 to 42. For example, the address decoder 1200 may include the semiconductor device 100 or 200 (e.g., the transistors) described with reference to FIGS. 1 to 42.

Figure 45:
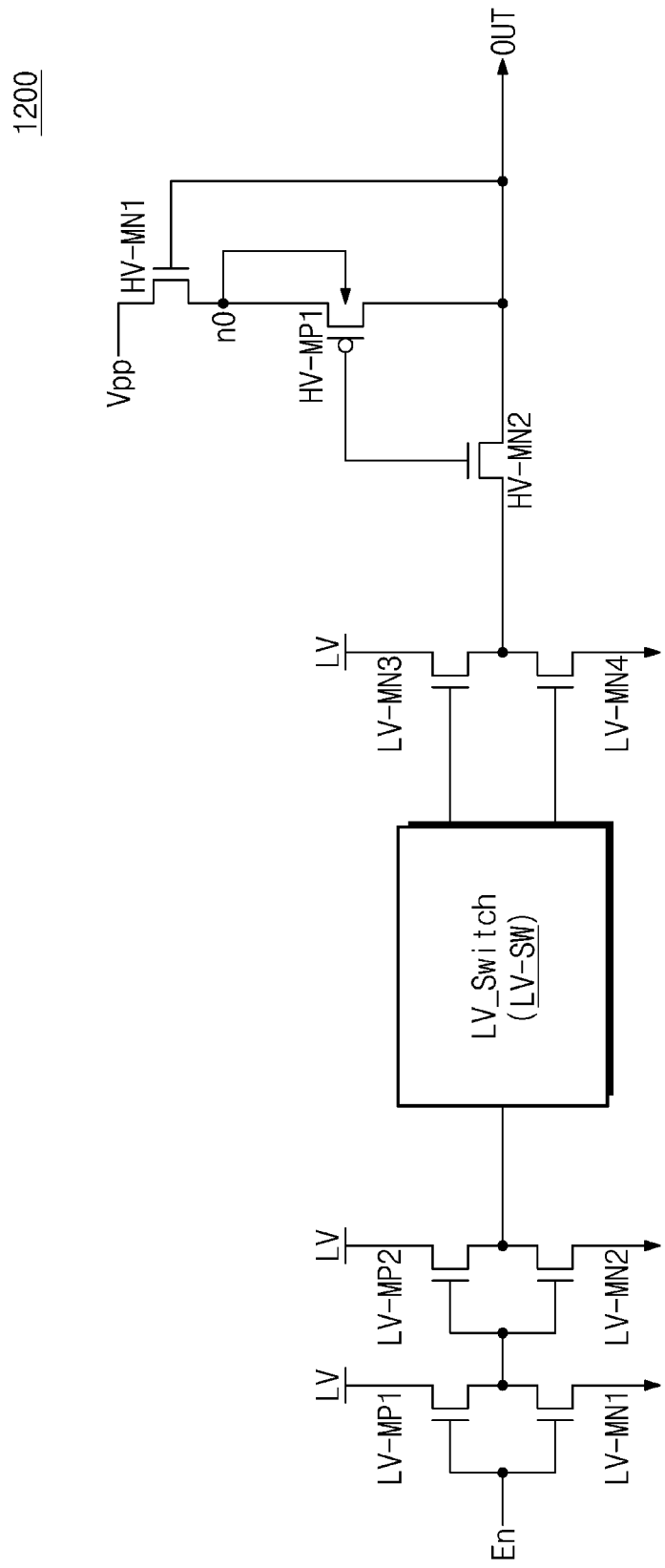
FIG. 45 is a diagram illustrating an address decoder of FIG. 43, according to some embodiments.

FIG. 45 is a diagram illustrating an address decoder of FIG. 43. Referring to FIGS. 43 and 45, the address decoder 1200 may include a semiconductor circuit configured to output an output signal OUT in response to an input signal EN. The semiconductor circuit may include a plurality of low-voltage transistors LV-MP1, LV-MP2, LV-MN1, LV-MN2, LV-MN3, and LV-MN4, a low-voltage switch circuit LV-SW, and a plurality of high-voltage transistors HV-MN1, HV-MP1, and HV-MN2.

The first low-voltage PMOS transistor LV-MP1 and the first low-voltage NMOS transistor LV-MN1 may be connected in series between a low voltage LV and a ground voltage and operate in response to the input signal EN. The first low-voltage PMOS transistor LV-MP1 and the first low-voltage NMOS transistor LV-MN1 may invert and output the input signal EN. The second low-voltage PMOS transistor LV-MP2 and the second low-voltage NMOS transistor LV-MN2 may be connected in series between the low voltage LV and the ground voltage, and may operate in response to an inversion signal output from the first low-voltage PMOS transistor LV-MP1 and the first low-voltage NMOS transistor LV-MN1. The second low-voltage PMOS transistor LV-MP2 and the second low-voltage NMOS transistor LV-MN2 may re-invert and output the inversion signal.

The low-voltage switch circuit LV_SW may output first and second signals S1 and S2 in response to an output signal of the second low-voltage PMOS transistor LV-MP2 and the second low-voltage NMOS transistor LV-MN2. The first and second signals S1 and S2 may be complementary to each other.

The third and fourth low-voltage NMOS transistors LV-MN3 and LV-MN4 may be connected in series between the low voltage LV and the ground voltage and may operate in response to first and second signals S1 and S2, respectively. The first high-voltage NMOS transistor HV-MN1 may be connected between a power supply voltage Vpp (i.e., a high voltage) and a 0-th node n0 and may operate in response to the output signal OUT. The second high-voltage NMOS transistor HV-MN2 may be connected between a connection node of the third and fourth low-voltage NMOS transistors LV-MN3 and LV-MN4 and the output signal OUT. The first high-voltage PMOS transistor HV-MP1 may be connected between the 0-th node n0 and the output signal OUT. A gate of the first high-voltage PMOS transistor HV-MP1 may be connected with a gate of the second high-voltage NMOS transistor HV-MN2.

In an embodiment, a body bias of the first high-voltage PMOS transistor HV-MP1 may be provided from the 0-th node n0. In this case, as described with reference to FIGS. 1 to 22, the body bias of the first high-voltage PMOS transistor HV-MP1 may be supplied from a portion of an N-type active region of the first high-voltage NMOS transistor HV-MN1. In this manner, the first high-voltage NMOS transistor HV-MN1 and the first high-voltage PMOS transistor HV-MP1 may be implemented through at least one of semiconductor devices described with reference to FIGS. 1 to 22 or a combination thereof.

In an embodiment, an address decoder to which a semiconductor device according to the present disclosure is applied is described with reference to FIG. 45, but the present disclosure is not limited thereto. A semiconductor device according to the present disclosure may be applied to any other components of a memory device. Alternatively, a semiconductor device according to the present disclosure may be applied to any other electronic devices (e.g., a logic circuit, a processor, a control circuit, and a sensor circuit) as well as a memory device.

Figure 46:
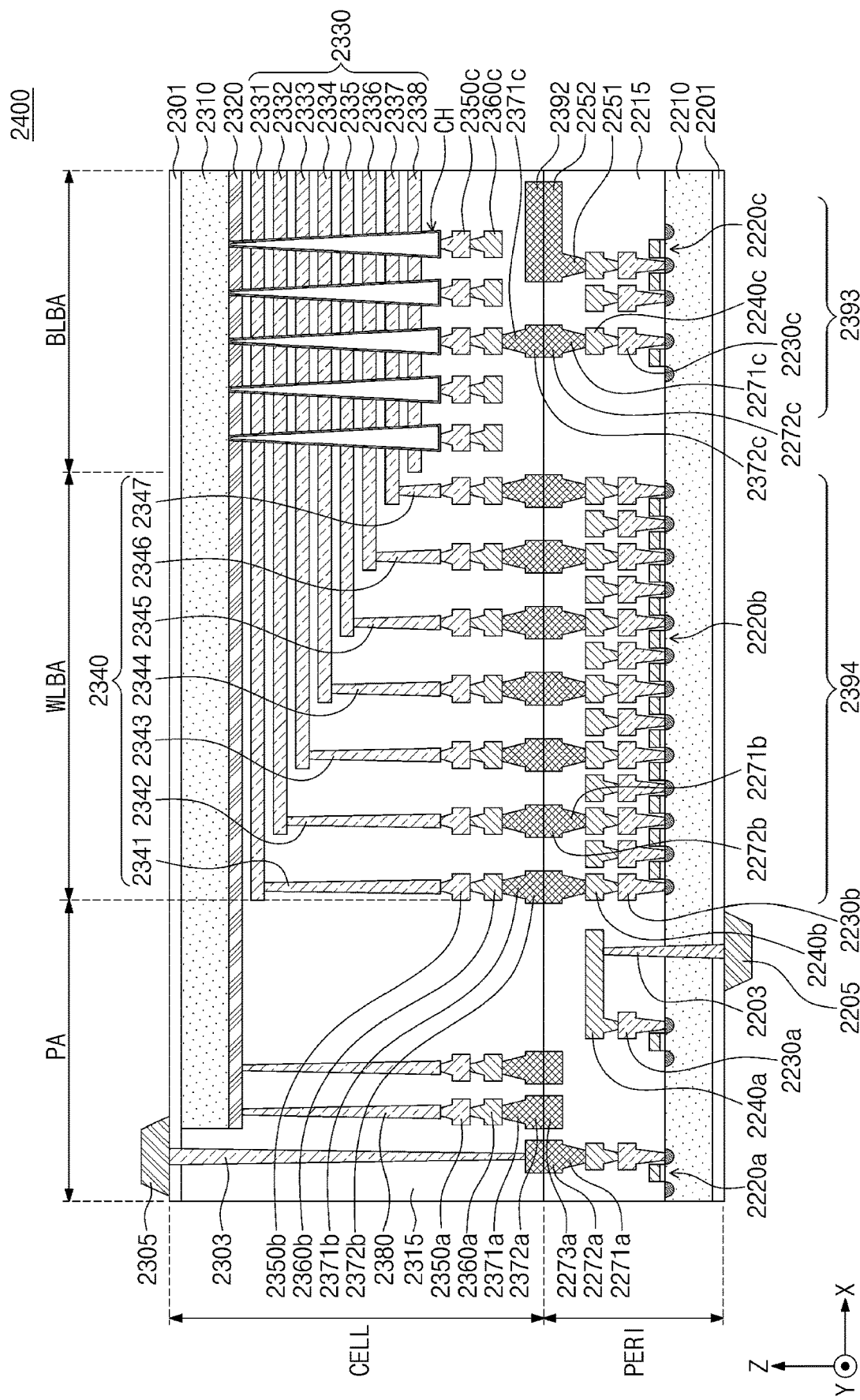
FIG. 46 is a view illustrating a memory device according to another embodiment of the present disclosure.

FIG. 46 is a diagram illustrating a memory device 600 according to another example embodiment.

Referring to FIG. 46, a memory device 600 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2600 may include an external pad bonding area PA, a word line bonding area WLBA, and a bit line bonding area BLBA.

The peripheral circuit region PERI may include a first substrate 710, an interlayer insulating layer 2715, a plurality of circuit elements 2720a, 2720b, and 2720c formed on the first substrate 710, first metal layers 2730a, 2730b, and 2730c respectively connected to the plurality of circuit elements 2720a, 2720b, and 2720c, and second metal layers 2740a, 2740b, and 2740c formed on the first metal layers 2730a, 2730b, and 2730c. In an example embodiment, the first metal layers 2730a, 2730b, and 2730c may be formed of tungsten having relatively high electrical resistivity, and the second metal layers 2740a, 2740b, and 2740c may be formed of copper having relatively low electrical resistivity.

In an example embodiment illustrate in FIG. 46, although only the first metal layers 2730a, 2730b, and 2730c and the second metal layers 2740a, 2740b, and 2740c are shown and described, the example embodiment is not limited thereto, and one or more additional metal layers may be further formed on the second metal layers 2740a, 2740b, and 2740c. At least a portion of the one or more additional metal layers formed on the second metal layers 2740a, 2740b, and 2740c may be formed of aluminum or the like having a lower electrical resistivity than those of copper forming the second metal layers 2740a, 2740b, and 2740c.

The interlayer insulating layer 2715 may be disposed on the first substrate 710 and cover the plurality of circuit elements 2720a, 2720b, and 2720c, the first metal layers 2730a, 2730b, and 2730c, and the second metal layers 2740a, 2740b, and 2740c. The interlayer insulating layer 2715 may include an insulating material such as silicon oxide, silicon nitride, or the like.

Lower bonding metals 2771b and 2772b may be formed on the second metal layer 2740b in the word line bonding area WLBA. In the word line bonding area WLBA, the lower bonding metals 2771b and 2772b in the peripheral circuit region PERI may be electrically bonded to upper bonding metals 2871b and 2872b of the cell region CELL. The lower bonding metals 2771b and 2772b and the upper bonding metals 2871b and 2872b may be formed of aluminum, copper, tungsten, or the like. Further, the upper bonding metals 2871b and 2872b in the cell region CELL may be referred as first metal pads and the lower bonding metals 2771b and 2772b in the peripheral circuit region PERI may be referred as second metal pads.

The cell region CELL may include at least one memory block. The cell region CELL may include a second substrate 2810 and a common source line 2820. On the second substrate 2810, a plurality of word lines 2831 to 2838 (i.e., 2830) may be stacked in a direction (a Z-axis direction), perpendicular to an upper surface of the second substrate 2810. At least one string select line and at least one ground select line may be arranged on and below the plurality of word lines 2830, respectively, and the plurality of word lines 2830 may be disposed between the at least one string select line and the at least one ground select line.

In the bit line bonding area BLBA, a channel structure CH may extend in a direction (a Z-axis direction), perpendicular to the upper surface of the second substrate 2810, and pass through the plurality of word lines 2830, the at least one string select line, and the at least one ground select line. The channel structure CH may include a data storage layer, a channel layer, a buried insulating layer, and the like, and the channel layer may be electrically connected to a first metal layer 2850c and a second metal layer 2860c. For example, the first metal layer 2850c may be a bit line contact, and the second metal layer 2860c may be a bit line. In an example embodiment, the bit line 2860c may extend in a first direction (a Y-axis direction), parallel to the upper surface of the second substrate 2810.

In an example embodiment illustrated in FIG. 46, an area in which the channel structure CH, the bit line 2860c, and the like are disposed may be defined as the bit line bonding area BLBA. In the bit line bonding area BLBA, the bit line 2860c may be electrically connected to the circuit elements 2720c providing a page buffer 2893 in the peripheral circuit region PERI. The bit line 2860c may be connected to upper bonding metals 2871c and 2872c in the cell region CELL, and the upper bonding metals 2871c and 2872c may be connected to lower bonding metals 2771c and 2772c connected to the circuit elements 2720c of the page buffer 2893. In an example embodiment, a program operation may be executed based on a page unit as write data of the page-unit is stored in the page buffer 893, and a read operation may be executed based on a sub-page unit as read data of the sub-page unit is stored in the page buffer 2893. Also, in the program operation and the read operation, units of data transmitted through bit lines may be different from each other.

In the word line bonding area WLBA, the plurality of word lines 2830 may extend in a second direction (an X-axis direction), parallel to the upper surface of the second substrate 2810 and perpendicular to the first direction, and may be connected to a plurality of cell contact plugs 2841 to 2847 (i.e., 2840). The plurality of word lines 2830 and the plurality of cell contact plugs 2840 may be connected to each other in pads provided by at least a portion of the plurality of word lines 2830 extending in different lengths in the second direction. A first metal layer 2850b and a second metal layer 2860b may be connected to an upper portion of the plurality of cell contact plugs 2840 connected to the plurality of word lines 2830, sequentially. The plurality of cell contact plugs 2840 may be connected to the peripheral circuit region PERI by the upper bonding metals 2871*b* and 2872*b* of the cell region CELL and the lower bonding metals 2771*b* and 2772*b* of the peripheral circuit region PERI in the word line bonding area WLBA.

The plurality of cell contact plugs 2840 may be electrically connected to the circuit elements 2720*b* forming a row decoder 2894 in the peripheral circuit region PERI. In an example embodiment, operating voltages of the circuit elements 2720*b* of the row decoder 2894 may be different than operating voltages of the circuit elements 2720*c* forming the page buffer 2893. For example, operating voltages of the circuit elements 2720*c* forming the page buffer 2893 may be greater than operating voltages of the circuit elements 2720*b* forming the row decoder 894.

A common source line contact plug 2880 may be disposed in the external pad bonding area PA. The common source line contact plug 2880 may be formed of a conductive material such as a metal, a metal compound, polysilicon, or the like, and may be electrically connected to the common source line 2820. A first metal layer 2850*a* and a second metal layer 2860*a* may be stacked on an upper portion of the common source line contact plug 2880, sequentially. For example, an area in which the common source line contact plug 880, the first metal layer 2850*a*, and the second metal layer 2860*a* are disposed may be defined as the external pad bonding area PA.

Input-output pads 2705 and 2805 may be disposed in the external pad bonding area PA. Referring to FIG. 46, a lower insulating film 2701 covering a lower surface of the first substrate 2710 may be formed below the first substrate 2710, and a first input-output pad 2705 may be formed on the lower insulating film 2701. The first input-output pad 2705 may be connected to at least one of the plurality of circuit elements 2720*a*, 2720*b*, and 2720*c* disposed in the peripheral circuit region PERI through a first input-output contact plug 2703, and may be separated from the first substrate 2710 by the lower insulating film 2701. In addition, a side insulating film may be disposed between the first input-output contact plug 2703 and the first substrate 2710 to electrically separate the first input-output contact plug 2703 and the first substrate 2710.

Referring to FIG. 46, an upper insulating film 2801 covering the upper surface of the second substrate 2810 may be formed on the second substrate 2810, and a second input-output pad 2805 may be disposed on the upper insulating layer 2801. The second input-output pad 2805 may be connected to at least one of the plurality of circuit elements 2720*a*, 2720*b*, and 2720*c* disposed in the peripheral circuit region PERI through a second input-output contact plug 2803. In the example embodiment, the second input-output pad 2805 is electrically connected to a circuit element 2720*a*.

According to embodiments, the second substrate 2810 and the common source line 2820 may not be disposed in an area in which the second input-output contact plug 2803 is disposed. Also, the second input-output pad 2805 may not overlap the word lines 2830 in the third direction (the Z-axis direction). Referring to FIG. 46, the second input-output contact plug 2303 may be separated from the second substrate 2810 in a direction, parallel to the upper surface of the second substrate 2810, and may pass through the interlayer insulating layer 2815 of the cell region CELL to be connected to the second input-output pad 2805.

According to embodiments, the first input-output pad 2705 and the second input-output pad 2805 may be selectively formed. For example, the memory device 2600 may include only the first input-output pad 2705 disposed on the first substrate 2710 or the second input-output pad 2805 disposed on the second substrate 2810. Alternatively, the memory device 2600 may include both the first input-output pad 2705 and the second input-output pad 2805.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2600 may include a lower metal pattern 2773*a*, corresponding to an upper metal pattern 2872*a* formed in an uppermost metal layer of the cell region CELL, and having the same cross-sectional shape as the upper metal pattern 2872*a* of the cell region CELL so as to be connected to each other, in an uppermost metal layer of the peripheral circuit region PERI. In the peripheral circuit region PERI, the lower metal pattern 2773*a* formed in the uppermost metal layer of the peripheral circuit region PERI may not be connected to a contact. Similarly, in the external pad bonding area PA, an upper metal pattern 2872*a*, corresponding to the lower metal pattern 2773*a* formed in an uppermost metal layer of the peripheral circuit region PERI, and having the same shape as a lower metal pattern 2773*a* of the peripheral circuit region PERI, may be formed in an uppermost metal layer of the cell region CELL.

The lower bonding metals 2771*b* and 2772*b* may be formed on the second metal layer 2740*b* in the word line bonding area WLBA. In the word line bonding area WLBA, the lower bonding metals 2771*b* and 2772*b* of the peripheral circuit region PERI may be electrically connected to the upper bonding metals 2871*b* and 2872*b* of the cell region CELL by a Cu-to-Cu bonding.

Further, in the bit line bonding area BLBA, an upper metal pattern 892, corresponding to a lower metal pattern 2752 formed in the uppermost metal layer of the peripheral circuit region PERI, and having the same cross-sectional shape as the lower metal pattern 2752 of the peripheral circuit region PERI, may be formed in an uppermost metal layer of the cell region CELL. A contact may not be formed on the upper metal pattern 2892 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

In an embodiment, at least part of various semiconductor elements included in the period circuit region PERI may include a semiconductor device according to the present disclosure described with reference to FIGS. 1 to 44.

According to the present disclosure, a semiconductor device with the reduced area and reduced costs is provided.

While the present disclosure has been described with reference to embodiments thereof, it will be apparent to those of ordinary skill in the art that various changes and modifications may be made thereto without departing from the spirit and scope of the present disclosure as set forth in the following claims.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that when an element is referred to as being "connected" or "coupled" to or "on" another element, it can be directly connected or coupled to or on the other element or intervening elements may be present. In contrast, when an element is referred to as being "directly connected," "directly coupled. to," or "directly on" another element, or as "contacting" or "in contact with" another element, there are no intervening elements present at the point of contact.

What is claimed is:

1. A semiconductor device comprising:
a substrate;
an N-well area formed in the substrate;
a first P-channel metal oxide semiconductor (PMOS) transistor having active regions formed in the N-well area; and
a first N-channel metal oxide semiconductor (NMOS) transistor having active regions formed in the substrate,
wherein the first NMOS transistor includes a first N-type active region overlapping each of the substrate and the N-well area, when viewed from above a plane parallel to a top surface of the substrate, and
wherein a first portion of the first N-type active region overlaps the N-well area from above the plane and is a well guard-ring of the N-well area.

2. The semiconductor device of claim 1, wherein:
the first N-type active region extends in a first direction parallel to the plane, such that a second portion of the first N-type active region adjacent to the first portion in the first direction overlaps the substrate without overlapping the N-well area when viewed from above the plane.

3. The semiconductor device of claim 2, wherein a body bias of the first PMOS transistor is provided directly through the first N-type active region.

4. The semiconductor device of claim 2, wherein a doping concentration of the first N-type active region is higher than a doping concentration of the N-well area.

5. The semiconductor device of claim 2, wherein the first NMOS transistor further includes a second N-type active region formed in the substrate.

6. The semiconductor device of claim 5, wherein a first length of the first N-type active region in the first direction is equal to a second length of the second N-type active region in the first direction.

7. The semiconductor device of claim 5, wherein a first length of the first N-type active region in the first direction is longer than a second length of the second N-type active region in the first direction.

8. The semiconductor device of claim 5, wherein, when viewed from above the plane, a shape of the first N-type active region is different from a shape of the second N-type active region.

9. The semiconductor device of claim 5, wherein a first depth of the first N-type active region in a third direction is different from a second depth of the second N-type active region in the third direction, and
wherein the third direction is a direction perpendicular to the plane.

10. The semiconductor device of claim 5, wherein a merged area of the first N-type active region, which is placed in the N-well area when viewed from above the plane, has a third depth in a third direction, and a remaining area of the first N-type active region other than the merged area has a fourth depth in the third direction,
wherein the third depth is different from the fourth depth, and
wherein the third direction is a direction perpendicular to the plane.

11. The semiconductor device of claim 5, wherein the first N-type active region includes at least one first $N^+$ implant area, and
wherein the second N-type active region includes at least one second $N^+$ implant area.

12. The semiconductor device of claim 11, wherein at least a portion of the at least one first $N^+$ implant area overlaps the N-well area when viewed from above the plane.

13. The semiconductor device of claim 11, wherein a number of the at least one first $N^+$ implant area is different from a number of the at least one second $N^+$ implant area.

14. The semiconductor device of claim 11, wherein, when viewed from above the plane, a shape of the at least one first $N^+$ implant area is different from a shape of the at least one second $N^+$ implant area.

15. The semiconductor device of claim 1, further comprising:
an oxide layer formed on the substrate,
wherein a first portion of the oxide layer, which overlaps the N-well area when viewed from above the plane, has a first height, and
wherein a portion of the first portion, which overlaps the first N-type active region when viewed from above the plane, has a third height different from the first height.

16. The semiconductor device of claim 1, wherein the first PMOS transistor includes:
a first P-type active region and a second P-type active region formed in the N-well area; and
a first gate formed on the N-well area between the first P-type active region and the second P-type active region,
wherein the first NMOS transistor further includes:
a second N-type active region formed in the substrate; and
a second gate formed on the substrate between the first N-type active region and the second N-type active region,
wherein the first N-type active region overlapping the N-well area is a body bias node of the first PMOS transistor.

17. The semiconductor device of claim 16, further comprising:
a first contact plug electrically connected to the second P-type active region;
a second contact plug electrically connected to the first N-type active region; and
a metal line configured to electrically connect the first contact plug and the second contact plug.

18. A semiconductor device comprising:
a substrate;
an N-well area formed in the substrate;
a first P-type active region formed in the N-well area;
a second P-type active region formed in the N-well area;
a first gate formed on the N-well area between the first P-type active region and the second P-type active region;
a body bias node formed in the N-well area;
a first N-type active region formed in the substrate;
a second N-type active region formed in the substrate; and
a second gate formed on the substrate between the first N-type active region and the second N-type active region,
wherein the body bias node and the first N-type active region are formed of a single continuous active region wherein the body bias node operates as a well guard-ring of the N-well area.

19. A semiconductor device comprising:
a substrate;
an N-well area formed in the substrate;
a PMOS transistor including active regions formed in the N-well area; and
an NMOS transistor including active regions formed in the substrate and including a first N-type active region,
wherein the first N-type active region is continuously formed in the N-well area and in a portion of the substrate horizontally adjacent to the N-well area, is used as a source area or a drain area of the NMOS transistor, and is configured to directly provide a body bias of the PMOS transistor to the N-well area, and
wherein a first portion of the first N-type active region overlaps the N-well area when viewed from above a plane parallel to a top surface of the substrate and is a well guard-ring of the N-well area.

* * * * *